US011143920B2

(12) United States Patent
Chang et al.

(10) Patent No.: US 11,143,920 B2
(45) Date of Patent: Oct. 12, 2021

(54) DISPLAY PANEL

(71) Applicant: Au Optronics Corporation, Hsinchu (TW)

(72) Inventors: Chi-Ho Chang, New Taipei (TW); An-Cheng Chou, Hsinchu (TW); Yu-Chang Wen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 84 days.

(21) Appl. No.: 16/690,033

(22) Filed: Nov. 20, 2019

(65) Prior Publication Data
US 2020/0355956 A1    Nov. 12, 2020

(30) Foreign Application Priority Data

May 6, 2019    (TW) .................................. 108115517

(51) Int. Cl.
| G02F 1/1339 | (2006.01) |
| G02F 1/1679 | (2019.01) |
| G02F 1/1677 | (2019.01) |
| G02F 1/1335 | (2006.01) |
| G02F 1/1337 | (2006.01) |
| G02F 1/1345 | (2006.01) |
| G02F 1/1362 | (2006.01) |
| G02F 1/1368 | (2006.01) |

(Continued)

(52) U.S. Cl.
CPC ........ *G02F 1/13394* (2013.01); *G02F 1/1337* (2013.01); *G02F 1/1345* (2013.01); *G02F 1/1368* (2013.01); *G02F 1/133512* (2013.01); *G02F 1/133514* (2013.01); *G02F 1/136286* (2013.01); *G02F 1/1677* (2019.01); *G02F 1/1679* (2019.01); *H01L 27/124* (2013.01); *G02B 26/005* (2013.01); *G02F 1/167* (2013.01)

(58) Field of Classification Search
None
See application file for complete search history.

(56) References Cited

U.S. PATENT DOCUMENTS

| 7,511,794 B2 | 3/2009 | Lin et al. |
| 2003/0071956 A1 | 4/2003 | Sasaki et al. |

(Continued)

FOREIGN PATENT DOCUMENTS

| TW | I329223 | 8/2010 |
| TW | I471663 | 2/2015 |
| TW | I487988 | 6/2015 |

*Primary Examiner* — James A Dudek
(74) *Attorney, Agent, or Firm* — JCIPRNET

(57) ABSTRACT

A display panel including a first substrate, a second substrate, and a display medium layer, a pixel array structure, and a first spacer that are disposed between the first substrate and the second substrate is provided. The pixel array structure includes a first signal line, and has a first platform region located on the first signal line, a first display region and a first support region located between the first platform region and the first display region. A first platform top surface of the first platform region and the first substrate are spaced by a first distance. A support top surface of the first support region and the first substrate are spaced by a second distance. A display top surface of the first display region and the first substrate are spaced by a third distance. A terminal surface of the first spacer contacts the first platform top surface.

20 Claims, 41 Drawing Sheets

(51) Int. Cl.
*H01L 27/12* (2006.01)
*G02B 26/00* (2006.01)
*G02F 1/167* (2019.01)

(56) References Cited

U.S. PATENT DOCUMENTS

| | | | |
|---|---|---|---|
| 2005/0237470 A1 | 10/2005 | Kadotani | |
| 2014/0347586 A1* | 11/2014 | Wang | G02F 1/13394 |
| | | | 349/43 |
| 2018/0143500 A1 | 5/2018 | Yu et al. | |

* cited by examiner

DISPLAY PANEL

CROSS-REFERENCE TO RELATED APPLICATION

This application claims the priority benefit of Taiwan application serial no. 108115517, filed on May 6, 2019. The entirety of the above-mentioned patent application is hereby incorporated by reference herein and made a part of this specification.

BACKGROUND OF THE INVENTION

1. Field of the Invention

The present invention relates to an electronic device, particularly to a display panel.

2. Description of Related Art

The display panel is a flat display device formed by sandwiching a display medium between two substrates. The display medium sandwiched between the two substrates may include liquid crystals, an electrophoretic material, an electrowetting material, an organic light-emitting material, and the like. In the display panel, the spacing distance between the two substrates is required to be stable to ensure display quality or product reliability. Therefore, the display panel may include a component such as a spacer sandwiched between the two substrates to maintain the spacing distance between the two substrates. The spacer is typically fabricated on one of the substrates and abuts against the other substrate after the two substrates are assembled to each other. Therefore, the spacer is not fixed during the assembly or during the use of the display panel, but may slip. In the case where the component inside the display panel is damaged by the slippage of the spacer, it may have an adverse effect on display quality.

SUMMARY OF THE INVENTION

The present invention provides a display panel, which can reduce the poor display quality phenomenon caused by the spacer.

The present invention provides a display panel capable of having ideal display quality.

The display panel of the present invention includes a first substrate, a second substrate, a display medium layer, a pixel array structure and a first spacer. The display medium layer is disposed between the first substrate and the second substrate. The pixel array structure is disposed on the first substrate, and the pixel array structure includes a first metal layer and a second metal layer. The first metal layer is located between the first substrate and the second metal layer, and the first metal layer includes a first signal line. The pixel array structure has a first platform region, a first display region and a first support region. The first platform region is located on the first signal line. The first support region is located between the first platform region and the first display region. A first platform top surface of the first platform region and the first substrate are spaced by a first distance. A support top surface of the first support region and the first substrate are spaced by a second distance. The first display region and the first substrate are spaced by a third distance. The third distance is not greater than the second distance, the second distance is not greater than the first distance and a difference between the first distance and the second distance is from 0 micron to 0.3 micron. The first spacer is disposed on the second substrate and protrudes toward the first substrate, and a terminal surface of the first spacer is in contact with the first platform top surface.

The display panel of the present invention includes a first substrate, a second substrate, a display medium layer, a pixel array structure and a first spacer. The display medium layer is disposed between the first substrate and the second substrate. The pixel array structure is disposed on the first substrate. The pixel array structure includes a first metal layer and a second metal layer. The first metal layer is located between the first substrate and the second metal layer. The first metal layer includes a first signal line and a first support pattern. The second metal layer includes a second support pattern, and an orthographic projection area of the second support pattern on the first substrate overlaps a first support area of the first support pattern on the first substrate to define the first support region. The first spacer is disposed on the second substrate and protrudes toward the first substrate. An orthographic projection area of the first spacer on the first substrate overlaps an orthographic projection area of the first signal line on the first substrate, and the orthographic projection area of the first support pattern on the first substrate is located on the periphery of the orthographic projection area of the first spacer on the first substrate.

Based on the above, in the display panel of the embodiments of the present invention, the pixel array structure is formed by stacking a plurality of film layers, and the pixel array structure has a platform region, a support region and a display region. The support region, the platform region and the display region have individual stack structures such that the height of the top surface of the pixel array structure in the support region is substantially between the top surface of the pixel array structure in the platform region and the top surface in the display region. In the display panel of the embodiments of the present invention, the spacer is disposed in the platform region, and the support region is disposed on the periphery of the platform region. Thus, after slippage, the spacer slips is not easily in direct contact with the top surface of the pixel array structure in the display region, which helps to avoid damage of the components of the display region and ensure the display quality and yield of the display panel.

In order to make the aforementioned and other objectives and advantages of the present invention comprehensible, embodiments accompanied with figures are described in detail below.

DESCRIPTION OF THE EMBODIMENTS

Figure 1:
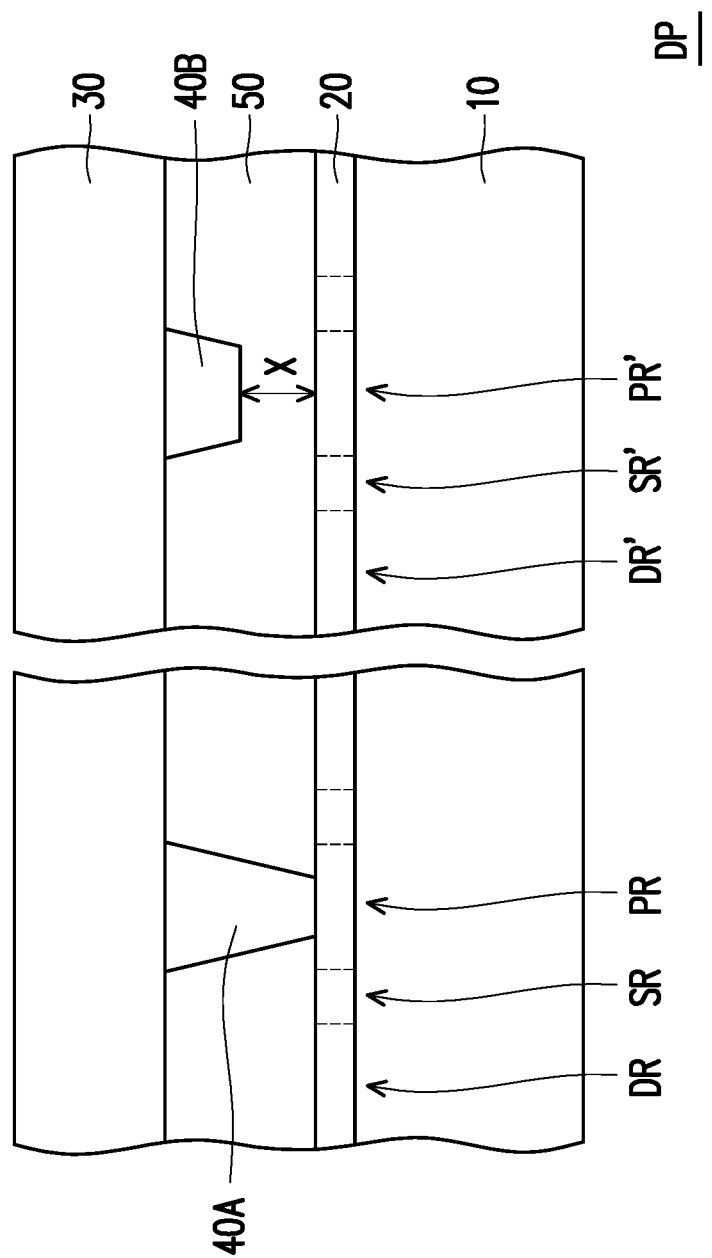
FIG. 1 is partial cross-sectional schematic view of a display panel according to an embodiment of the present invention.

FIG. 1 is partial cross-sectional schematic view of a display panel according to an embodiment of the present invention. Referring to FIG. 1, the display panel DP includes a first substrate 10, a pixel array structure 20, a second substrate 30, a first spacer 40A, a second spacer 40B and a display medium layer 50. The first substrate 10 and the second substrate 30 are opposite to each other up and down, and the display medium layer 50 is disposed between the first substrate 10 and the second substrate 30. The first substrate 10 and the second substrate 30 may be transparent substrates, and the material thereof includes a quartz substrate, a glass substrate, a polymer substrate and the like. The display medium layer 50 may include a liquid crystal material, an electrophoretic display material or an electrowetting display material. The pixel array structure 20 is disposed on the first substrate 10 and located between the first substrate 10 and the display medium layer 50, and used to provide an electric field to drive the display medium layer 50 to realize a display function. The first spacer 40A is disposed on the second substrate 30 and protrudes toward the first substrate 10 until abutting against the top pixel array structure 20. In other words, the first spacer 40A is in contact with the pixel array structure 20 but is not fixed or adhered to the surface of the pixel array structure 20. The second spacer 40B is disposed on the second substrate 30 and protrudes toward the first substrate 10 to be spaced from the pixel array structure 20 by a distance X. Although FIG. 1 only shows one first spacer 40A and one second spacer 40B as an exemplary description, in practical applications, the numbers of the first spacers 40A and the second spacers 40B may be plural.

In the present embodiment, the pixel array structure 20 may be divided into, for example, a first platform region PR, a first support region SR and a first display region DR. The first support region SR is located between the first platform region PR and the first display region DR. The arrangement position of the first spacer 40A may correspond to the first platform region PR. In other words, the orthographic projection area of the first spacer 40A on the first substrate 10 may fall in the first platform region PR. The first support region SR is located on the periphery of the first platform region PR. In addition, the pixel array structure 20 actually has an uneven top surface in the present embodiment. Specifically, the height of the top surface of the pixel array structure 20 in the first support region SR is greater than the height of the top surface of the pixel array structure 20 in the first display region DR, and the height of the top surface of the pixel array structure 20 is not less than the height of the top surface of the pixel array structure 20 in the first support region SR. Thus, when the display panel DP receives an external force such that the first spacer 40A is displaced, the first spacer 40A can be supported at the first support region SR so as not to easily contact the portion of the pixel array structure 20 in the first display region DR. Therefore, the portion of the pixel array structure 20 in the first display region DR is not easily damaged and the display panel DP can maintain ideal display quality.

The pixel array structure 20 has a second platform region PR', a second support region SR' and a second display region DR' corresponding to the second spacer 40B. The second support region SR' is located between the second platform region PR' and the second display region DR'. The respective structures of the second platform region PR', the second support region SR and the second display region DR' may be the same as or different from those of the first platform region PR, the first support region SR and the first display region DR. For example, in some embodiments, the height of the second spacer 40B is less than the height of the first spacer 40A. In some embodiments, the top surface of the pixel array structure 20 in the second support region SR' may be higher than the top surface of the pixel array structure 20 in the second display region DR', and the top surface of the pixel array structure 20 in the second platform region PR is not lower than the top surface of the pixel array structure 20 in the second support region SR'. However, in other embodiments, the top surface of the pixel array structure 20 in the second platform region PR' may also be selectively lower than the top surface of the pixel array structure 20 in the second support region SR'. In this case, the height of the second spacer 40B may be equal to the height of the first spacer 40A or less than the height of the first spacer 40A. When the display panel DP receives an external force such that the second spacer 40B is displaced, the second spacer 40A can be supported at the second support region SR so as not to easily contact the portion of the pixel array structure 20 in the second display region DR. Therefore, the portion of the pixel array structure 20 in the first display region DR is not easily damaged and the display panel DP can maintain ideal display quality.

Figure 2A:
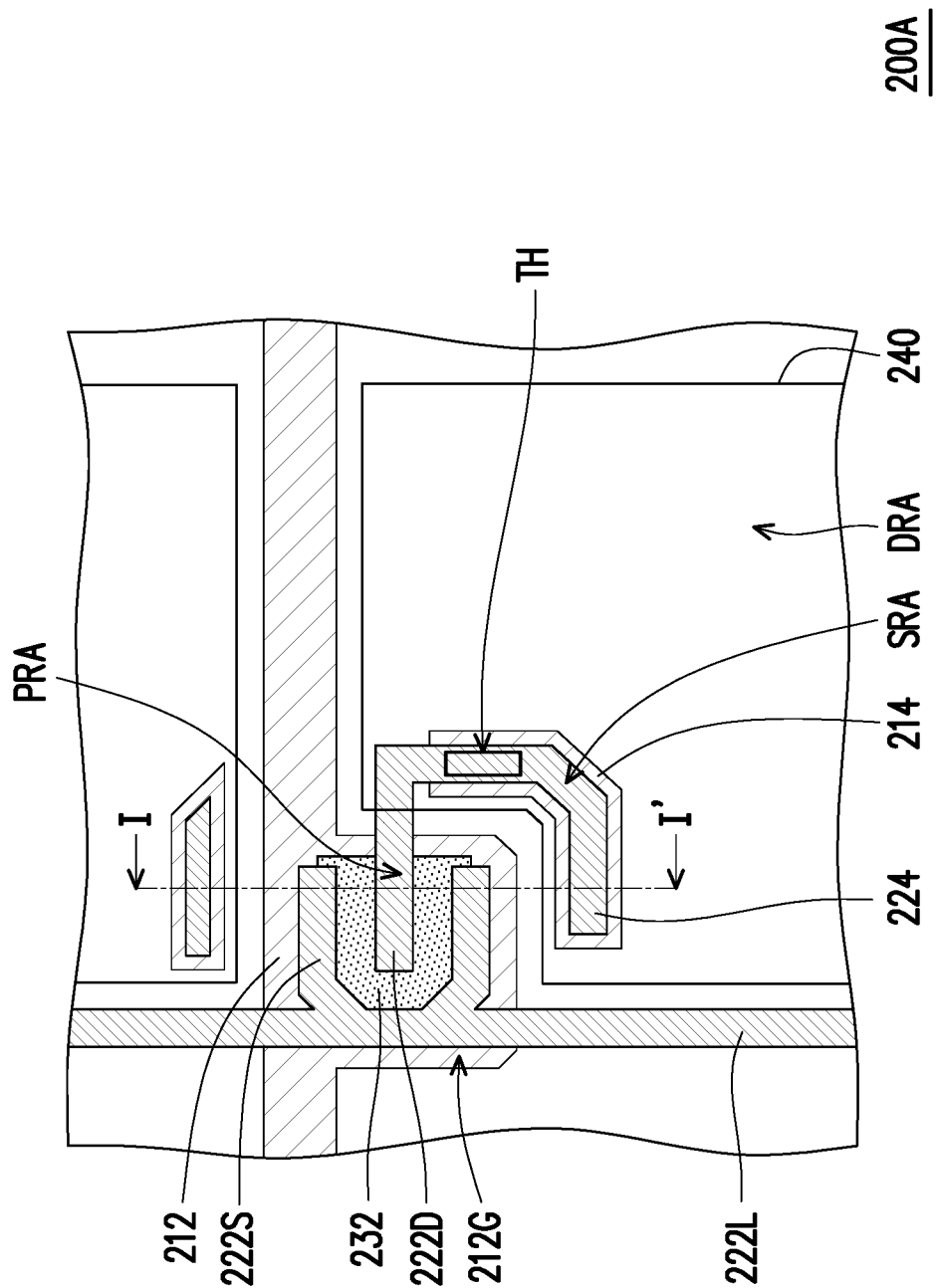
FIG. 2A is a top schematic view of a pixel array structure according to an embodiment of the present invention.
Figure 2B:
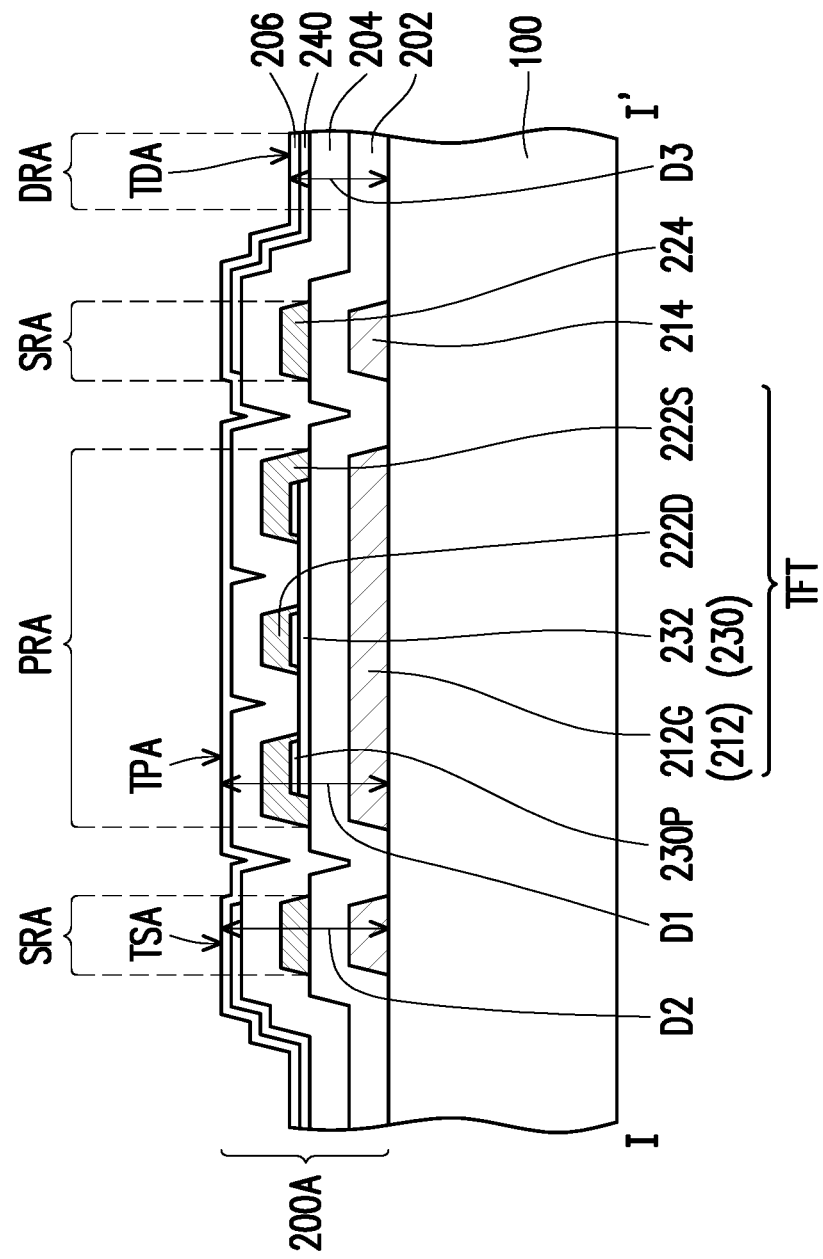
FIG. 2B is a cross-sectional schematic view taken along line I-I' of FIG. 2A.

FIG. 2A is a top schematic view of a pixel array structure according to an embodiment of the present invention, and FIG. 2B is a cross-sectional schematic view taken along line I-I' of FIG. 2A. In FIG. 2A and FIG. 2B, the pixel array structure 200A is disposed on the first substrate 100, and the pixel array structure 200A in FIG. 2A and FIG. 2B can be used as an implementation of the pixel array structure 20 disposed on the first substrate 10 of FIG. 1. The pixel array structure 200A includes a first metal layer 210, a second metal layer 220, a semiconductor layer 230 and a first electrode 240. The first metal layer 210 is located between the first substrate 100 and the second metal layer 220, and the semiconductor layer 230 is located between the first metal layer 210 and the second metal layer 220. The material of the first metal layer 210 and the second metal layer 220 includes a metal having good conductivity, for example, aluminum, molybdenum, titanium or other metals. The material of the semiconductor layer 230 includes a siliceous semiconductor material (for example, polycrystalline silicon, amorphous silicon, etc.), an oxide semiconductor material and an organic semiconductor material. The surface of the semiconductor layer 230 in contact with the second metal layer 220 may further have a doping portion 230P, but it is not limited thereto.

In the present embodiment, the first metal layer 210 includes a first signal line 212 and a first support pattern 214. The first platform pattern in the first signal line 212 overlapping the semiconductor layer 230 can be used as a gate 212G. The second metal layer 220 includes a source 222S and a drain 222D. The source 222S and the drain 222D are separated from each other and form a second platform pattern. The semiconductor layer 230 may include a channel pattern 232 located between the gate 212G and the second platform pattern (the source 222S and the drain 222D), and the source 222S and the drain 222D are in contact with the channel pattern 232. Thus, the gate 212G, the channel pattern 232, the source 222S and the drain 222D form an active component TFT together. The pixel array structure 200A further includes a first electrode 240. The first electrode 240 may be electrically connected to the drain 222D through a contact hole TH. Further, the second metal layer 220 further includes a second signal line 222L connected to the source 222S. Thus, the active component TFT can be turned on or off through the signal transmitted by the first signal line 212, and when the active component TFT is turned on, the signal transmitted on the second signal line 222L can be transmitted to the first electrode 240. In other embodiments, the first support pattern 214 located on one side of the first signal line 212 may be an extended linear conductor pattern and may be connected to a shared signal for use as a shared signal line.

In the present embodiment, the orthographic projection areas of the second platform pattern (the source 222S and the drain 222D) and the semiconductor layer 230 on the first substrate 100 overlap the orthographic projection area of a portion of the first signal line 212, for example the gate 212G, on the first substrate 100 to define the platform region PRA. That is, the platform region PRA is substantially the region in which the active component TFT is located. The first metal layer 210 further includes a first support pattern 214, and the second metal layer 220 further includes a second support pattern 224. In the present embodiment, there may be two second support patterns 224 that are respectively located on two opposite sides of the platform region PRA. The second support pattern 224 adjacent to the drain 222D may be connected to the drain 222D to be an extended pattern of the drain 222D, and the other second support pattern 224 is an independent conductor pattern, but it is not limited thereto. In other embodiments, the second support pattern 224 adjacent to the drain 222D and the drain 222D may be separated from each other to be two independent structures. The orthographic projection area of the second support pattern 224 on the first substrate 100 overlaps the orthographic projection area of the first support pattern 214 on the first substrate 100 to define the support region SRA. The support region SRA is, for example, located on the periphery of the platform region PRA. The pixel array substrate 200A further has a display region DRA. The display region DRA may be a region in which the first metal layer 210 and the second metal layer 220 are not present, and the support region SRA is located between the display region DRA and the platform region PRA. In the present embodiment, the two opposite sides of the platform region PRA may be provided with the support region SRA, but it is not limited thereto.

In addition, the pixel array structure 200A further includes a first insulating layer 202, a second insulating layer 204 and an alignment layer 206. The first insulating layer 202 is disposed between the first metal layer 210 and the second metal layer 220. The second insulating layer 204 covers the second metal layer 220 and is located between the second metal layer 220 and the alignment layer 206. Here, the alignment layer 206 may be the topmost film layer of the pixel array structure 200A. In the platform region PRA, the pixel array structure 200A includes a stack structure formed by sequentially stacking the first metal layer 210, the first insulating layer 202, the semiconductor layer 230, the second metal layer 220, the second insulating layer 204 and the alignment layer 206, so that a platform top surface TPA of the pixel array structure 200A in the platform region PRA and the first substrate 100 are spaced by a first distance D1. In the support region SRA, the pixel array structure 200A includes a stack structure formed by sequentially stacking the first metal layer 210, the first insulating layer 202, the second metal layer 220, the second insulating layer 204, the first electrode 240 and the alignment layer 206, so that a support top surface TSA of the support region SRA of the pixel array structure 200A and the first substrate 100 are spaced by a second distance D2. In the display region DRA, the pixel array structure 200A includes a stack structure formed by sequentially stacking the first insulating layer 202, the second insulating layer 204, the first electrode 240 and the alignment layer 206, so that a display top surface TDA of the display region DRA of the pixel array structure 200A and the first substrate 100 are spaced by a third distance D3. In the present embodiment, the third distance D3 is not greater than the second distance D2, the second distance D2 is not greater than the first distance D1 and the difference between the first distance D1 and the second distance D2 may be from 0 micron to 0.3 micron. In some embodiments, the support top surface TSA and the platform top surface TPA may be coplanar, and the support top surface TSA and the platform top surface TPA are both higher than the display top surface TDA.

Figure 3A:
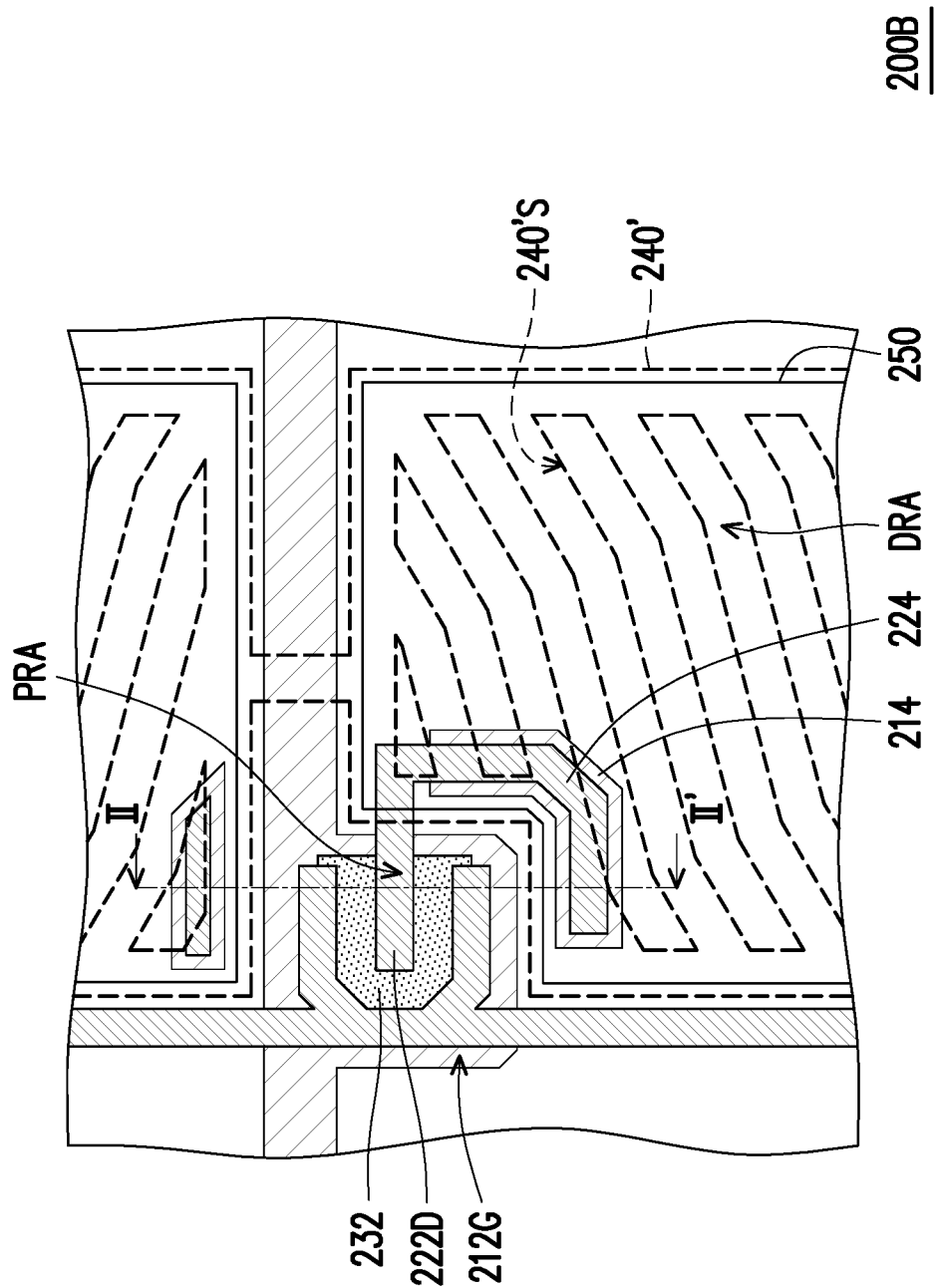
FIG. 3A is a top schematic view of a pixel array structure according to an embodiment of the present invention.
Figure 3B:
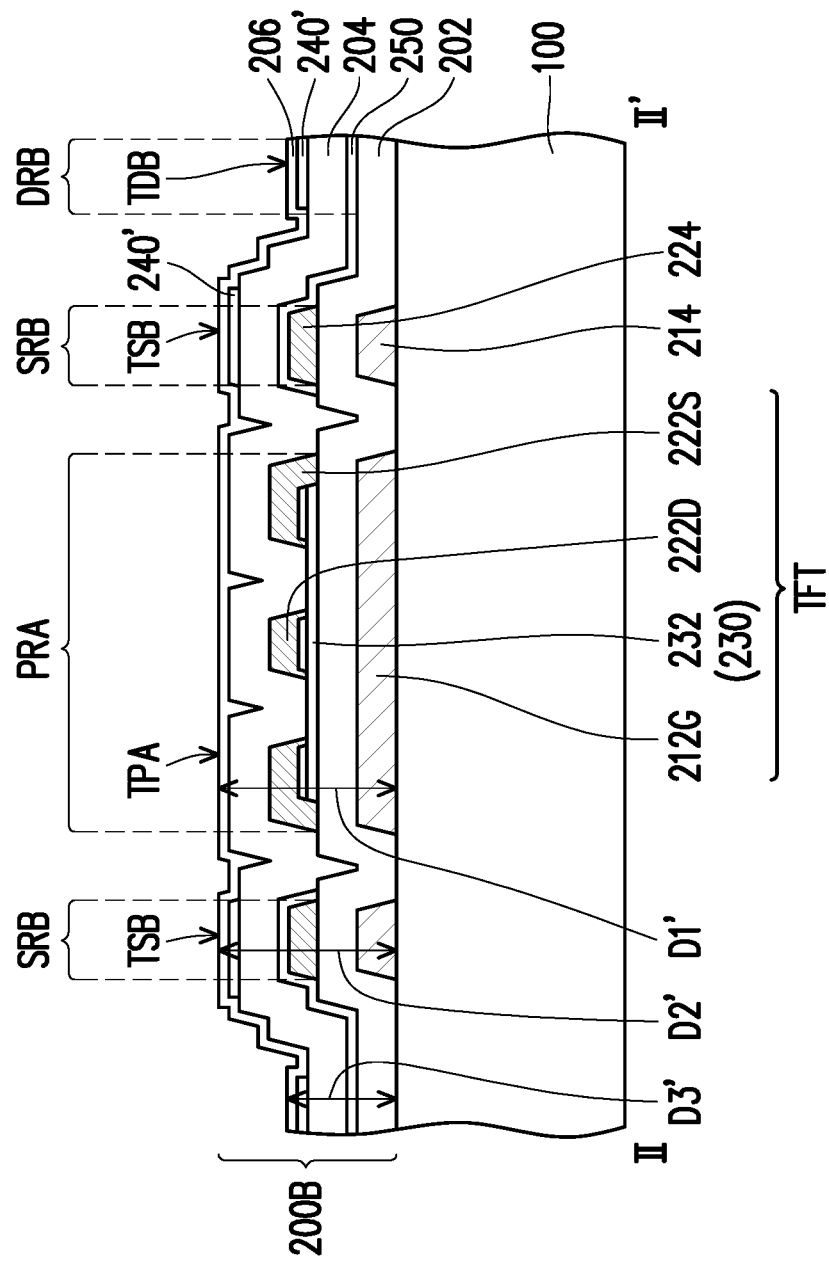
FIG. 3B is a cross-sectional schematic view taken along line of FIG. 3A.

FIG. 3A is a top schematic view of a pixel array structure according to an embodiment of the present invention, and FIG. 3B is a cross-sectional schematic view taken along line of FIG. 3A. In FIG. 3A and FIG. 3B, the pixel array structure 200B is similar to the pixel array structure 200A, so the same and similar components of the two embodiments will be labeled by the same and similar component symbols, and the specific structure and design of these components can be understood with reference to the description of the foregoing embodiments. In the present embodiment, the pixel array structure 200B includes a first insulating layer 202, a second insulating layer 204, an alignment layer 206, a first metal layer 210, a second metal layer 220, a semiconductor layer 230, a first electrode 240' and a second electrode 250. For the specific structure and design of the first insulating layer 202, the second insulating layer 204, the alignment layer 206, the first metal layer 210, the second metal layer 220 and the semiconductor layer 230, reference can be made to the foregoing embodiments. The first electrode 240' overlaps the second electrode 250, and the first electrode 240' has a plurality of slits 240'S. The second electrode 250 is located between the first insulating layer 202 and the second insulating layer 204. Further, the second electrode 250 may be in contact with the second support pattern 224 of the second metal layer 220. The second support pattern 224 may be selectively connected to the drain 222D, so that the second electrode 250 can be used as a pixel electrode and the first electrode 240' can be used as a shared electrode. In the present embodiment, the first electrode 240' can span the first signal line 212 to extend between different pixels.

In the present embodiment, the pixel array structure 200B may be divided into a platform region PRA, a support region SRB and a display region DRB. The platform region PRA includes a stack structure formed by sequentially stacking the gate 212G of the first metal layer 210, the first insulating layer 202, the channel pattern 232 of the semiconductor layer 230, the source 222S and the drain 222D of the second metal layer 220, the second insulating layer 204 and the alignment layer 206. The support region SRB includes a stack structure formed by sequentially stacking the first support pattern 214 of the first metal layer 210, the first insulating layer 202, the second support pattern 224 of the second metal layer 220, the second electrode 250, the second insulating layer 204, the first electrode 240' and the alignment layer 206. The display region DRB includes a stack structure formed by sequentially stacking the first insulating layer 202, the second electrode 250, the second insulating layer 204, the first electrode 240' and the alignment layer 206. Thus, the platform top surface TPA of the pixel array structure 200B in the platform region PRA and the first substrate 100 are spaced by a first distance D1', the support top surface TSB of the support region SRB of the pixel array structure 200B and the first substrate 100 are spaced by a second distance D2', and the display top surface TDB of the display region DRB of the pixel array structure 200B and the first substrate 100 are spaced by a third distance D3'. The first distance D1' and the second distance D2' are substantially similar and are both greater than the third distance D3'. For example, the third distance D3' is not greater than the second distance D2', the second distance D2' is not greater than the first distance D1', and the difference between the first distance D1' and the second distance D2' is from 0 micron to 0.3 micron.

Figure 4A:
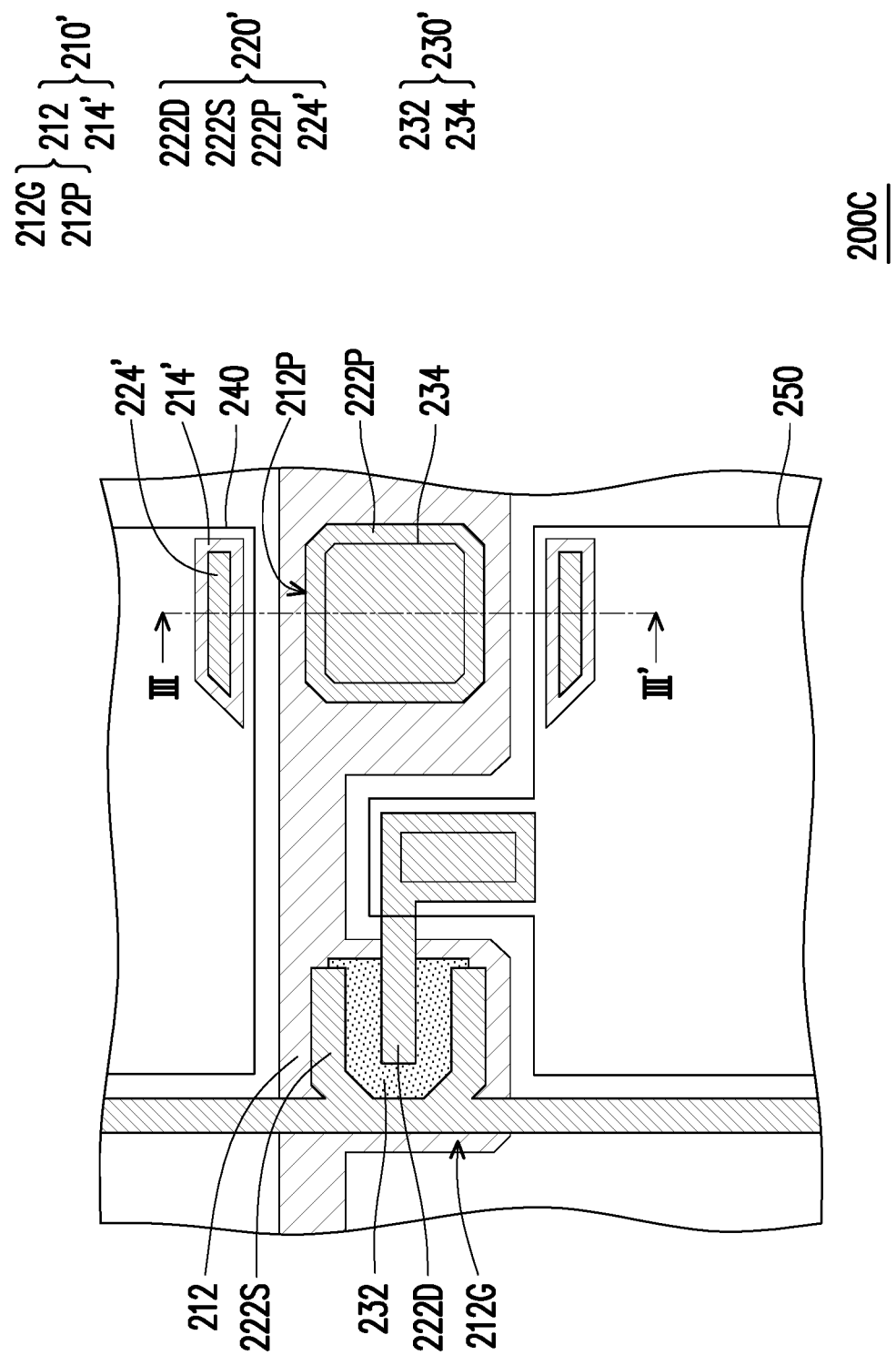
FIG. 4A is a top schematic view of a pixel array structure according to an embodiment of the present invention.
Figure 4B:
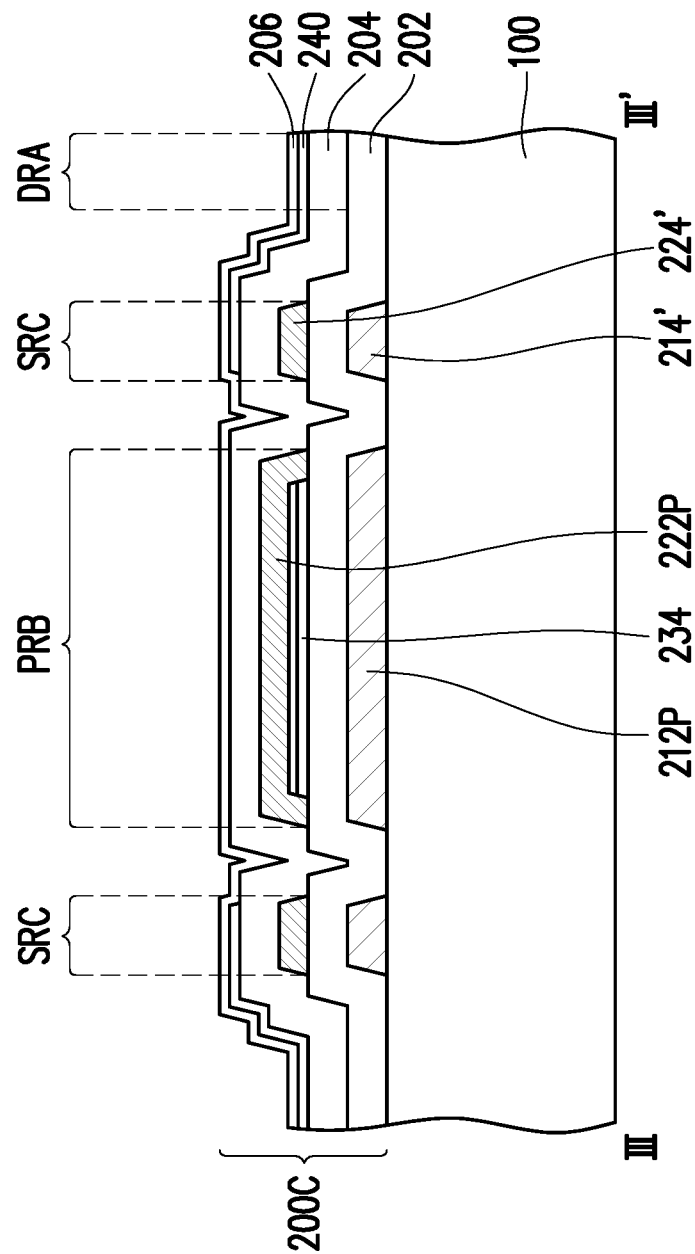
FIG. 4B is a cross-sectional schematic view taken along line of FIG. 4A.

FIG. 4A is a top schematic view of a pixel array structure according to an embodiment of the present invention, and FIG. 4B is a cross-sectional schematic view taken along line of FIG. 4A. The pixel array structure 200C of FIG. 4A and FIG. 4B is disposed on the first substrate 100 and includes a first insulating layer 202, a second insulating layer 204, an alignment layer 206, a first metal layer 210', a second metal layer 220', a semiconductor layer 230' and a first electrode 240. The first metal layer 210' includes a first signal line 212 and a first support pattern 214'. A portion of the first signal line 212 forms the gate 212G and the other portion forms the first platform pattern 212P. The second metal layer 220' includes a source 222S, a drain 222D, a second platform pattern 222P and a second support pattern 224'. The semiconductor layer 230' includes a channel pattern 232 and a semiconductor pattern 234. In the present embodiment, the gate 212G, the channel pattern 232, the source 222S and the drain 222D form an active component TFT together, and for the specific disposition manner of the active component TFT, reference can be made to the foregoing embodiments. In addition, the orthographic projection areas of the second platform pattern 222P and the semiconductor pattern 234 on the first substrate 100 overlap the orthographic projection area of the first platform pattern 212P on the first substrate 100 to define the platform region PRB. The orthographic projection area of the second support pattern 224' on the first substrate 100 overlaps the orthographic projection area of the first support pattern 214' on the first substrate 100 to define the support region SRC. Besides, a region in which the first metal layer 210' and the second metal layer 220' are not present may be the display region DRA.

In the present embodiment, the first platform pattern 212P and the gate 212G are different portions of the first signal line 212, and therefore, the platform region PRB and the region in which the active component TFT is located are different regions. The support region SRC is, for example, located on the periphery of the platform region PRB, and the support region SRC is located between the display region DRA and the platform region PRB. In the present embodiment, the two opposite sides of the platform region PRB may be provided with the support region SRC, but it is not limited thereto.

Specifically, in the platform region PRB, the pixel array structure 200C includes a stack structure formed by sequentially stacking the first platform pattern 212P of the first metal layer 210', the first insulating layer 202, the semiconductor pattern 234 of the semiconductor layer 230', the second platform pattern 222P of the second metal layer 220', the second insulating layer 204 and the alignment layer 206. In the support region SRB, the pixel array structure 200C includes a stack structure formed by sequentially stacking the first support pattern 214' of the first metal layer 210', the first insulating layer 202, the second support pattern 224' of the second metal layer 220', the second insulating layer 204, the first electrode 240 and the alignment layer 206. In the display region DRA, the pixel array structure 200C includes a stack structure formed by sequentially stacking the first insulating layer 202, the second insulating layer 204, the first electrode 240 and the alignment layer 206. Due to the difference in the stack structures, the top surface of the pixel array structure 200C in the display region DRA is lower than the top surface in the support region SRC and also lower than the top surface in the platform region PRB, and the top surface of the pixel array structure 200C in the support region SRC may be close to the top surface in the platform region PRB. In other embodiments, the first support pattern 214' located on one side of the first signal line 212 may be an extended linear conductor pattern and may be connected to a shared signal for use as a shared signal line.

Figure 5A:
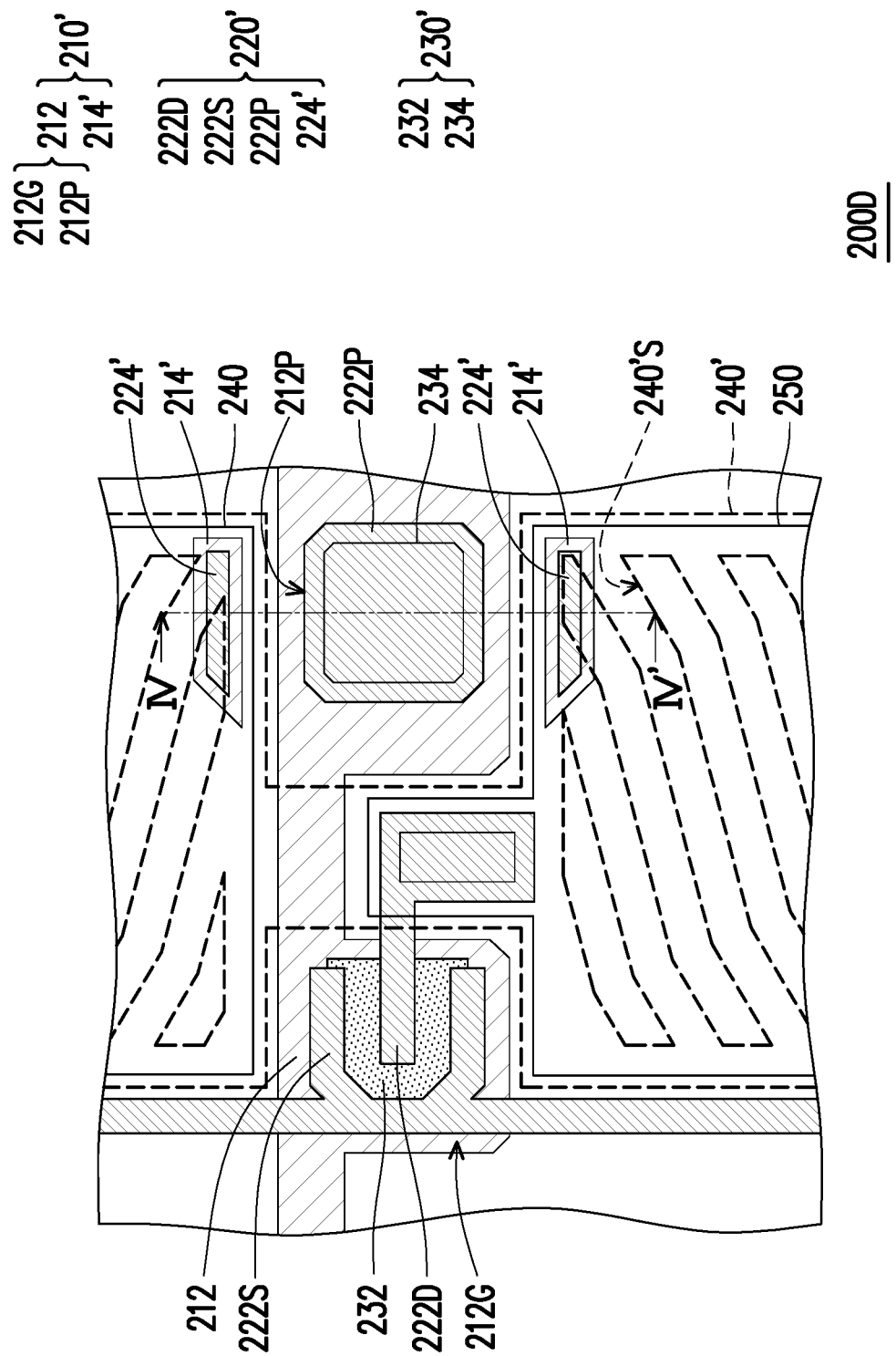
FIG. 5A is a top schematic view of a pixel array structure according to an embodiment of the present invention.
Figure 5B:
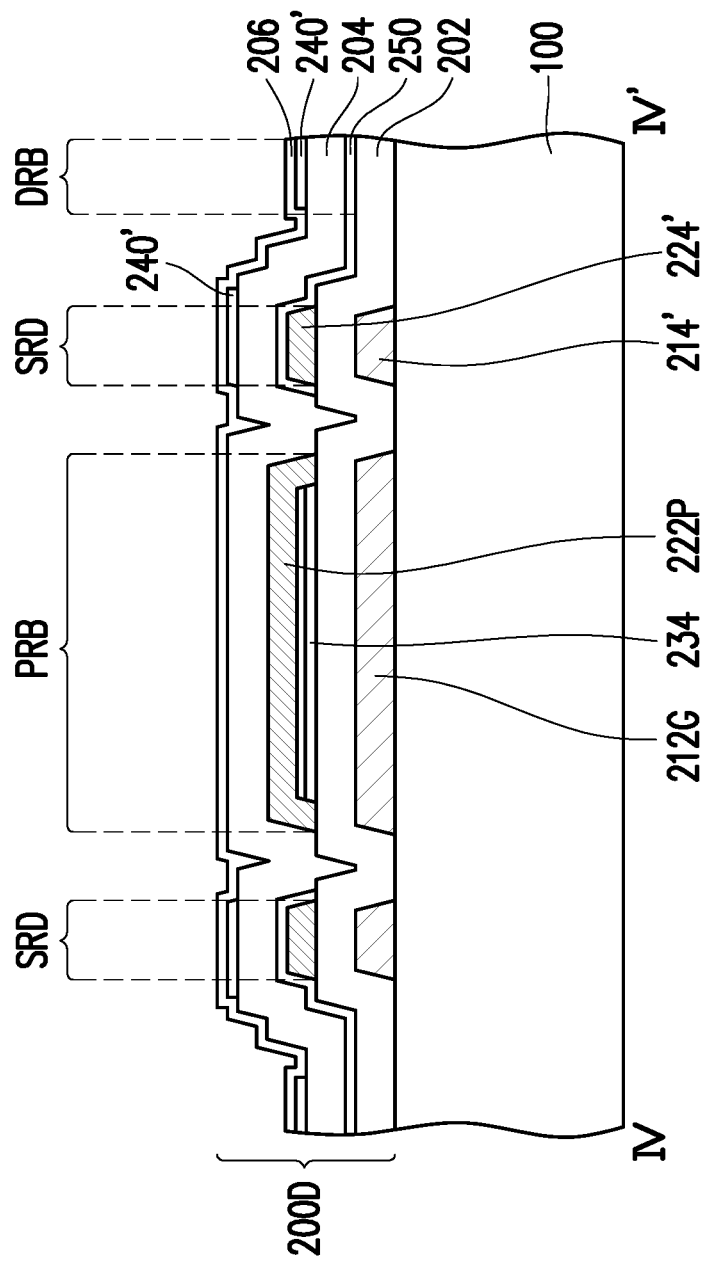
FIG. 5B is a cross-sectional schematic view taken along line IV-IV' of FIG. 5A.

FIG. 5A is a top schematic view of a pixel array structure according to an embodiment of the present invention, and FIG. 5B is a cross-sectional schematic view taken along line Iv-IV of FIG. 5A. In FIG. 5A and FIG. 5B, the pixel array structure 200D includes a first insulating layer 202, a second insulating layer 204, an alignment layer 206, a first metal layer 210', a second metal layer 220', a semiconductor layer 230', a first electrode 240' and a second electrode 250. For the specific structure and design of the first insulating layer 202, the second insulating layer 204, the alignment layer 206, the first electrode 240' and the second electrode 250, reference can be made to the foregoing embodiments of FIG. 3A and FIG. 3B. For the first metal layer 210', the second metal layer 220' and the semiconductor layer 230', reference can be made to the foregoing embodiments of FIG. 4A and FIG. 4B.

In the present embodiment, the pixel array structure 200D may be divided into a platform region PRB, a support region SRD and a display region DRB. In the platform region PRB, the pixel array structure 200D includes a stack structure formed by sequentially stacking the first platform pattern 212P of the first metal layer 210', the first insulating layer 202, the semiconductor pattern 234 of the semiconductor layer 230', the second platform pattern 222P of the second metal layer 220', the second insulating layer 204 and the alignment layer 206. In the support region SRB, the pixel array structure 200D includes a stack structure formed by sequentially stacking the first support pattern 214' of the first metal layer 210', the first insulating layer 202, the second support pattern 224' of the second metal layer 220', the second electrode 250, the second insulating layer 204, the first electrode 240' and the alignment layer 206. In the display region DRB, the pixel array structure 200D includes a stack structure formed by sequentially stacking the first insulating layer 202, the second electrode 250, the second insulating layer 204, the first electrode 240' and the alignment layer 206. Thus, the top surface of the pixel array structure 200D in the display region DRB is lower than the top surface in the support region SRD and also lower than the top surface in the platform region PRB, and the top surface of the pixel array structure 200D in the support region SRD may be close to the top surface in the platform region PRB.

Figure 6A:
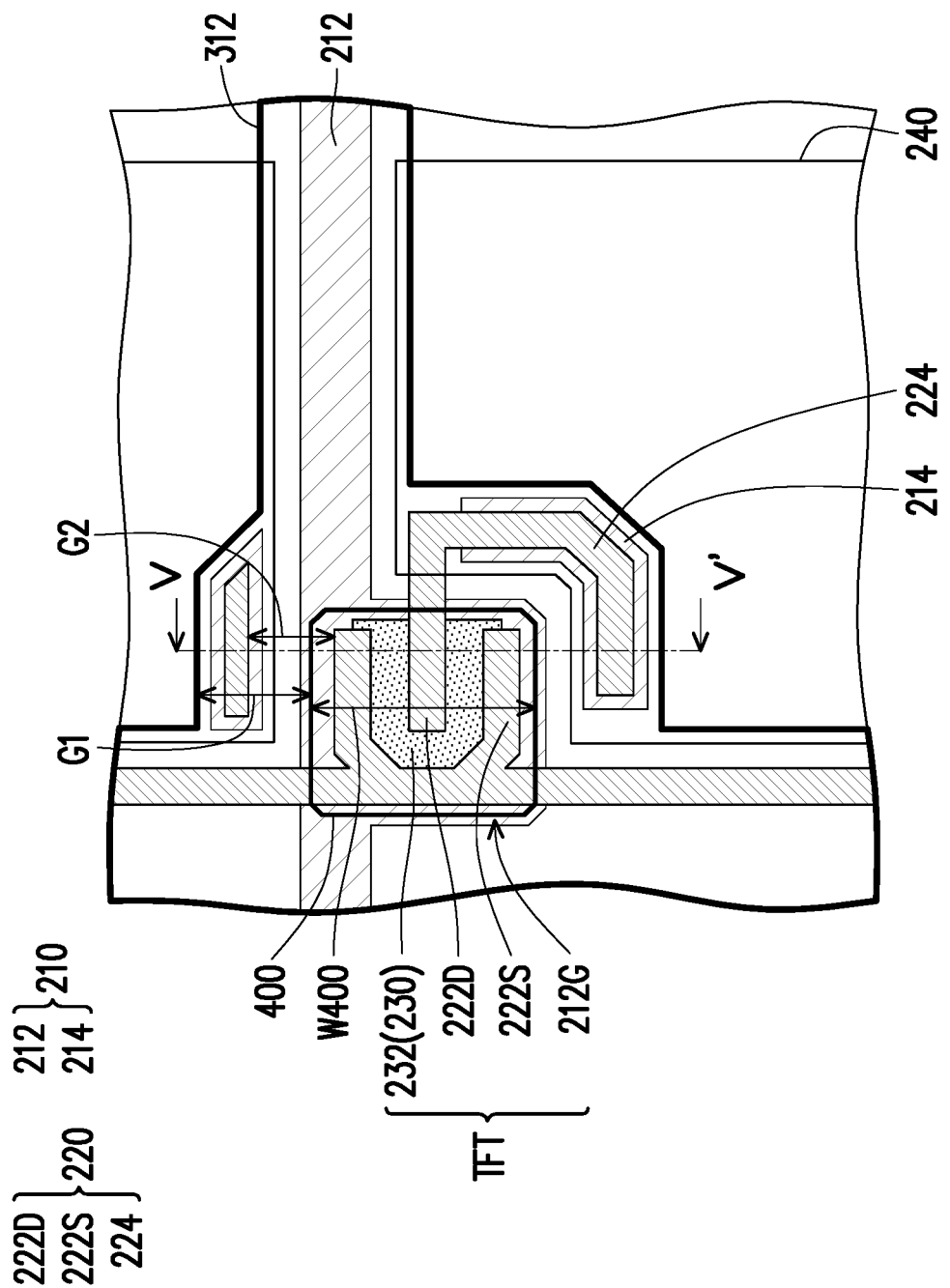
FIG. 6A is a partial top schematic view of a display panel according to an embodiment of the present invention.
Figure 6B:
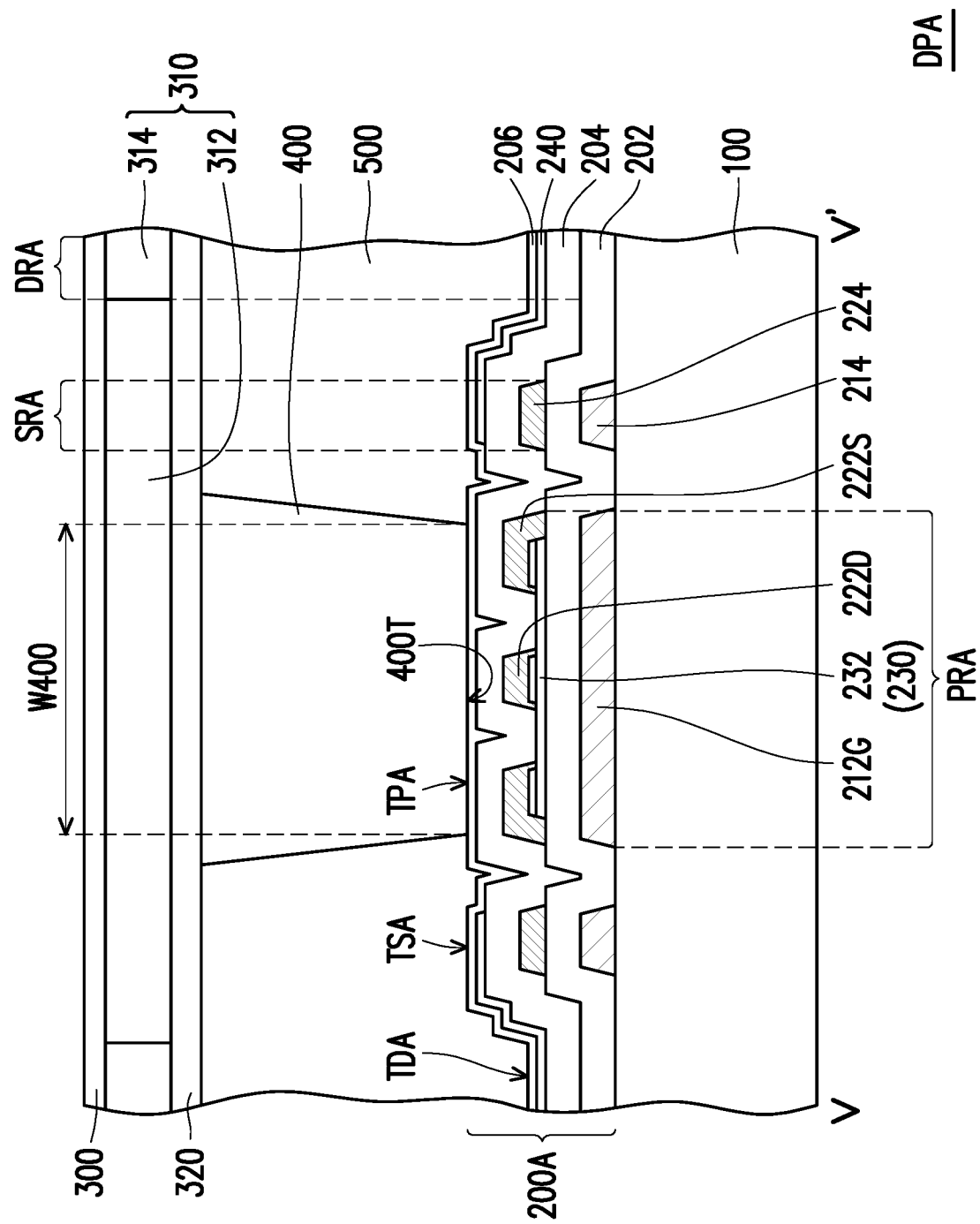
FIG. 6B is a cross-sectional schematic view taken along line V-V' of FIG. 6A.

FIG. 6A is a partial top schematic view of a display panel according to an embodiment of the present invention, and FIG. 6B is a cross-sectional schematic view taken along line V-V of FIG. 6A. The display panel DPA of FIG. 6A and FIG. 6B can be used as an implementation for the location of the first spacer 40A of the display panel DP of FIG. 1. Referring to FIG. 6A and FIG. 6B, the display panel DPA includes a first substrate 100, a pixel array structure 200A, a second substrate 300, a color filter array 310, a counter electrode 320, a spacer 400 and a display medium layer 500. The first substrate 100 and the second substrate 300 are opposite to each other up and down, and the spacer 400 and the display medium layer 500 are disposed between the first substrate 100 and the second substrate 300. The pixel array structure 200A is disposed on the first substrate 100 and located between the first substrate 100 and the display medium layer 500. The color filter array 310 is disposed on the second substrate 300 and located between the second substrate 300 and the display medium layer 500. The counter electrode 320 is disposed on the second substrate 300 and located between the color filter array 310 and the display medium layer 500. The pixel array structure 200A and the counter electrode 320 are used to provide an electric field to drive the display medium layer 500 to realize a display function. In other embodiments, the counter electrode 320 can be omitted and only the pixel array structure 200A is used to provide the electric field to drive the display medium layer 500.

For the first substrate 100 and the pixel array structure 200A, reference can be made to the related description of FIG. 2A and FIG. 2B. Specifically, the pixel array structure 200A includes a first insulating layer 202, a second insulating layer 204, an alignment layer 206, a first metal layer 210, a second metal layer 220, a semiconductor layer 230 and a first electrode 240. The first metal layer 210 includes a first signal line 212 and a first support pattern 214, and the first signal line 212 overlaps the channel pattern 232 of the semiconductor layer 230 and includes a first platform pattern as the gate 212G. The second metal layer 220 includes a second platform pattern as the source 222S and the drain 222D, and a second support pattern 224. The semiconductor layer 230 may include a channel pattern 232 located between a first platform pattern as the gate 212G and a second platform pattern as the source 222S and the drain 222D. Thus, the gate 212G, the channel pattern 232, the source 222S and the drain 222D form an active component TFT together. The orthographic projection areas of the semiconductor layer 230 and the second platform pattern as the source 222S and the drain 222D on the first substrate 100 overlap the orthographic projection area of the first platform pattern (the gate 212G) of the first signal line 212 on the first substrate 100 to define the platform region PRA. The orthographic projection area of the second support pattern 224 on the first substrate 100 overlaps the orthographic projection area of the first support pattern 214 on the first substrate 100 to define the support region SRA.

In the present embodiment, the color filter array 310 includes a black matrix 312 and a color filter pattern 314 located beside the black matrix 312. The orthographic projection area of the black matrix 312 on the first substrate 100 overlaps the orthographic projection area of the support region SRA on the first substrate 100, and the orthographic projection area of the black matrix 312 on the first substrate 100 define the display region DRA. Specifically, the orthographic projection area of the black matrix 312 on the first substrate 100 overlaps all of the orthographic projection areas of the platform region PRA and the support region SRA on the first substrate 100. The display region DRA refers to a region that is not shielded by the black matrix 312. As can be seen from FIG. 6A, the orthographic projection area of the black matrix 312 on the first substrate 100 overlaps the orthographic projection areas of the first metal layer 210 and the second metal layer 220 on the first substrate 100. The orthographic projection area of the color filter pattern 314 on the first substrate 100 falls in the display region DRA.

In the platform region PRA, the pixel array structure 200A includes a stack structure formed by sequentially stacking the first metal layer 210, the first insulating layer 202, the semiconductor layer 230, the second metal layer 220, the second insulating layer 204 and the alignment layer 206. In the support region SRA, the pixel array structure 200A includes a stack structure formed by sequentially stacking the first metal layer 210, the first insulating layer 202, the second metal layer 220, the second insulating layer 204, the first electrode 240 and the alignment layer 206. In the display region DRA, the pixel array structure 200A includes a stack structure formed by sequentially stacking the first insulating layer 202, the second insulating layer 204, the first electrode 240 and the alignment layer 206. In the present embodiment, the platform top surface TPA of the platform region PRA of the pixel array structure 200A and the support top surface TSA of the support region SRA are both higher than the display top surface TDA of the display region DRA, and the support top surface TSA and the platform top surface TPA may be coplanar or the height difference between the two may be from 0 micron to 0.3 micron.

The spacer 400 is disposed on the second substrate 300 and protrudes toward the first substrate 100 to abut against the pixel array structure 200A. In other words, a terminal surface 400T of the spacer 400 is in contact with the platform top surface TPA. Since the alignment layer 206 is the topmost film layer of the pixel array structure 200A, the terminal surface 400T of the spacer 400 is in contact with the portion of the alignment layer 206 located in the platform region PRA. In addition, the portion of the alignment layer 206 located in the support region SRA may be located at a height similar to that of the portion of the alignment layer 206 located in the platform region PRA.

In the present embodiment, a spacing distance G1 between the edge of the orthographic projection area of the black matrix 312 on the first substrate 100 and the edge of the orthographic projection area of the spacer 400 on the first substrate 100 may be 7 microns to 25 microns. In addition, a spacing distance G2 between the second support pattern 224 for defining the support region SRA and the source 222S for defining the platform region PRA is not greater than a width W400 of the spacer 400 at the terminal surface 400T. Thus, if the display panel DPA receives an external force such that the spacer 400 is displaced, the stack structure of the pixel array structure 200A in the support region SRA can provide a supporting function, thereby preventing the spacer 400 from contacting the alignment layer 206 of the pixel array structure 200A in the display region DRA. Therefore, the alignment layer 206 is not easily damaged, and can provide the alignment function normally. Thus, the display panel DPA can have ideal quality and can display a display effect that meets the demands.

Figure 7A:
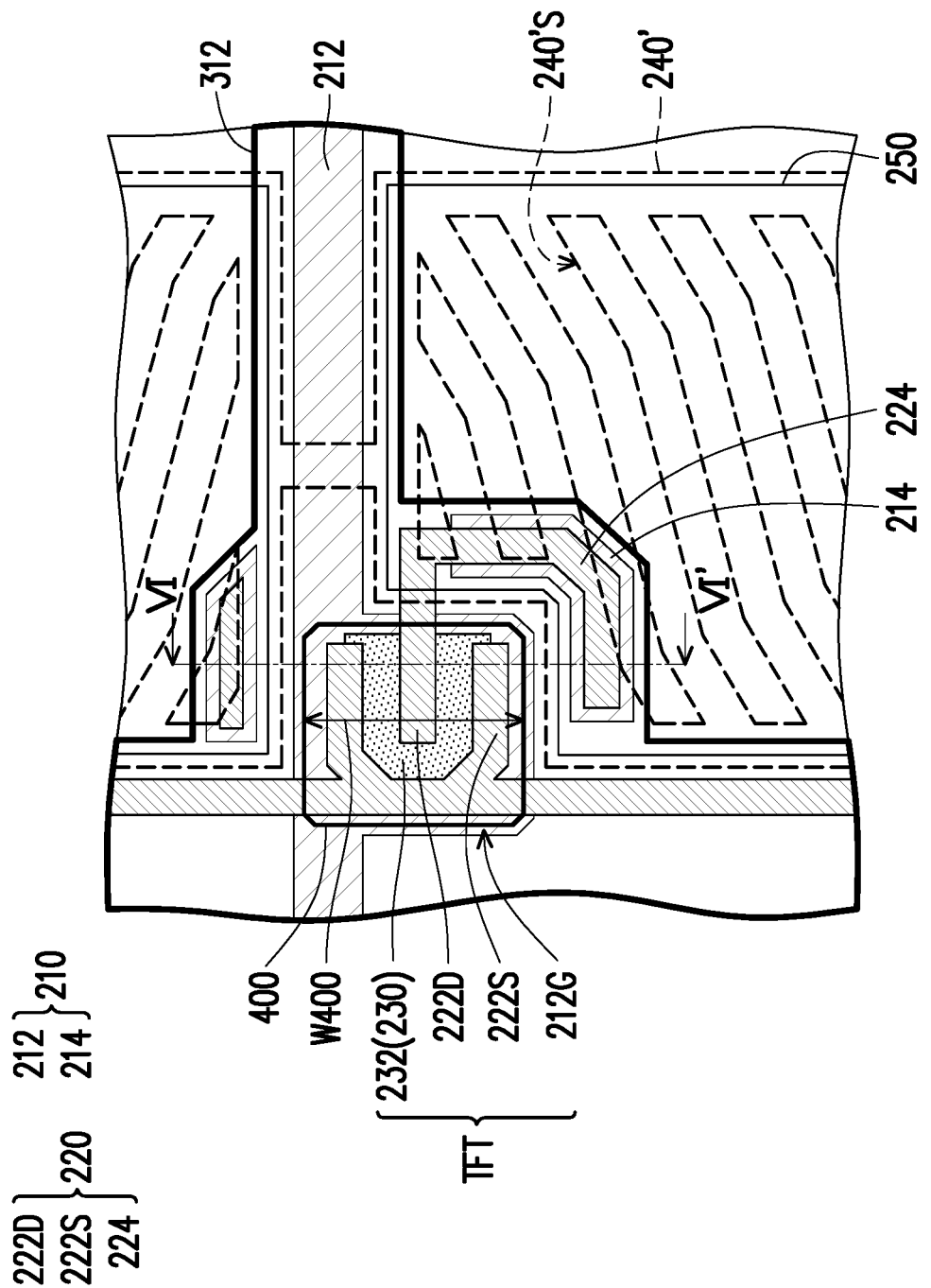
FIG. 7A is a partial top schematic view of a display panel according to an embodiment of the present invention.
Figure 7B:
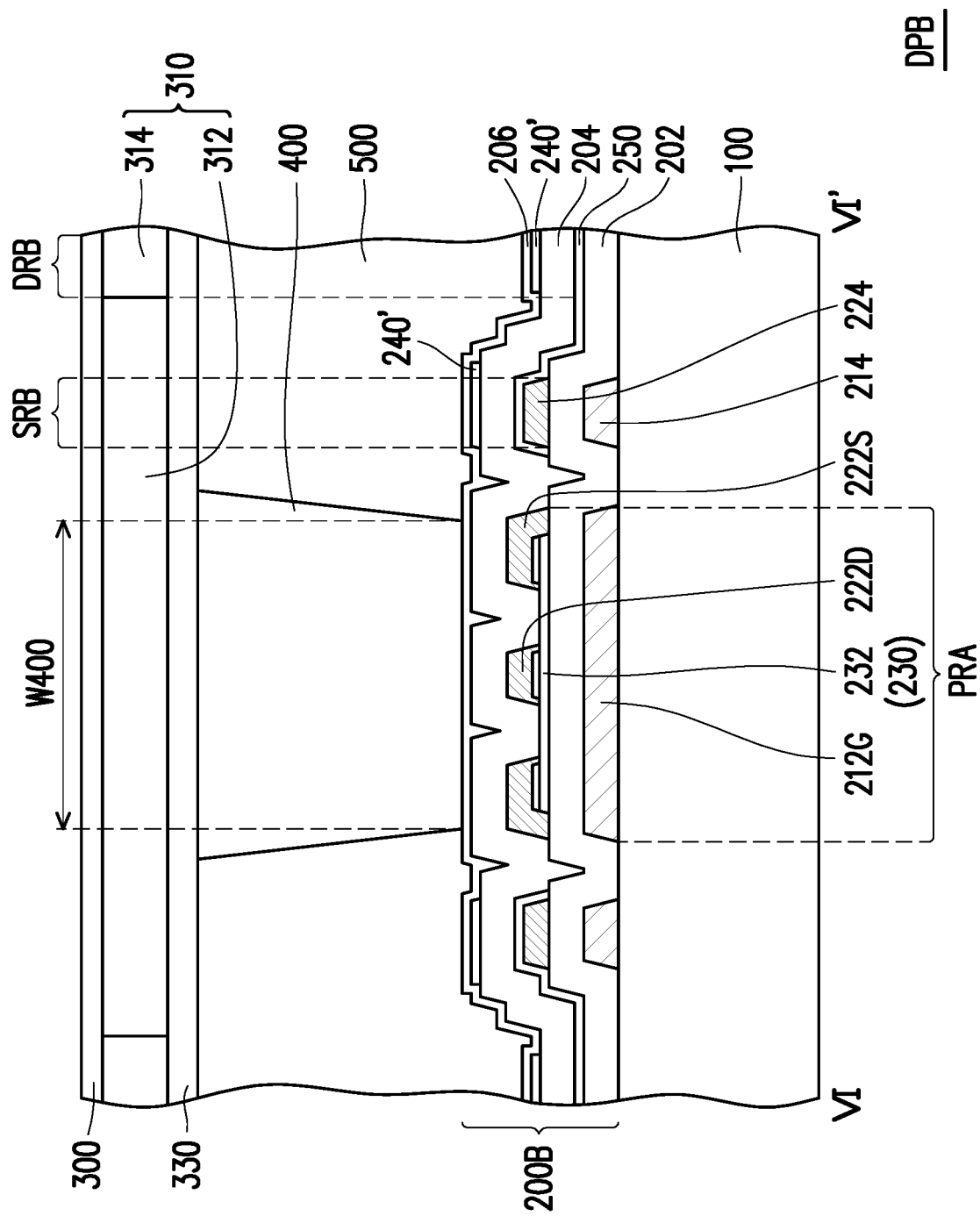
FIG. 7B is a cross-sectional schematic view taken along line VI-VI' of FIG. 7A.

FIG. 7A is a partial top schematic view of a display panel according to an embodiment of the present invention, and FIG. 7B is a cross-sectional schematic view taken along line VI-VI' of FIG. 7A. The display panel DPB of FIG. 7A and FIG. 7B is similar to the display panel DPA of FIG. 6A and FIG. 6B, and can be used as an implementation for the location of the first spacer 40A of the display panel DP of FIG. 1. Referring to FIG. 7A and FIG. 7B, the display panel DPB includes a first substrate 100, a pixel array structure 200B, a second substrate 300, a color filter array 310, a planarization layer 330, a spacer 400 and a display medium layer 500. Specifically, the display panel DPB is different from the display panel DPA in that the display panel DPB does not have the counter electrode 320 shown in FIG. 6B, but the second substrate 300 is provided with the planarization layer 330. The material of the planarization layer 330 may include a transparent insulating material, and the spacer 400 is disposed on the planarization layer 330. Further, in the display panel DPB, the pixel array structure 200B of FIG. 3A and FIG. 3B replaces the pixel array structure 200A in the display panel DPA.

The pixel array structure 200B includes a first insulating layer 202, a second insulating layer 204, an alignment layer 206, a first metal layer 210, a second metal layer 220, a semiconductor layer 230, a first electrode 240' and a second electrode 250. The first metal layer 210 includes a first signal line 212 and a first support pattern 214, and the first signal line 212 overlaps the channel pattern 232 of the semiconductor layer 230 and includes a first platform pattern as the gate 212G. The second metal layer 220 includes a second platform pattern as the source 222S and the drain 222D, and a second support pattern 224. The gate 212G, the channel pattern 232, the source 222S and the drain 222D form an active component TFT together. The pixel array structure 200B has a platform region PRA, a support region SRB and a display region DRB. For the relationship of the platform region PRA to other components, reference can be made to the embodiment of FIG. 6A and FIG. 6B. The support region SRB and the display region DRB are different from those in the embodiment of FIG. 6A and FIG. 6B in that the pixel array structure 200B of the display panel DPB further includes the second electrode 250 in the support region SRB and the display region DRB, and the first electrode 240' may have a plurality of slits 240'S.

Figure 8A:
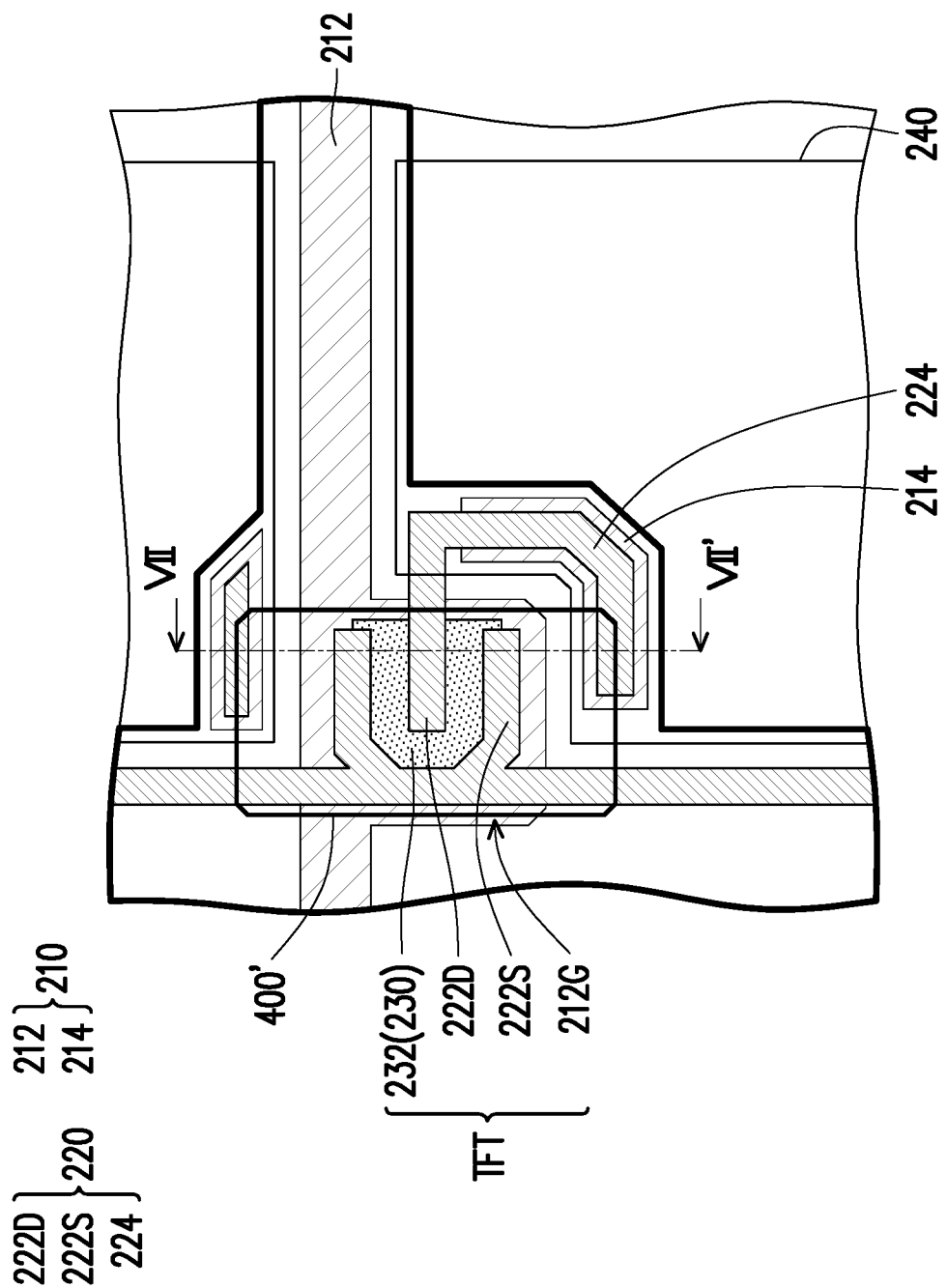
FIG. 8A is a partial top schematic view of a display panel according to an embodiment of the present invention.
Figure 8B:
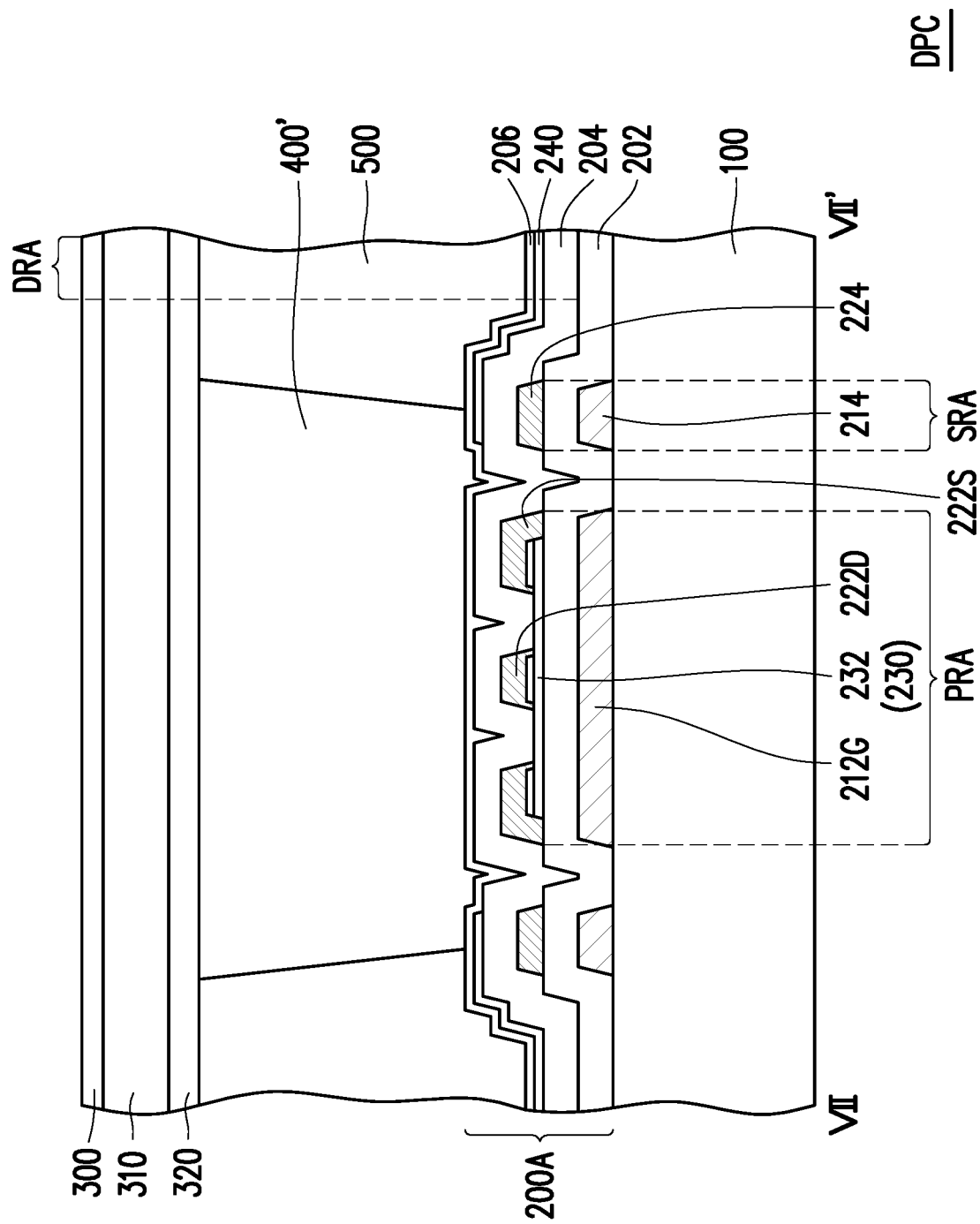
FIG. 8B is a cross-sectional schematic view taken along line VII-VII' of FIG. 8A.

FIG. 8A is a partial top schematic view of a display panel according to an embodiment of the present invention, and FIG. 8B is a cross-sectional schematic view taken along line VII-VII' of FIG. 8A. The display panel DPC of FIG. 8A and FIG. 8B is similar to the display panel DPA of FIG. 6A and FIG. 6B, and can be used as an implementation for the location of the first spacer 40A of the display panel DP of FIG. 1. Referring to FIG. 8A and FIG. 8B, the display panel DPC includes a first substrate 100, a pixel array structure 200A, a second substrate 300, a color filter array 310, a counter electrode 320, a spacer 400' and a display medium layer 500. Specifically, the pixel array structure 200A includes a first insulating layer 202, a second insulating layer 204, an alignment layer 206, a first metal layer 210, a second metal layer 220, a semiconductor layer 230 and a first electrode 240. The first metal layer 210 includes a first signal line 212 and a first support pattern 214, and the first signal line 212 overlaps the channel pattern 232 of the semiconductor layer 230 and includes a first platform pattern as the gate 212G. The second metal layer 220 includes a second platform pattern as the source 222S and the drain 222D, and a second support pattern 224. The gate 212G, the channel pattern 232, the source 222S and the drain 222D form an active component TFT together. The pixel array structure 200A has a platform region PRA, a support region SRA and a display region DRA. The display panel DPC is different from the display panel DPA in that the orthographic projection area of the spacer 400' on the first substrate 100 not only overlaps the orthographic projection area of the platform region PRA on the first substrate 100, but also overlaps the orthographic projection area of the second support pattern 224 defining the support region SRA on the first substrate 100.

Figure 9A:
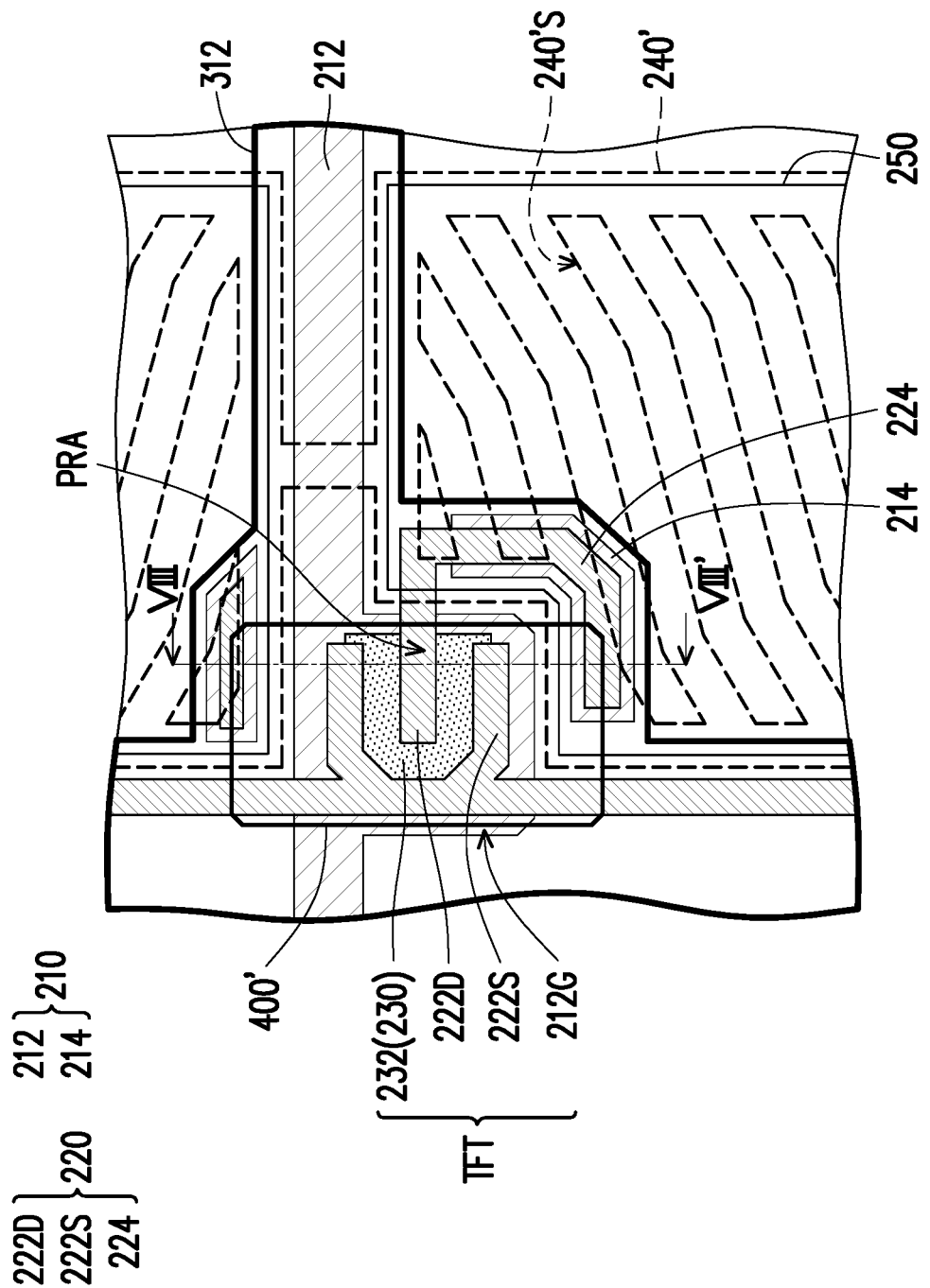
FIG. 9A is a partial top schematic view of a display panel according to an embodiment of the present invention.
Figure 9B:
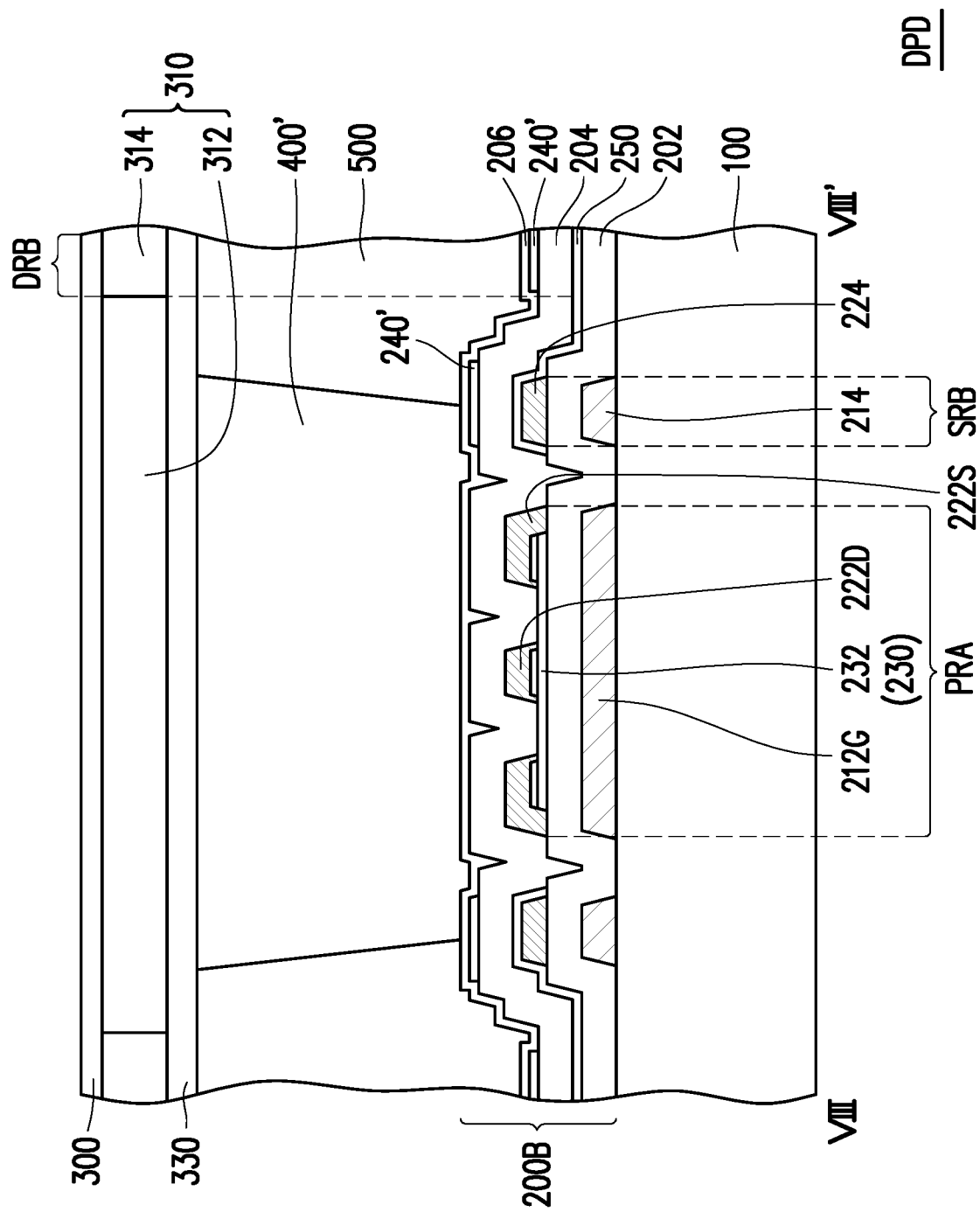
FIG. 9B is a cross-sectional schematic view taken along line VIII-VIII' of FIG. 9A.

FIG. 9A is a partial top schematic view of a display panel according to an embodiment of the present invention, and FIG. 9B is a cross-sectional schematic view taken along line VIII-VIII' of FIG. 9A. The display panel DPD of FIG. 9A and FIG. 9B is similar to the display panel DPB of FIG. 7A and FIG. 7B, and can be used as an implementation for the location of the first spacer 40A of the display panel DP of FIG. 1. Referring to FIG. 9A and FIG. 9B, the display panel DPD includes a first substrate 100, a pixel array structure 200B, a second substrate 300, a color filter array 310 including a black matrix 312, a planarization layer 330, a spacer 400' and a display medium layer 500. The spacer 400' is disposed on the planarization layer 330. Specifically, the pixel array structure 200B includes a first insulating layer 202, a second insulating layer 204, an alignment layer 206, a first metal layer 210, a second metal layer 220, a semiconductor layer 230, a first electrode 240' and a second electrode 250. The first metal layer 210 includes a first signal line 212 and a first support pattern 214, and the first signal line 212 overlaps the channel pattern 232 of the semiconductor layer 230 and includes a first platform pattern as the gate 212G. The second metal layer 220 includes a second platform pattern as the source 222S and the drain 222D, and a second support pattern 224. The gate 212G, the channel pattern 232, the source 222S and the drain 222D form an active component TFT together. The pixel array structure 200B has a platform region PRA, a support region SRB and a display region DRB. For the relationship of the platform region PRA to other components, reference can be made to the embodiment of FIG. 7A and FIG. 7B. The first electrode 240' and the second electrode 250 are disposed in the support region SRB and the display region DRB of the pixel array structure 200B, and the first electrode 240' may have a plurality of slits 240'S. The display panel DPD is different from the display panel DPA in that the orthographic projection area of the spacer 400' on the first substrate 100 not only overlaps the orthographic projection area of the platform region PRA on the first substrate 100, but also overlaps the orthographic projection area of the second support pattern 224 for defining the support region SRB on the first substrate 100 in the pixel array structure 200B.

Figure 10A:
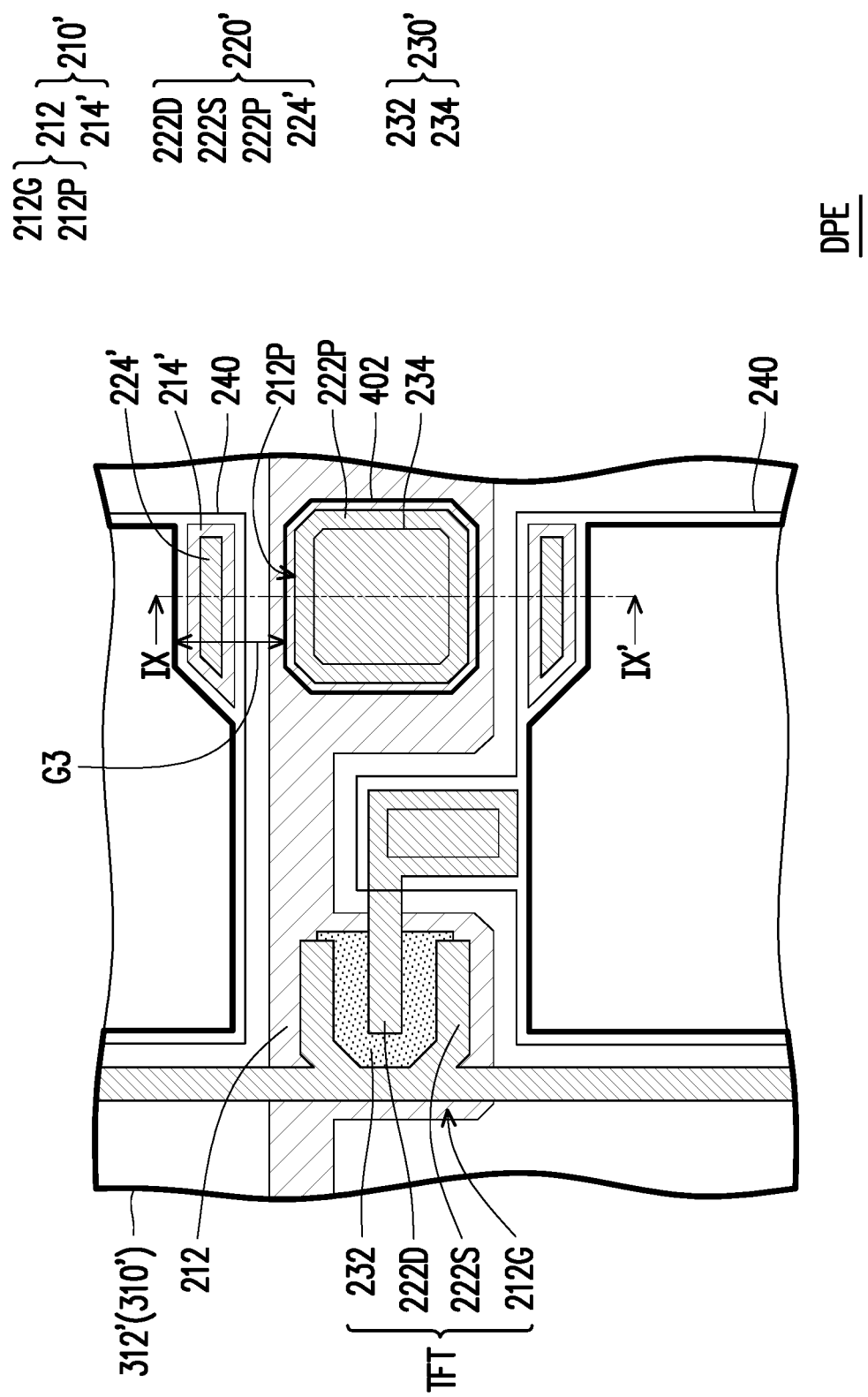
FIG. 10A is a partial top schematic view of a display panel according to an embodiment of the present invention.
Figure 10B:
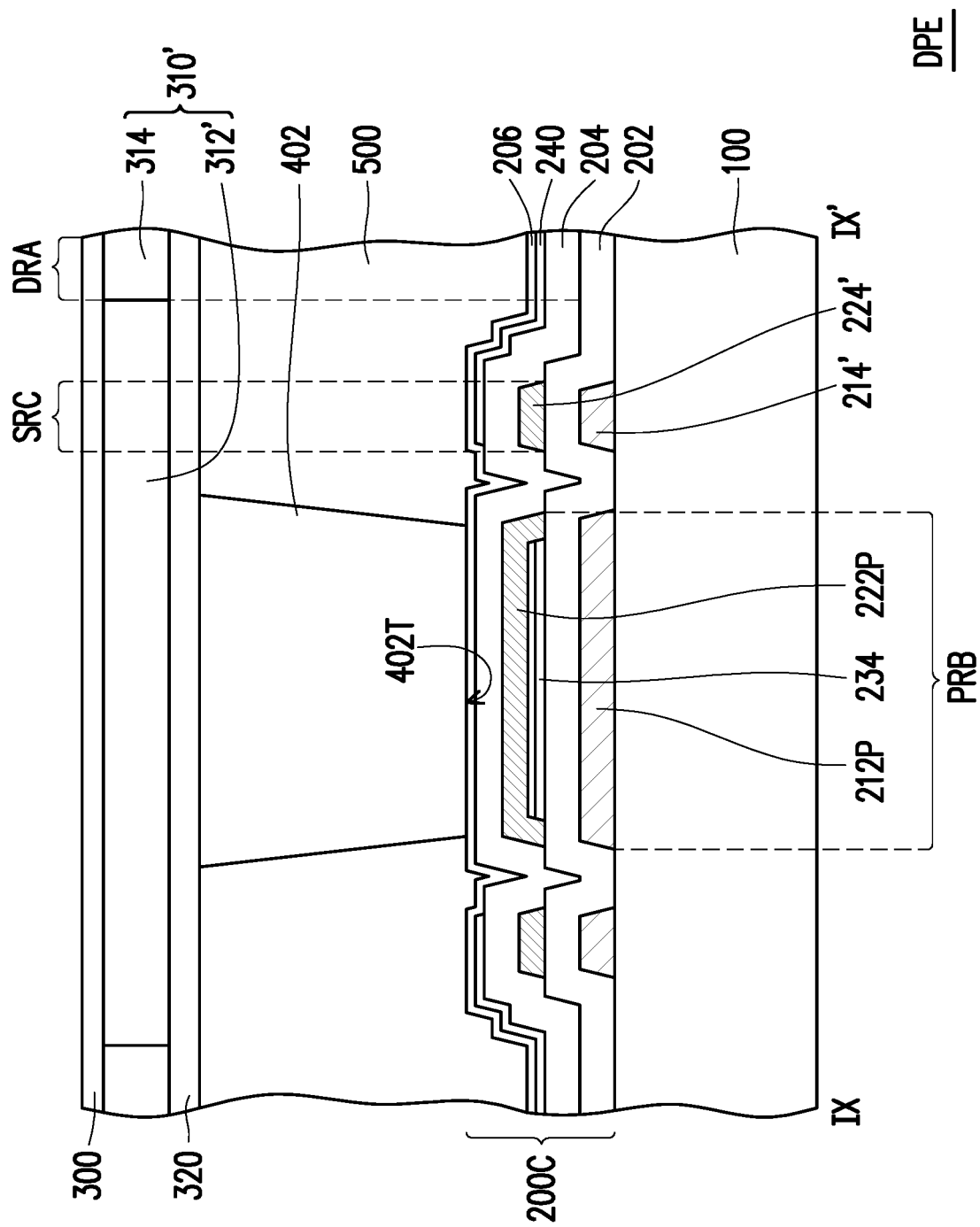
FIG. 10B is a cross-sectional schematic view taken along line IX-IX' of FIG. 10A.

FIG. 10A is a partial top schematic view of a display panel according to an embodiment of the present invention, and FIG. 10B is a cross-sectional schematic view taken along line IX-IX' of FIG. 10A. The display panel DPE of FIG. 10A and FIG. 10B is similar to the display panel DPA of FIG. 6A and FIG. 6B, and can be used as an implementation for the location of the first spacer 40A of the display panel DP of FIG. 1. Referring to FIG. 10A and FIG. 10B, the display panel DPE includes a first substrate 100, a pixel array structure 200C, a second substrate 300, a color filter array 310', a counter electrode 320, a spacer 402 and a display medium layer 500. Specifically, the display panel DPE is different from the display panel DPA in that in the display panel DPE, the pixel array structure 200C of FIG. 4A and FIG. 4B replaces the pixel array structure 200A in the display panel DPA.

The pixel array structure 200C includes a first insulating layer 202, a second insulating layer 204, an alignment layer 206, a first metal layer 210', a second metal layer 220', a semiconductor layer 230' and a first electrode 240. The first metal layer 210' includes a first signal line 212 and a first support pattern 214'. A portion of the first signal line 212 forms the gate 212G and the other portion forms the first platform pattern 212P. The second metal layer 220' includes a source 222S, a drain 222D, a second platform pattern 222P and a second support pattern 224'. The semiconductor layer 230' includes a channel pattern 232 and a semiconductor pattern 234. In the present embodiment, the gate 212G, the channel pattern 232, the source 222S and the drain 222D form an active component TFT together.

The pixel array structure 200C has a platform region PRB, a support region SRC and a display region DRA. For the relationship of the display region DRA to other components, reference can be made to the embodiment of FIG. 6A and FIG. 6B. The orthographic projection areas of the second platform pattern 222P and the semiconductor pattern 234 on the first substrate 100 overlap the orthographic projection area of the first platform pattern 212P on the first substrate 100 to define the platform region PRB. The orthographic projection area of the second support pattern 224' on the first substrate 100 overlaps the orthographic projection area of the first support pattern 214' on the first substrate 100 to define the support region SRC. In the pixel array structure 200C of the display panel DPE, the platform region PRB and the active component TFT are located at different portions of the first signal line 212. In addition, the support region SRC is correspondingly disposed on the periphery of the platform region PRB and not on the periphery of the active component TFT. The spacer 402 is disposed on the second substrate 300 and protrudes toward the first substrate 100 to abut against the pixel array structure 200C. In other words, an terminal surface 402T of the spacer 402 is in contact with the portion of the alignment layer 206 located in the platform region PRB. The orthographic projection area of the spacer 402 on the first substrate 100 does not overlap the orthographic projection area of the active component TFT on the first substrate 100. In addition, the portion of the alignment layer 206 located in the support region SRC may be located at a height similar to that of the portion of the alignment layer 206 located in the platform region PRB.

In the present embodiment, the contour of the black matrix 312' of the color filter array 310' is disposed to shield the active component TFT, the platform region PRB and the support region SRC. A spacing distance G3 between the edge of the orthographic projection area of the black matrix 312' on the first substrate 100 and the edge of the orthographic projection area of the spacer 402 on the first substrate 100 may be 7 microns to 25 microns. If the display panel DPE receives an external force such that the spacer 402 is displaced, the stack structure of the pixel array structure 200C in the support region SRC can provide a supporting function, thereby preventing the spacer 402 from contacting the alignment layer 206 of the pixel array structure 200C in the display region DRA. Therefore, the alignment layer 206 is not easily damaged, and can provide the alignment function normally. Thus, the display panel DPE can have ideal quality and can display a display effect that meets the demands.

Figure 11A:
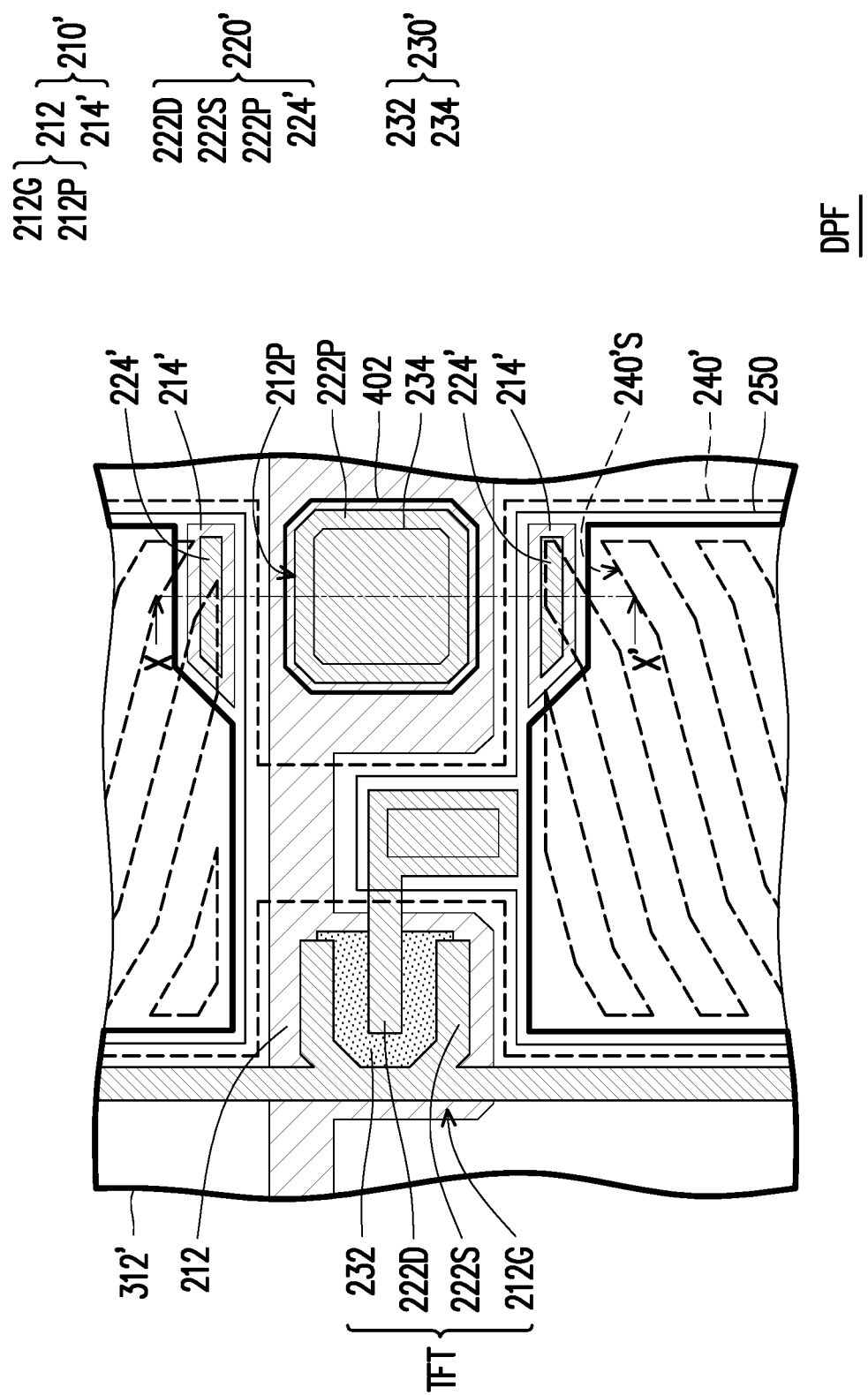
FIG. 11A is a partial top schematic view of a display panel according to an embodiment of the present invention.
Figure 11B:
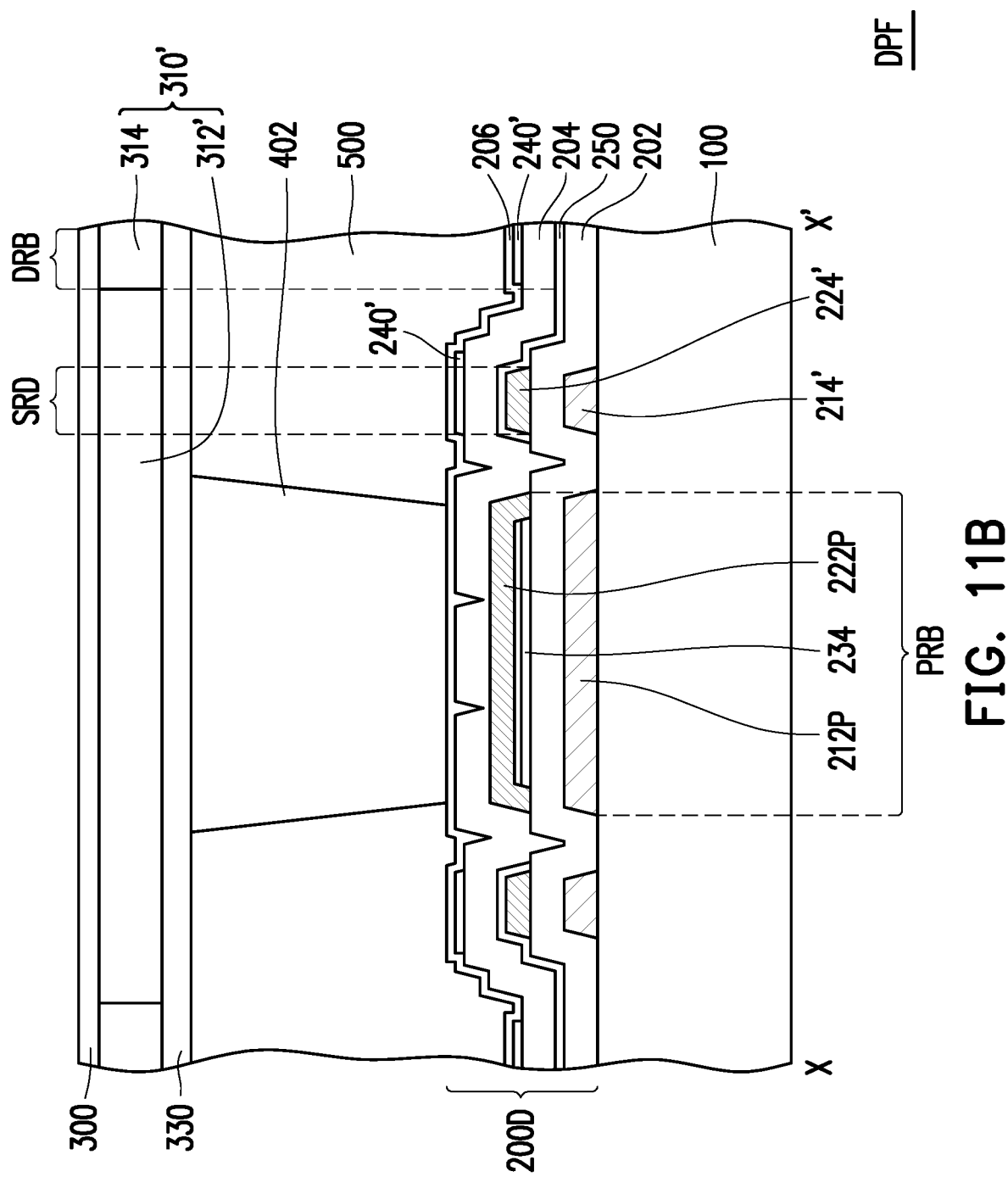
FIG. 11B is a cross-sectional schematic view taken along line X-X' of FIG. 11A.

FIG. 11A is a partial top schematic view of a display panel according to an embodiment of the present invention, and FIG. 11B is a cross-sectional schematic view taken along line X-X' of FIG. 11A. The display panel DPF of FIG. 11A and FIG. 11B is similar to the display panel DPE of FIG. 10A and FIG. 10B, and can be used as an implementation for the location of the first spacer 40A of the display panel DP of FIG. 1. Referring to FIG. 11A and FIG. 11B, the display panel DPF includes a first substrate 100, a pixel array structure 200D, a second substrate 300, a color filter array 310' including a black matrix 312' and a color filter pattern 314, a planarization layer 330, a spacer 402 and a display medium layer 500. Specifically, the display panel DPF is different from the display panel DPE in that the display panel DPF does not have the counter electrode 320, but the second substrate 300 is provided with the planarization layer 330. The material of the planarization layer 330 may include a transparent insulating material, and the spacer 402 is disposed on the planarization layer 330. Further, in the display panel DPF, the pixel array structure 200D of FIG. 5A and FIG. 5B replaces the pixel array structure 200C in the display panel DPE.

The pixel array structure 200D includes a first insulating layer 202, a second insulating layer 204, an alignment layer 206, a first metal layer 210', a second metal layer 220', a semiconductor layer 230', a first electrode 240' and a second electrode 250. The first metal layer 210' includes a first signal line 212 and a first support pattern 214'. A portion of the first signal line 212 forms the gate 212G and the other portion forms the first platform pattern 212P. The second metal layer 220' includes a source 222S, a drain 222D, a second platform pattern 222P and a second support pattern 224'. The semiconductor layer 230' includes a channel pattern 232 and a semiconductor pattern 234. In the present embodiment, the gate 212G, the channel pattern 232, the source 222S and the drain 222D form an active component TFT together. The orthographic projection areas of the second platform pattern 222P and the semiconductor pattern 234 on the first substrate 100 overlap the orthographic projection area of the first platform pattern 212P on the first substrate 100 to define the platform region PRB. The orthographic projection area of the second support pattern 224' on the first substrate 100 overlaps the orthographic projection area of the first support pattern 214' on the first substrate 100 to define the support region SRC. A region of the pixel array structure 200D that is not shielded by the black matrix 312' is the display region DRB. In addition, the first electrode 240' and the second electrode 250 are disposed in the support region SRD and the display region DRB of the pixel array structure 200D, and the first electrode 240' may have a plurality of slits 240'S.

Figure 12A:
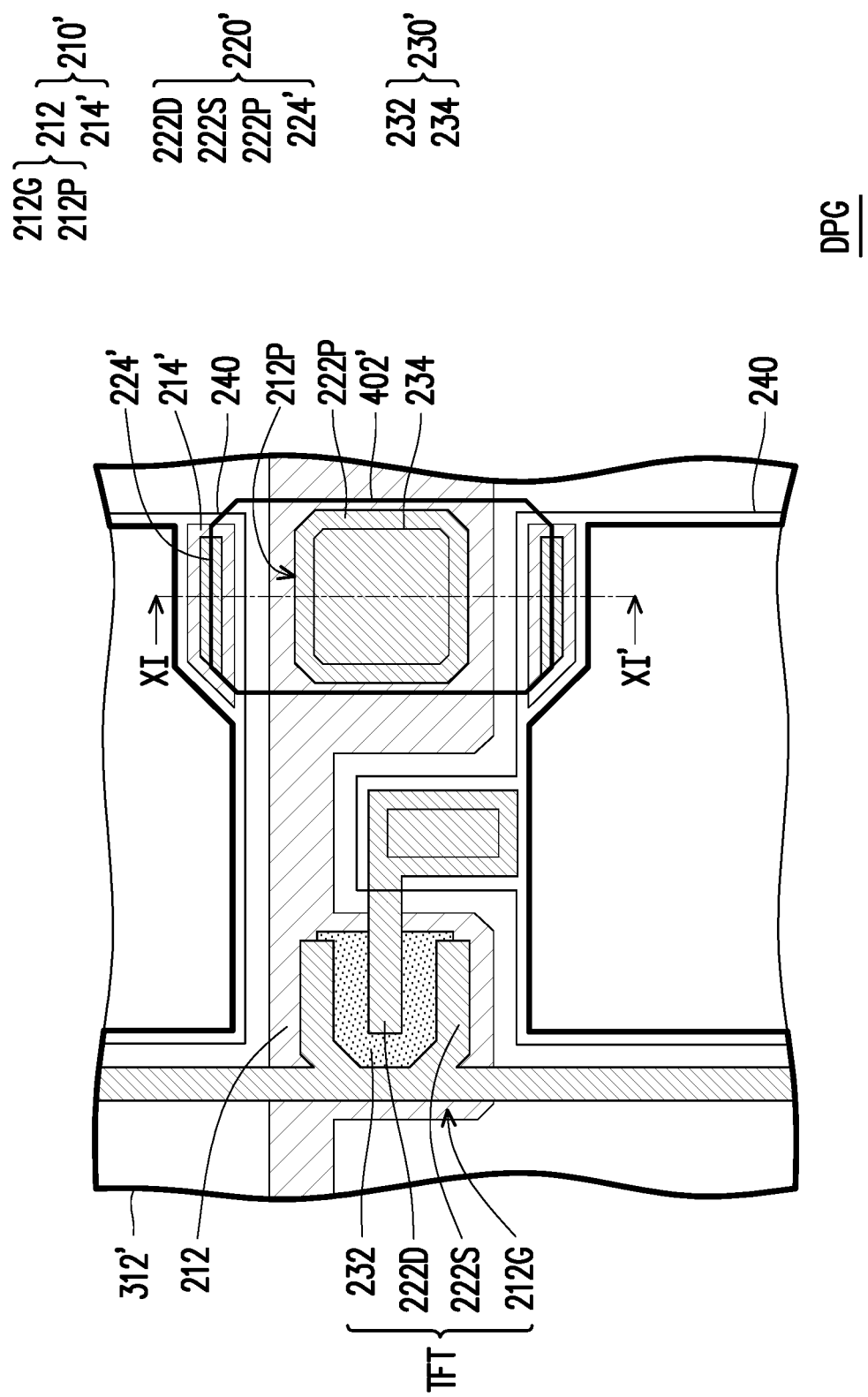
FIG. 12A is a partial top schematic view of a display panel according to an embodiment of the present invention.
Figure 12B:
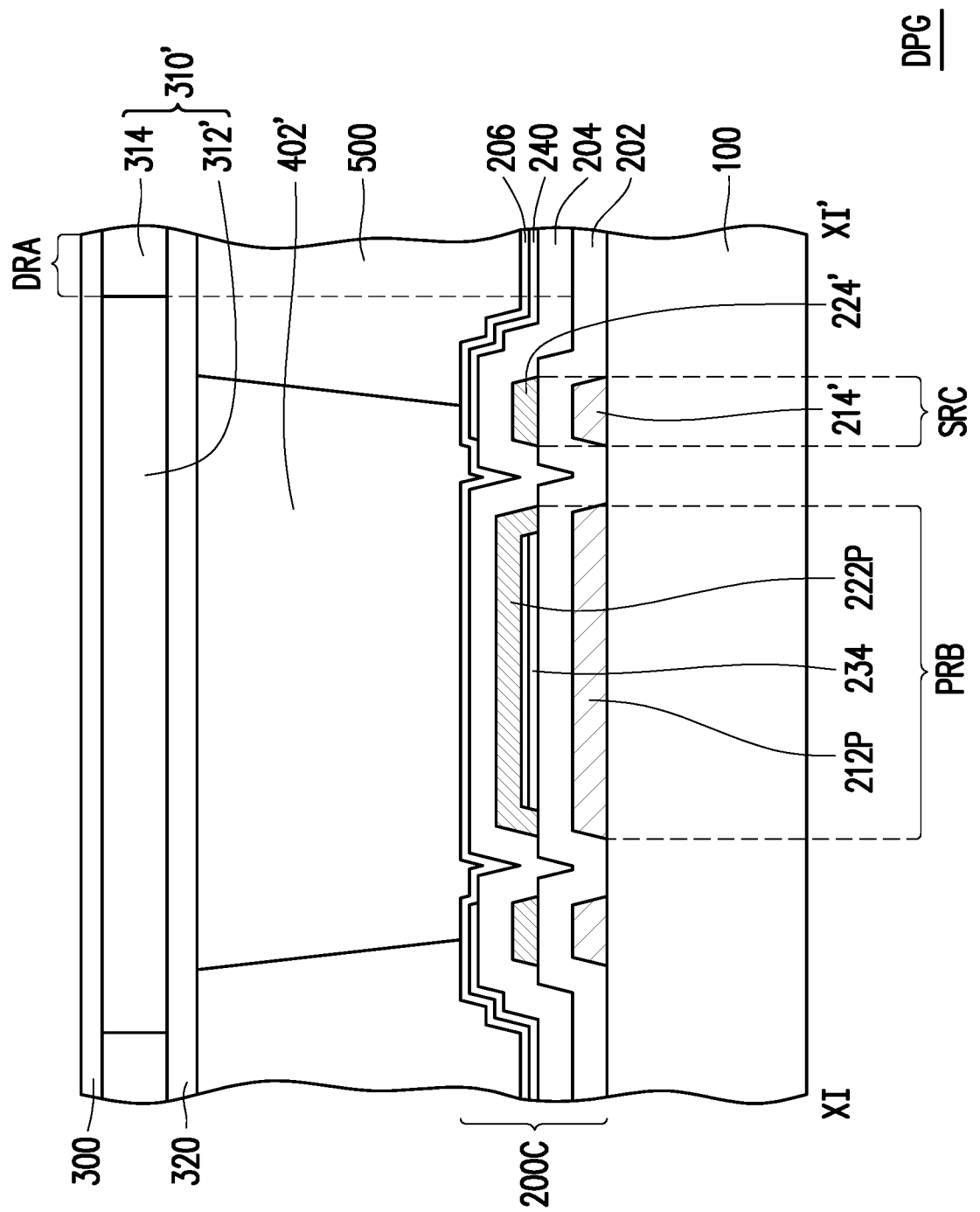
FIG. 12B is a cross-sectional schematic view taken along line XI-XI' of FIG. 12A.

FIG. 12A is a partial top schematic view of a display panel according to an embodiment of the present invention, and FIG. 12B is a cross-sectional schematic view taken along line XI-XI' of FIG. 12A. The display panel DPG of FIG. 12A and FIG. 12B is similar to the display panel DPE of FIG. 10A and FIG. 10B, and can be used as an implementation for the location of the first spacer 40A of the display panel DP of FIG. 1. Referring to FIG. 12A and FIG. 12B, the display panel DPG includes a first substrate 100, a pixel array structure 200C, a second substrate 300, a color filter array 310' including a black matrix 312' and a color filter pattern 314, a counter electrode 320, a spacer 402' and a display medium layer 500.

The pixel array structure 200C includes a first insulating layer 202, a second insulating layer 204, an alignment layer 206, a first metal layer 210', a second metal layer 220', a semiconductor layer 230' and a first electrode 240. The first metal layer 210' includes a first signal line 212 and a first support pattern 214'. A portion of the first signal line 212 forms the gate 212G and the other portion forms the first platform pattern 212P. The second metal layer 220' includes a source 222S, a drain 222D, a second platform pattern 222P and a second support pattern 224'. The semiconductor layer 230' includes a channel pattern 232 and a semiconductor pattern 234. In the present embodiment, the gate 212G, the channel pattern 232, the source 222S and the drain 222D form an active component TFT together.

The pixel array structure 200C has a platform region PRB, a support region SRC and a display region DRA. For the relationship of the display region DRA to other components, reference can be made to the embodiment of FIG. 6A and FIG. 6B. The orthographic projection areas of the second platform pattern 222P and the semiconductor pattern 234 on the first substrate 100 overlap the orthographic projection area of the first platform pattern 212P on the first substrate 100 to define the platform region PRB. The orthographic projection area of the second support pattern 224' on the first substrate 100 overlaps the orthographic projection area of the first support pattern 214' on the first substrate 100 to define the support region SRC. In the pixel array structure 200C of the display panel DPE, the platform region PRB and the active component TFT are located at different portions of the first signal line 212.

Specifically, the display panel DPG is different from the display panel DPE in that the orthographic projection area of the spacer 402' on the first substrate 100 not only overlaps the orthographic projection area of the platform region PRB on the first substrate 100, but also overlaps the orthographic projection area of the support region SRC on the first substrate 100. Specifically, the orthographic projection area of the spacer 402' on the first substrate 100 overlaps the orthographic projection area of the second support pattern 224' for defining the support region SRC on the first substrate 100 in the pixel array structure 200C.

Figure 13A:
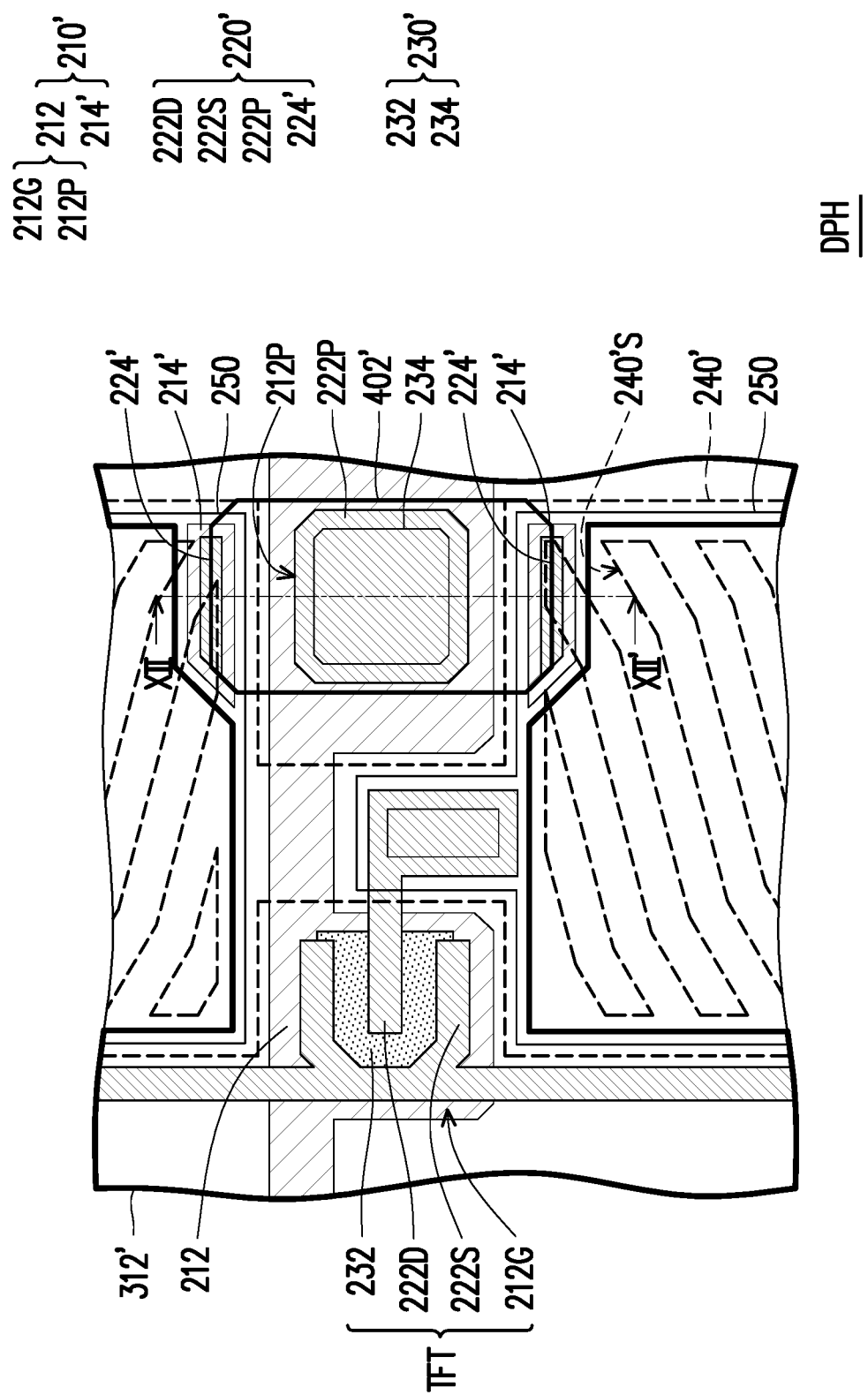
FIG. 13A is a partial top schematic view of a display panel according to an embodiment of the present invention.
Figure 13B:
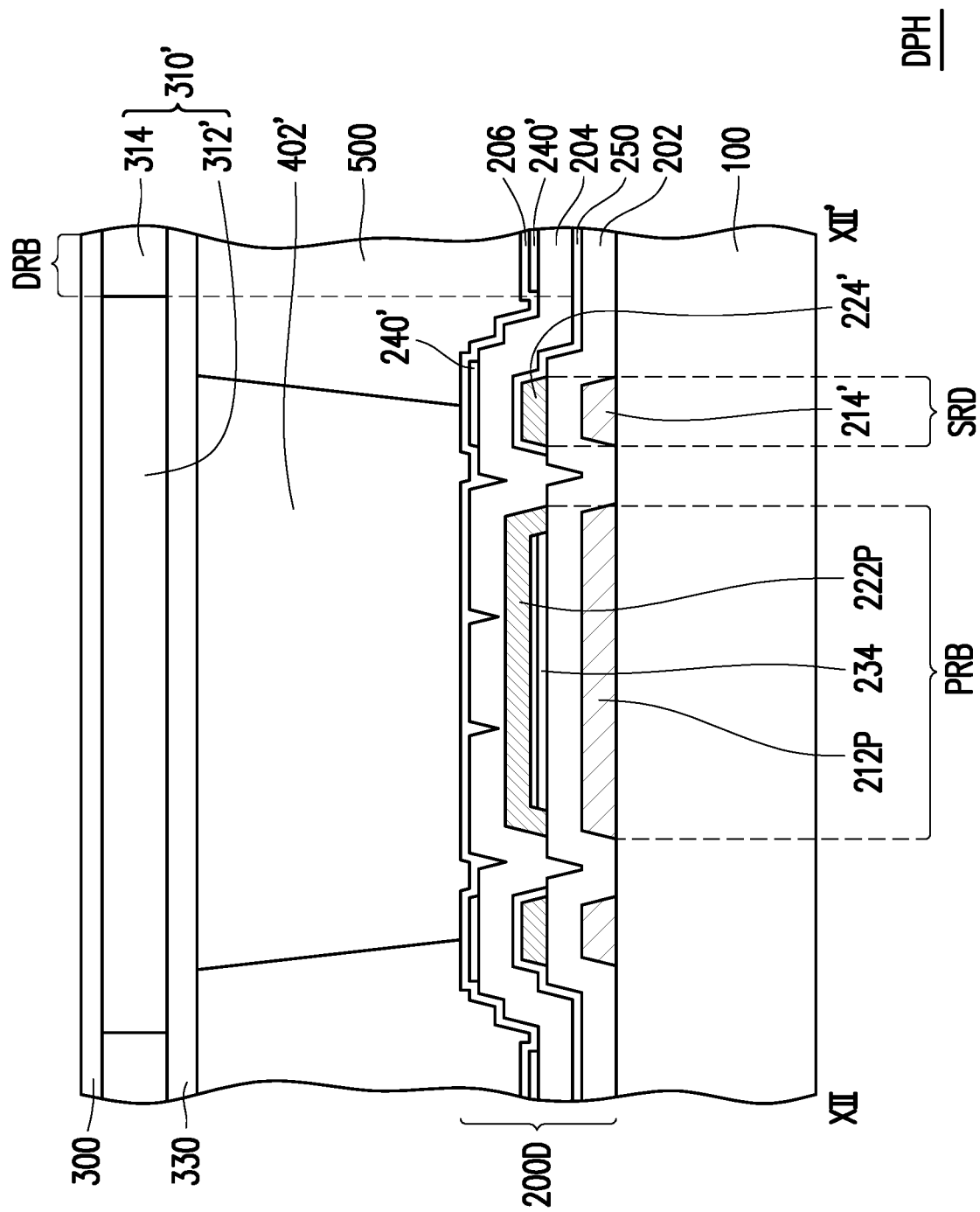
FIG. 13B is a cross-sectional schematic view taken along line XII-XII' of FIG. 13A.

FIG. 13A is a partial top schematic view of a display panel according to an embodiment of the present invention, and FIG. 13B is a cross-sectional schematic view taken along line XII-XII' of FIG. 13A. The display panel DPH of FIG. 13A and FIG. 13B is similar to the display panel DPF of FIG. 11A and FIG. 11B, and can be used as an implementation for the location of the first spacer 40A of the display panel DP of FIG. 1. Referring to FIG. 13A and FIG. 13B, the display panel DPH includes a first substrate 100, a pixel array structure 200B, a second substrate 300, a color filter array 310' including a black matrix 312' and a color filter pattern 314, a planarization layer 330, a spacer 402' and a display medium layer 500. The spacer 402' is disposed on the planarization layer 330.

Specifically, the pixel array structure 200D includes a first insulating layer 202, a second insulating layer 204, an alignment layer 206, a first metal layer 210', a second metal layer 220', a semiconductor layer 230', a first electrode 240' and a second electrode 250. The first metal layer 210' includes a first signal line 212 and a first support pattern 214'. A portion of the first signal line 212 forms the gate 212G and the other portion forms the first platform pattern 212P. The second metal layer 220' includes a source 222S, a drain 222D, a second platform pattern 222P and a second support pattern 224'. The semiconductor layer 230' includes a channel pattern 232 and a semiconductor pattern 234. In the present embodiment, the gate 212G, the channel pattern 232, the source 222S and the drain 222D form an active component TFT together. The orthographic projection areas of the second platform pattern 222P and the semiconductor pattern 234 on the first substrate 100 overlap the orthographic projection area of the first platform pattern 212P on the first substrate 100 to define the platform region PRB. The orthographic projection area of the second support pattern 224' on the first substrate 100 overlaps the orthographic projection area of the first support pattern 214' on the first substrate 100 to define the support region SRD. A region of the pixel array structure 200D that is not shield by the black matrix 312' is the display region DRB.

The display panel DPH is different from the display panel DPF in that the orthographic projection area of the spacer 402' on the first substrate 100 not only overlaps the orthographic projection area of the platform region PRB on the first substrate 100, but also overlaps the orthographic projection area of the second support pattern 224' for defining the support region SRD on the first substrate 100 in the pixel array structure 200D.

Figure 14A:
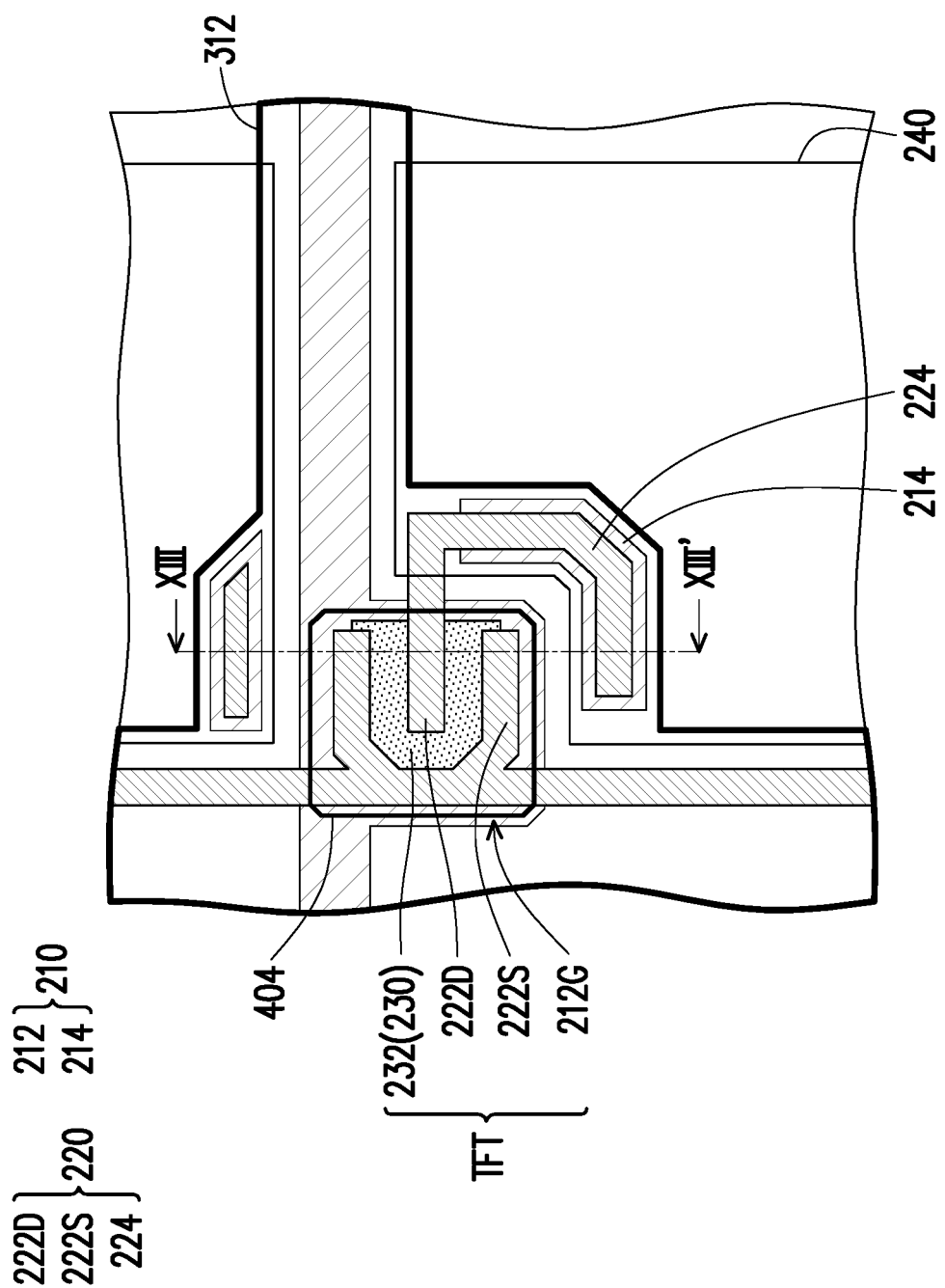
FIG. 14A is a partial top schematic view of a display panel according to an embodiment of the present invention.
Figure 14B:
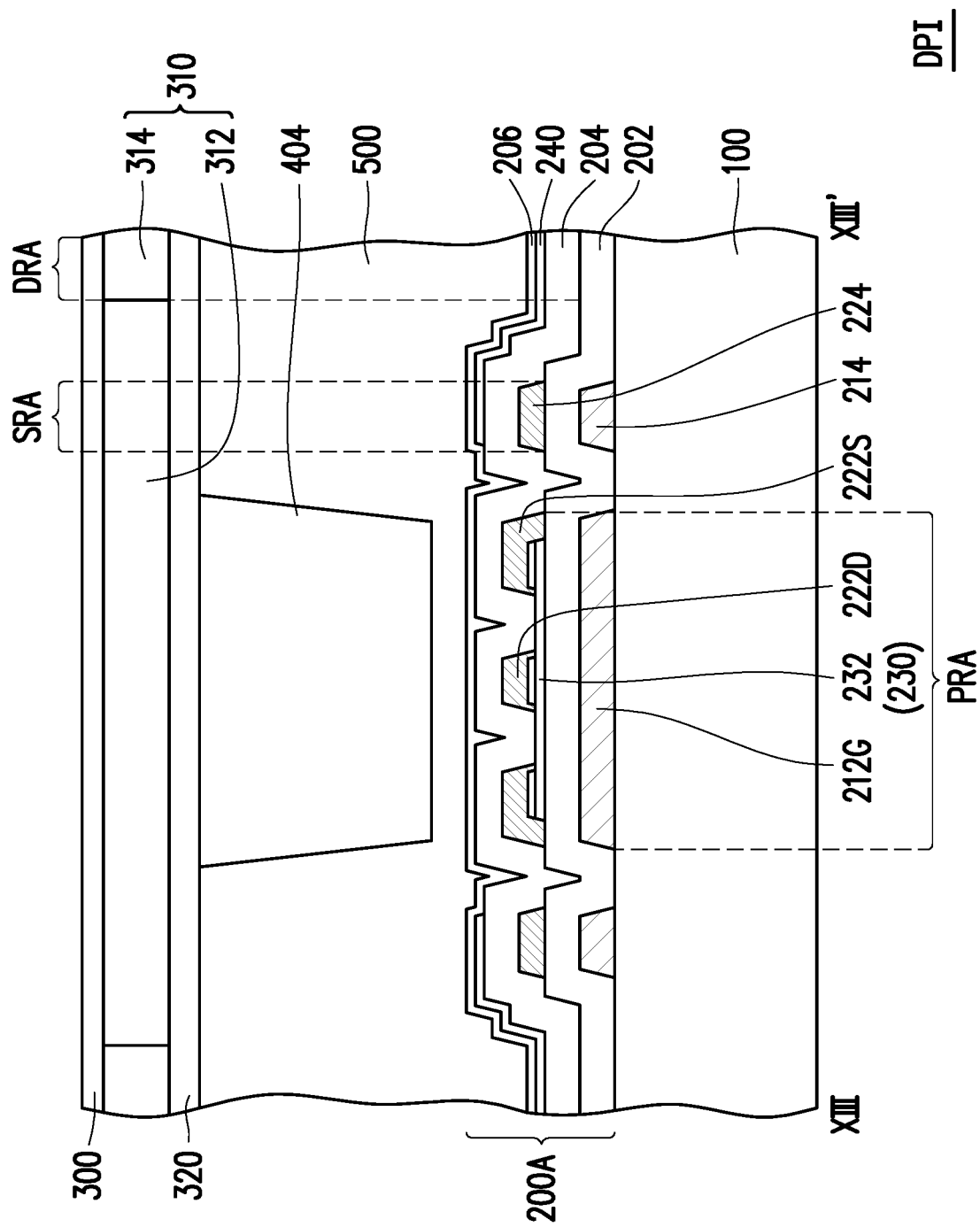
FIG. 14B is a cross-sectional schematic view taken along line XIII-XIII' of FIG. 14A.

FIG. 14A is a partial top schematic view of a display panel according to an embodiment of the present invention, and FIG. 14B is a cross-sectional schematic view taken along line XIII-XIII' of FIG. 14A. The display panel DPI of FIG. 14A and FIG. 14B is similar to the display panel DPA of FIG. 6A and FIG. 6B. Referring to FIG. 14A and FIG. 14B, the display panel DPI includes a first substrate 100, a pixel array structure 200A, a second substrate 300, a color filter array 310 including a black matrix 312 and a color filter pattern 314, a counter electrode 320, a spacer 404 and a display medium layer 500.

The pixel array structure 200A includes a first insulating layer 202, a second insulating layer 204, an alignment layer 206, a first metal layer 210, a second metal layer 220, a semiconductor layer 230 and a first electrode 240. The first metal layer 210 includes a first signal line 212 and a first support pattern 214, and the first signal line 212 overlaps the channel pattern 232 of the semiconductor layer 230 and includes a first platform pattern as the gate 212G. The second metal layer 220 includes a second platform pattern as the source 222S and the drain 222D, and a second support pattern 224. The gate 212G, the channel pattern 232, the source 222S and the drain 222D form an active component TFT together.

The pixel array structure 200A has a platform region PRA, a support region SRA and a display region DRA. Specifically, the display panel DPI is different from the display panel DPA in that the spacer 404 is not in contact with the pixel array structure 200A, and the display panel DPI can be used as an implementation for the location of the second spacer 40B of the display panel DP of FIG. 1.

Figure 15A:
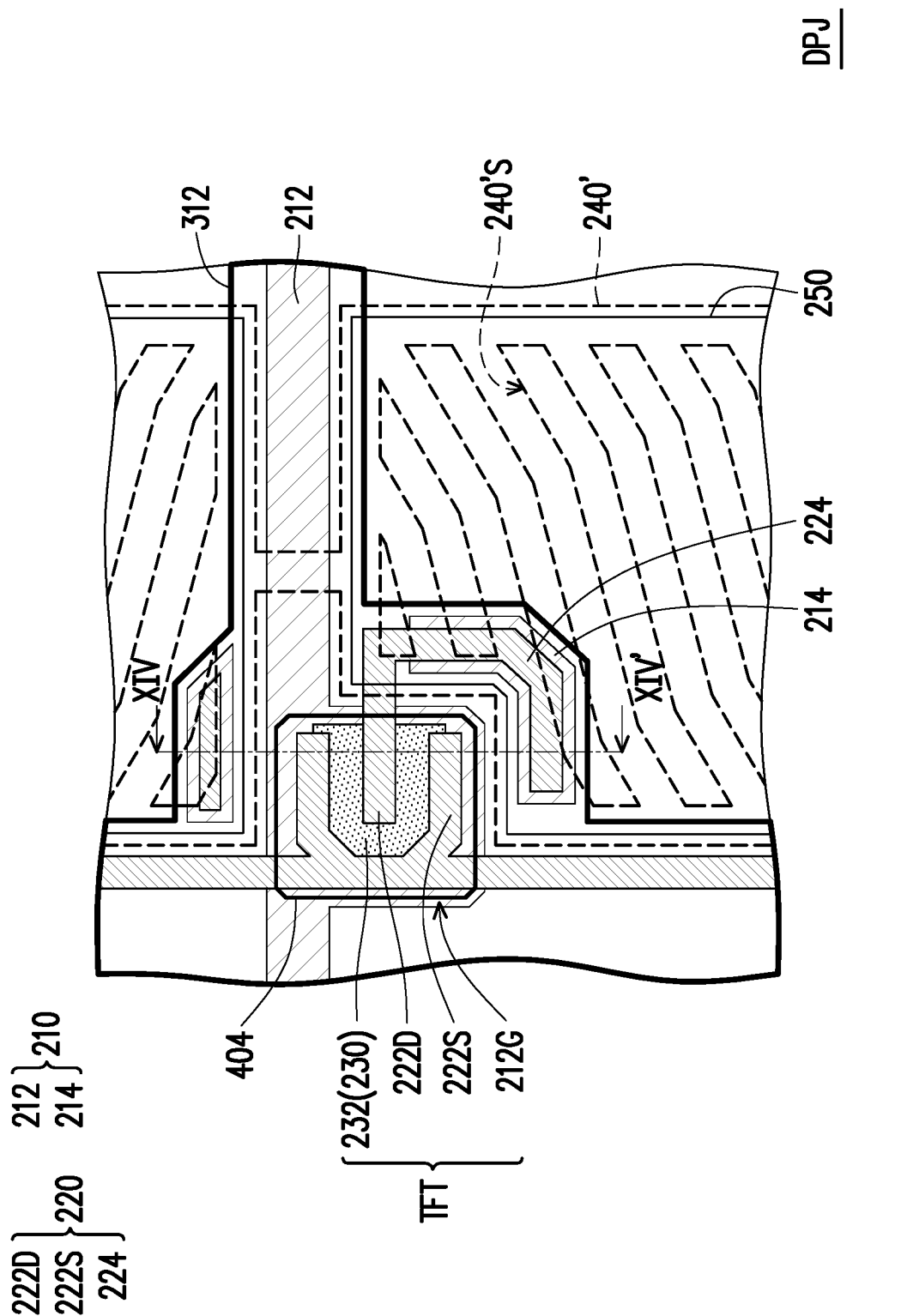
FIG. 15A is a partial top schematic view of a display panel according to an embodiment of the present invention.
Figure 15B:
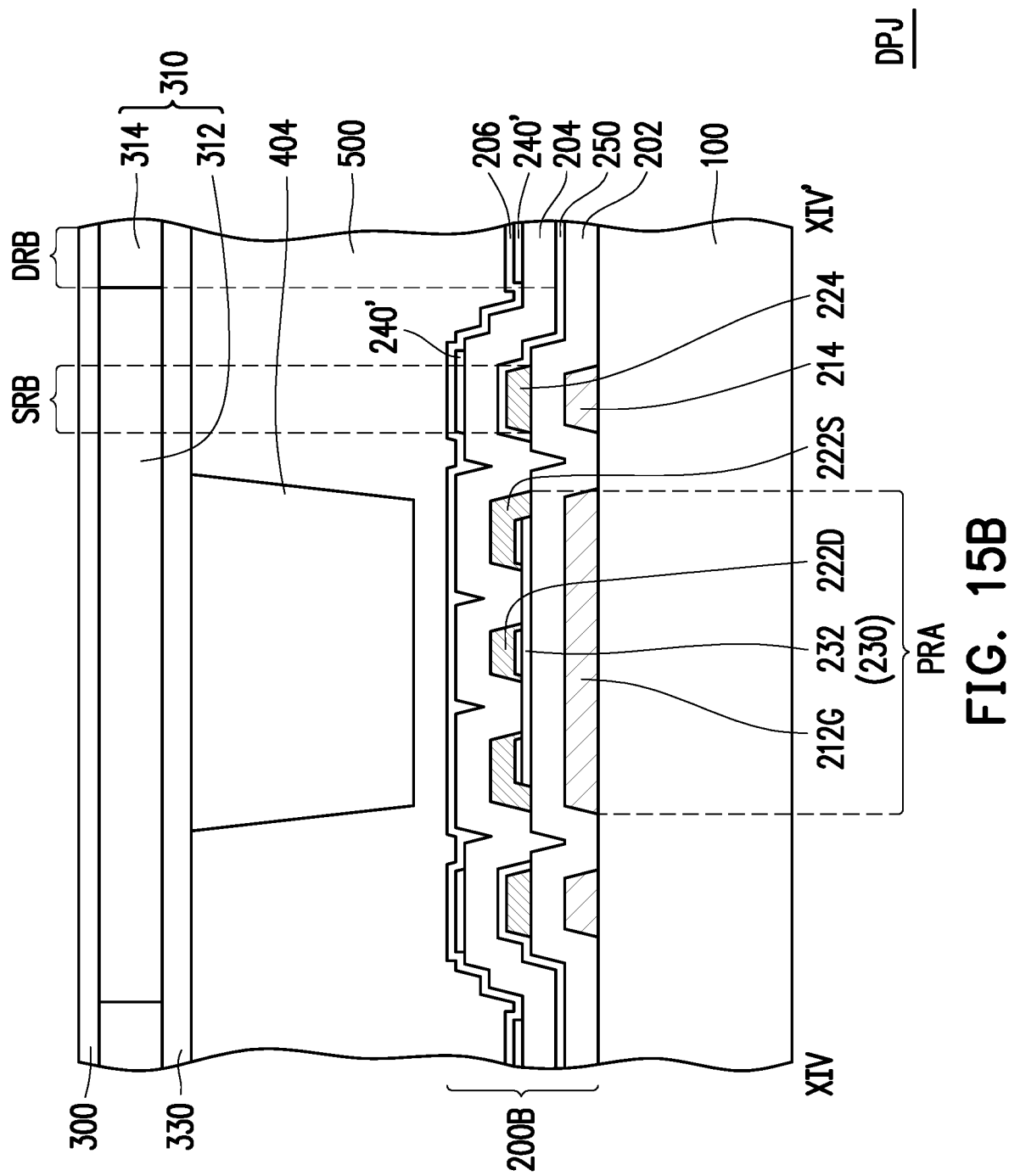
FIG. 15B is a cross-sectional schematic view taken along line XIV-XIV' of FIG. 15A.

FIG. 15A is a partial top schematic view of a display panel according to an embodiment of the present invention, and FIG. 15B is a cross-sectional schematic view taken along line XIV-XIV' of FIG. 15A. The display panel DPJ of FIG. 15A and FIG. 15B is similar to the display panel DPB of FIG. 7A and FIG. 7B. Referring to FIG. 14A and FIG. 14B, the display panel DPJ includes a first substrate 100, a pixel array structure 200B, a second substrate 300, a color filter array 310 including a black matrix 312 and a color filter pattern 314, a planarization layer 330, a spacer 404 and a display medium layer 500. The spacer 404 is disposed on the planarization layer 330.

The pixel array structure 200B includes a first insulating layer 202, a second insulating layer 204, an alignment layer 206, a first metal layer 210, a second metal layer 220, a semiconductor layer 230, a first electrode 240' and a second electrode 250. The first metal layer 210 includes a first signal line 212 and a first support pattern 214, and the first signal line 212 overlaps the channel pattern 232 of the semiconductor layer 230 and includes a first platform pattern as the gate 212G. The second metal layer 220 includes a second platform pattern as the source 222S and the drain 222D, and a second support pattern 224. The gate 212G, the channel pattern 232, the source 222S and the drain 222D form an active component TFT together.

The pixel array structure 200B has a platform region PRA, a support region SRB and a display region DRB. For the platform region PRA, the support region SRB and the display region DRB, reference can be made to the description of the foregoing embodiment. The first electrode 240' and the second electrode 250 are disposed in the support region SRB and the display region DRB of the pixel array structure 200B, and the first electrode 240' may have a plurality of slits 240'S. Specifically, the display panel DPJ is different from the display panel DPB in that the spacer 404 is not in contact with the pixel array structure 200B, and can be used as an implementation for the location of the second spacer 40B of the display panel DP of FIG. 1.

Figure 16A:
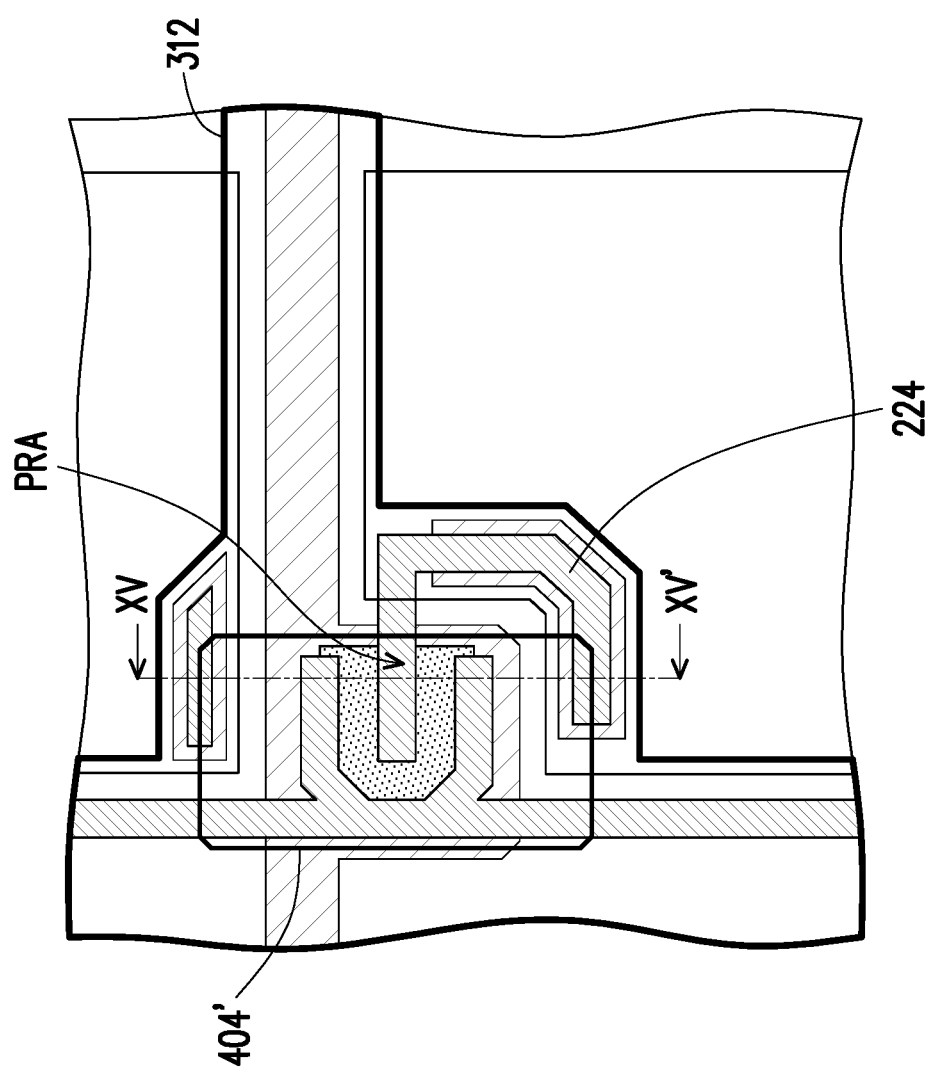
FIG. 16A is a partial top schematic view of a display panel according to an embodiment of the present invention.
Figure 16B:
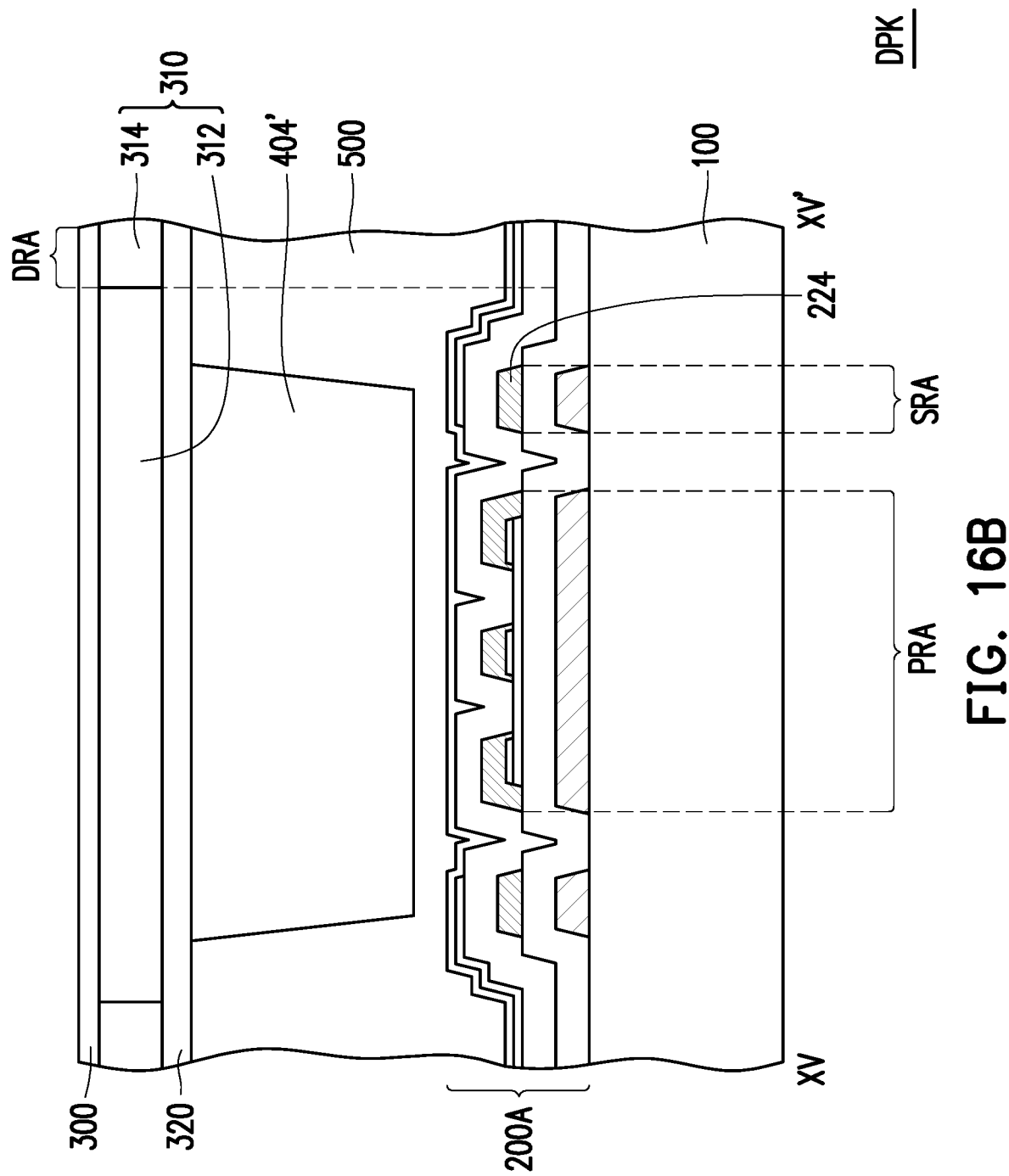
FIG. 16B is a cross-sectional schematic view taken along line XV-XV' of FIG. 16A.

FIG. 16A is a partial top schematic view of a display panel according to an embodiment of the present invention, and FIG. 16B is a cross-sectional schematic view taken along line XV-XV' of FIG. 16A. The display panel DPK of FIG. 16A and FIG. 16B is similar to the display panel DPI of FIG. 14A and FIG. 14B, and can be used as an implementation for the location of the first spacer 40B of the display panel DP of FIG. 1. Referring to FIG. 16A and FIG. 16B, the display panel DPK includes a first substrate 100, a pixel array structure 200A, a second substrate 300, a color filter array 310 including a black matrix 312 and a color filter pattern 314, a counter electrode 320, a spacer 404' and a display medium layer 500. Specifically, the display panel DPK is different from the display panel DPI in that the orthographic projection area of the spacer 404' on the first substrate 100 not only overlaps the orthographic projection area of the platform region PRA on the first substrate 100, but also overlaps the orthographic projection area of the support region SRA on the first substrate 100. Specifically, the orthographic projection area of the spacer 404' on the first substrate 100 overlaps the orthographic projection area of the second support pattern 224 for defining the support region SRA on the first substrate 100 in the pixel array structure 200A.

Figure 17A:
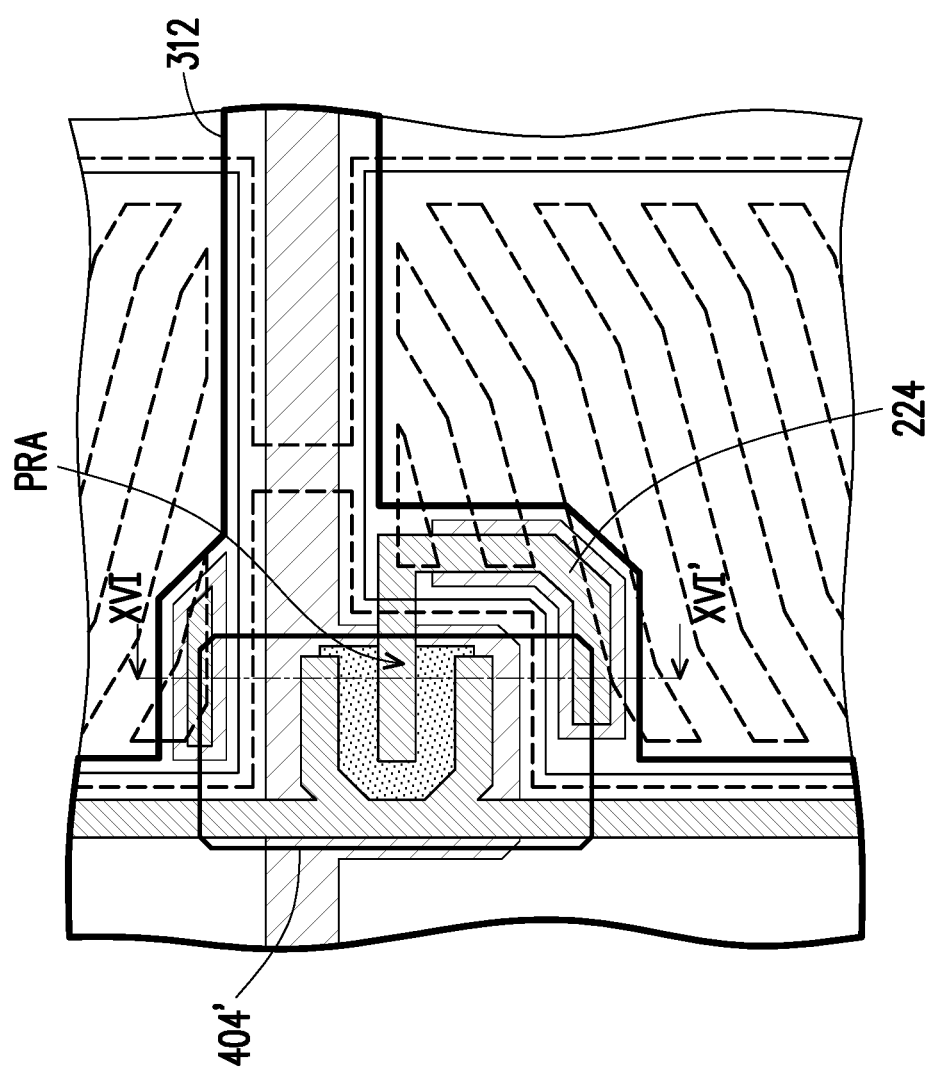
FIG. 17A is a partial top schematic view of a display panel according to an embodiment of the present invention.
Figure 17B:
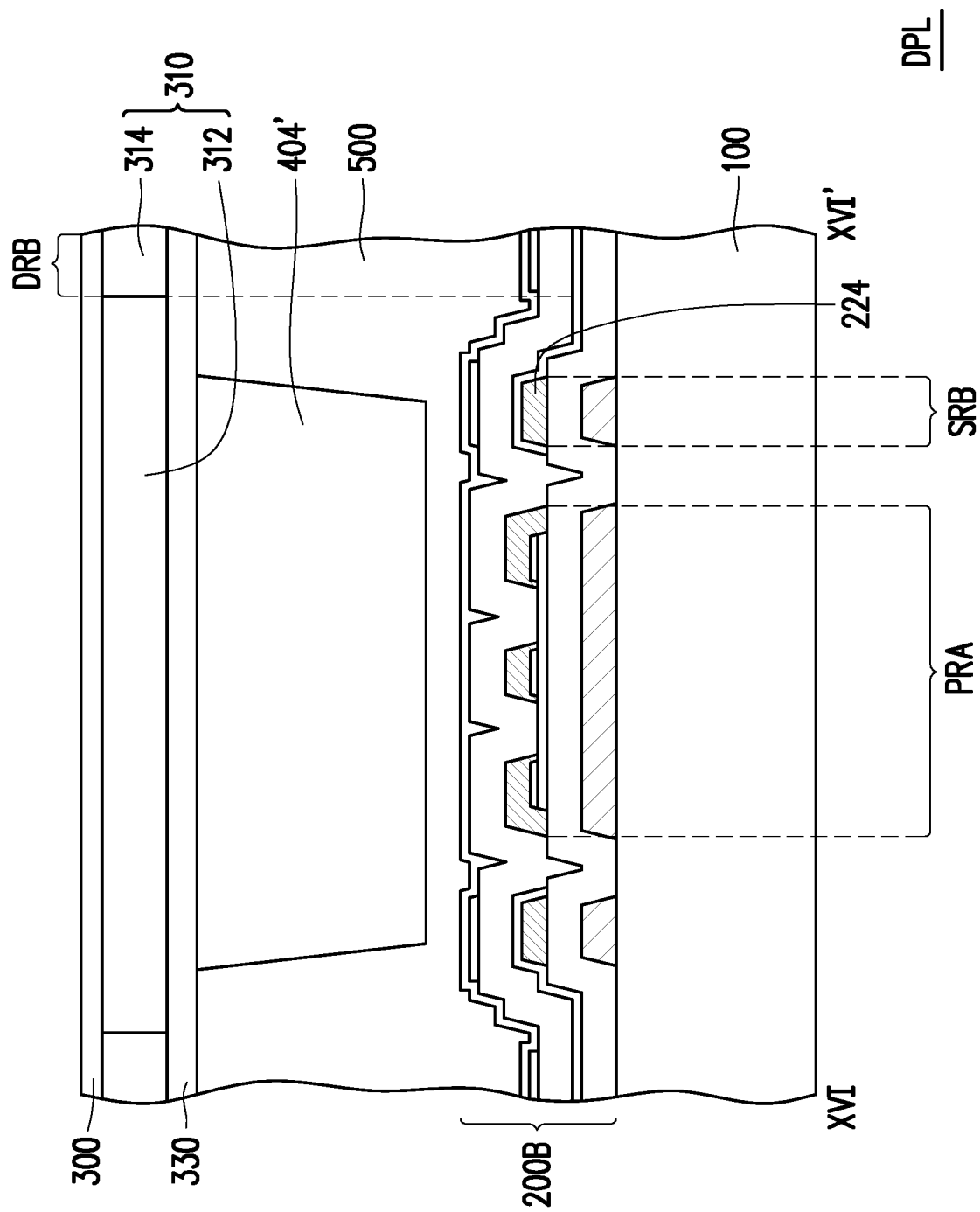
FIG. 17B is a cross-sectional schematic view taken along line XVI-XVI' of FIG. 17A.

FIG. 17A is a partial top schematic view of a display panel according to an embodiment of the present invention, and FIG. 17B is a cross-sectional schematic view taken along line XVI-XVI' of FIG. 17A. The display panel DPL of FIG. 17A and FIG. 17B is similar to the display panel DPJ of FIG. 15A and FIG. 15B, and can be used as an implementation for the location of the first spacer 40B of the display panel DP of FIG. 1. Referring to FIG. 17A and FIG. 17B, the display panel DPL includes a first substrate 100, a pixel array structure 200B, a second substrate 300, a color filter array 310 including a black matrix 312 and a color filter pattern 314, a planarization layer 330, a spacer 404' and a display medium layer 500. The spacer 404' is disposed on the planarization layer 330. Specifically, the pixel array structure 200B has a platform region PRA, a s support region SRB and a display region DRB. The display panel DPL is different from the display panel DPJ in that the orthographic projection area of the spacer 404' on the first substrate 100 not only overlaps the orthographic projection area of the platform region PRA on the first substrate 100, but also overlaps the orthographic projection area of the support region SRB on the first substrate 100. Specifically, the orthographic projection area of the spacer 404' on the first substrate 100 overlaps the orthographic projection area of the second support pattern 224 for defining the support region SRB on the first substrate 100 in the pixel array structure 200B.

Figure 18A:
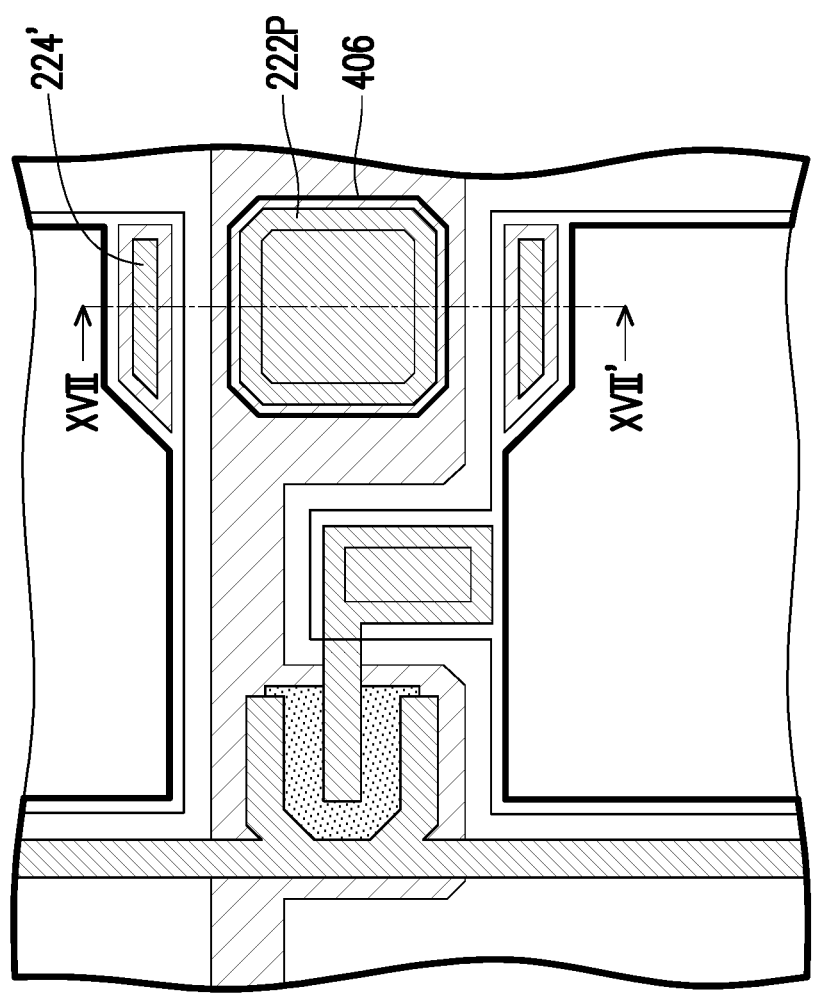
FIG. 18A is a partial top schematic view of a display panel according to an embodiment of the present invention.
Figure 18B:
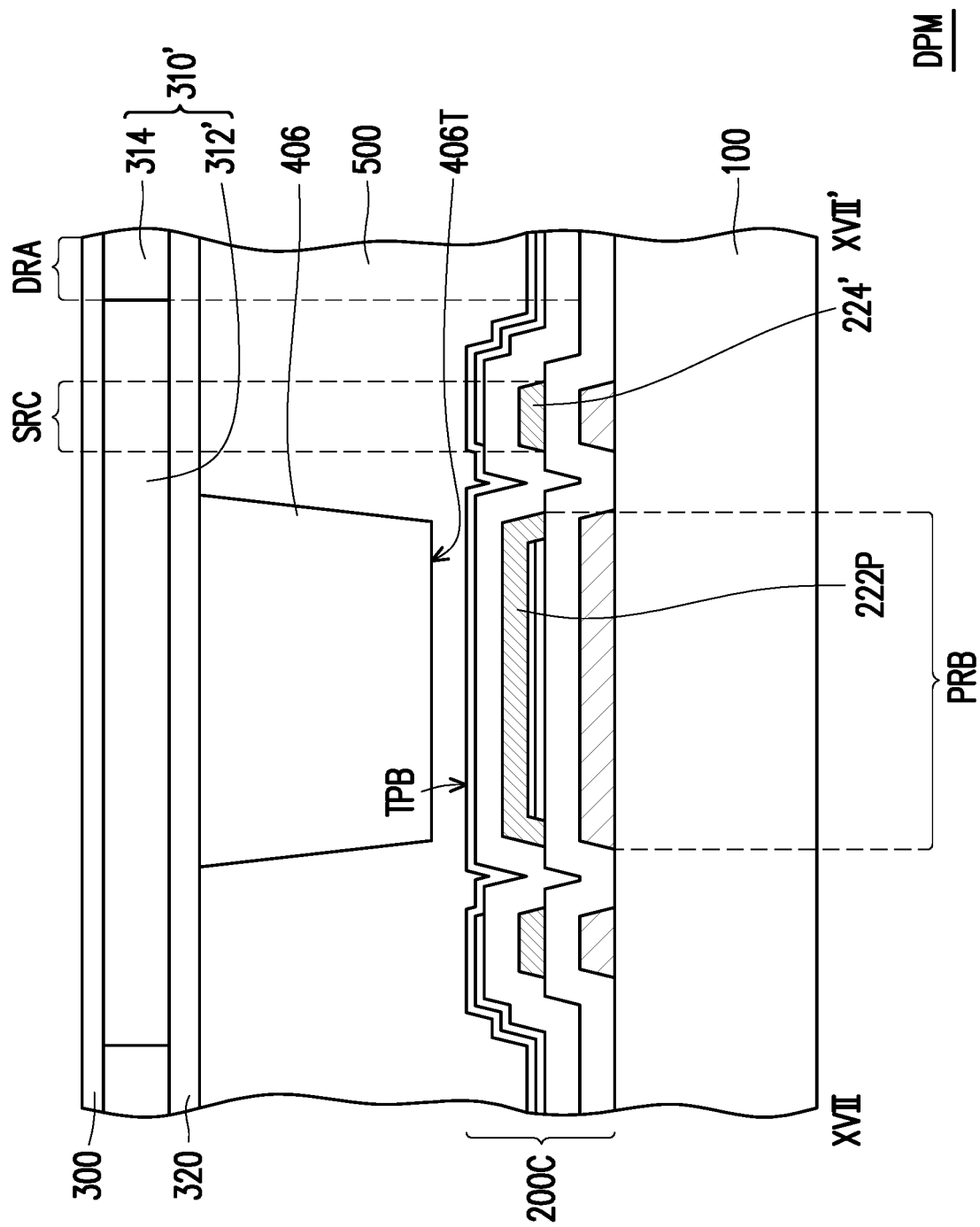
FIG. 18B is a cross-sectional schematic view taken along line XVII-XVII' of FIG. 18A.

FIG. 18A is a partial top schematic view of a display panel according to an embodiment of the present invention, and FIG. 18B is a cross-sectional schematic view taken along line XVII-XVII' of FIG. 18A. The display panel DPM of FIG. 18A and FIG. 18B is similar to the display panel DPE of FIG. 10A and FIG. 10B. Referring to FIG. 18A and FIG. 18B, the display panel DPM includes a first substrate 100, a pixel array structure 200C, a second substrate 300, a color filter array 310' including a black matrix 312' and a color filter pattern 314, a counter electrode 320, a spacer 406 and a display medium layer 500. The pixel array structure 200C has a platform region PRB and a support region SRC according to the stack structure, and a region of the pixel array structure 200C that is not shielded by the black matrix is the display region DRA. Specifically, the display panel DPM is different from the display panel DPE in that the spacer 406 is not in contact with the pixel array structure 200C, and the display panel DPM can be used as an implementation for the location of the second spacer 40B of the display panel DP of FIG. 1. The orthographic projection area of the spacer 406 on the first substrate 100 overlaps the orthographic projection area of the second platform pattern 222P defining the platform region PRB on the first substrate 100. However, a terminal surface 406T of the spacer 406 and the platform top surface TPB of the pixel array structure 200C in the platform region PRB are spaced by a distance without contact. In other embodiments, the width of the spacer 406 may be increased according to the design requirements such that the orthographic projection area of the spacer 406 on the first substrate 100 also overlaps the orthographic projection area of the second support pattern 224' defining the support region SRC on the first substrate 100.

Figure 19A:
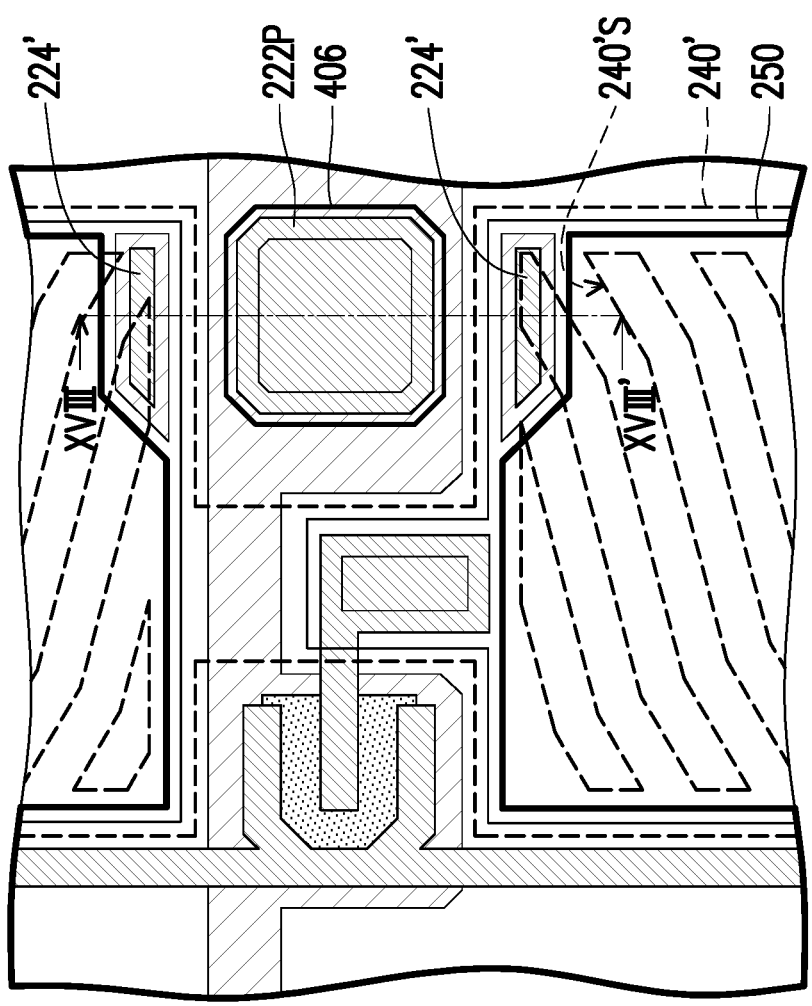
FIG. 19A is a partial top schematic view of a display panel according to an embodiment of the present invention.
Figure 19B:
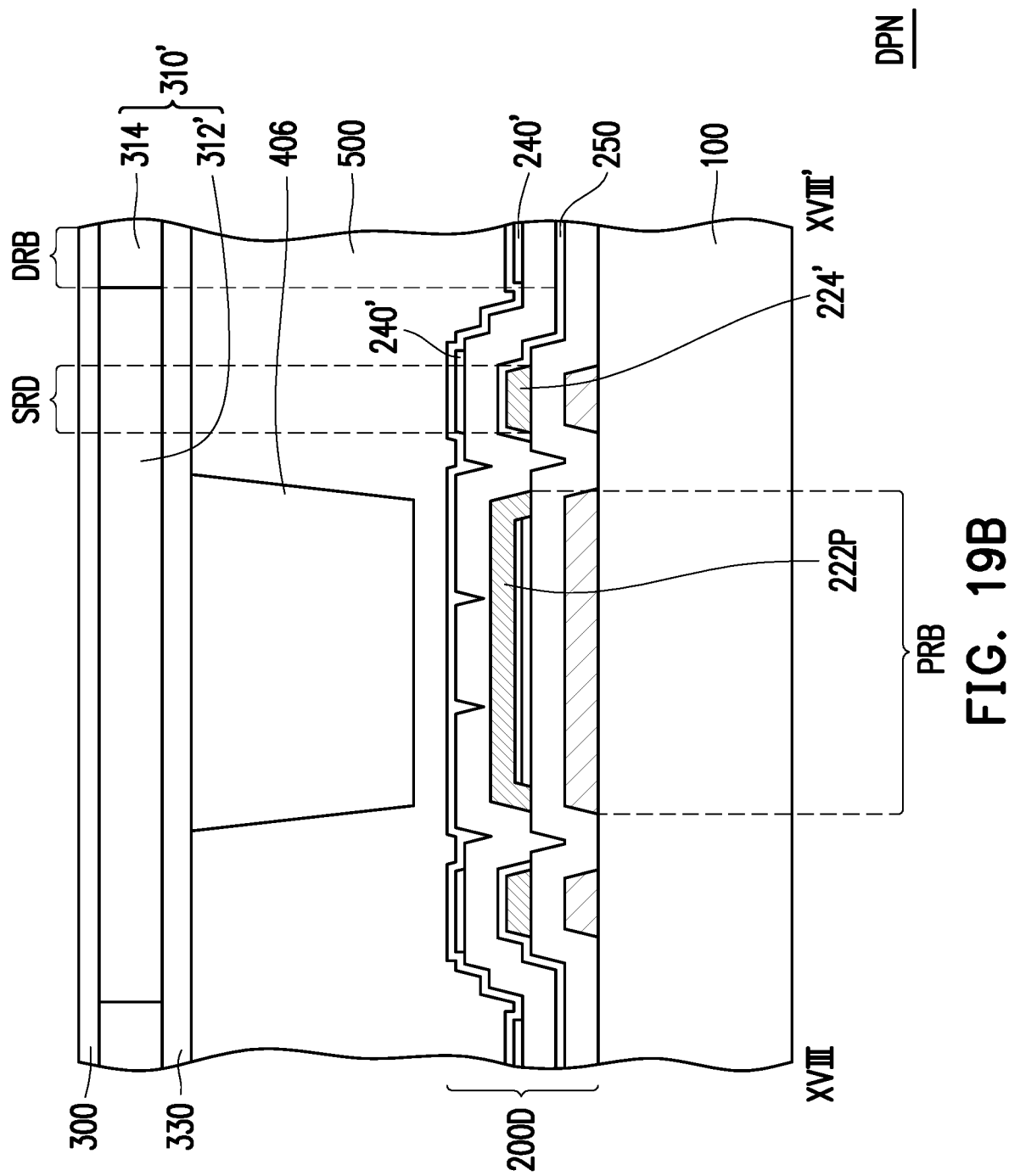
FIG. 19B is a cross-sectional schematic view taken along line XVIII-XVIII' of FIG. 19A.

FIG. 19A is a partial top schematic view of a display panel according to an embodiment of the present invention, and FIG. 19B is a cross-sectional schematic view taken along line XVIII-XVIII' of FIG. 19A. The display panel DPN of FIG. 19A and FIG. 19B is similar to the display panel DPM of FIG. 18A and FIG. 18B, and can be used as an implementation for the location of the first spacer 40B of the display panel DP of FIG. 1. Referring to FIG. 19A and FIG. 19B, the display panel DPN includes a first substrate 100, a pixel array structure 200D, a second substrate 300, a color filter array 310' including a black matrix 312' and a color filter pattern 314, a planarization layer 330, a spacer 406 and a display medium layer 500. Specifically, the display panel DPN is different from the display panel DPM in that the display panel DPN does not have the counter electrode 320, but the second substrate 300 is provided with the planarization layer 330. The material of the planarization layer 330 may include a transparent insulating material, and the spacer 406 is disposed on the planarization layer 330. Further, in the display panel DPN, the pixel array structure 200D of FIG. 5A and FIG. 5B replaces the pixel array structure 200C in the display panel DPM.

The pixel array structure 200D has a platform region PRB, a support region SRD and a display region DRB. For the specific structure of the first substrate 100 and the pixel array structure 200D, reference can be made to the related description of FIG. 5A and FIG. 5B. Meanwhile, for the second substrate 300, the color filter array 310', the counter electrode 320 and the display medium layer 500, reference can be made to the related description of FIG. 10A and FIG. 10B, and for the spacer 406, reference can be made to the related description of FIG. 18A and FIG. 18B. Specifically, the pixel array structure 200D of the display panel DPN further includes a second electrode 250 in the support region SRD and the display region DRB, and the first electrode 240' may have a plurality of slits 240'S. In the present embodiment and the embodiment of FIG. 18A and FIG. 18B, the orthographic projection area of the spacer 406 on the first substrate 100 substantially corresponds to the orthographic projection area of the second platform pattern 222P defining the platform region PRB on the first substrate 100. However, in other embodiments, the width of the spacer 406 may be increased according to the design requirements such that the orthographic projection area of the spacer 406 on the first substrate 100 also overlaps the orthographic projection area of the second support pattern 224' defining the support region SRD on the first substrate 100.

Figure 20A:
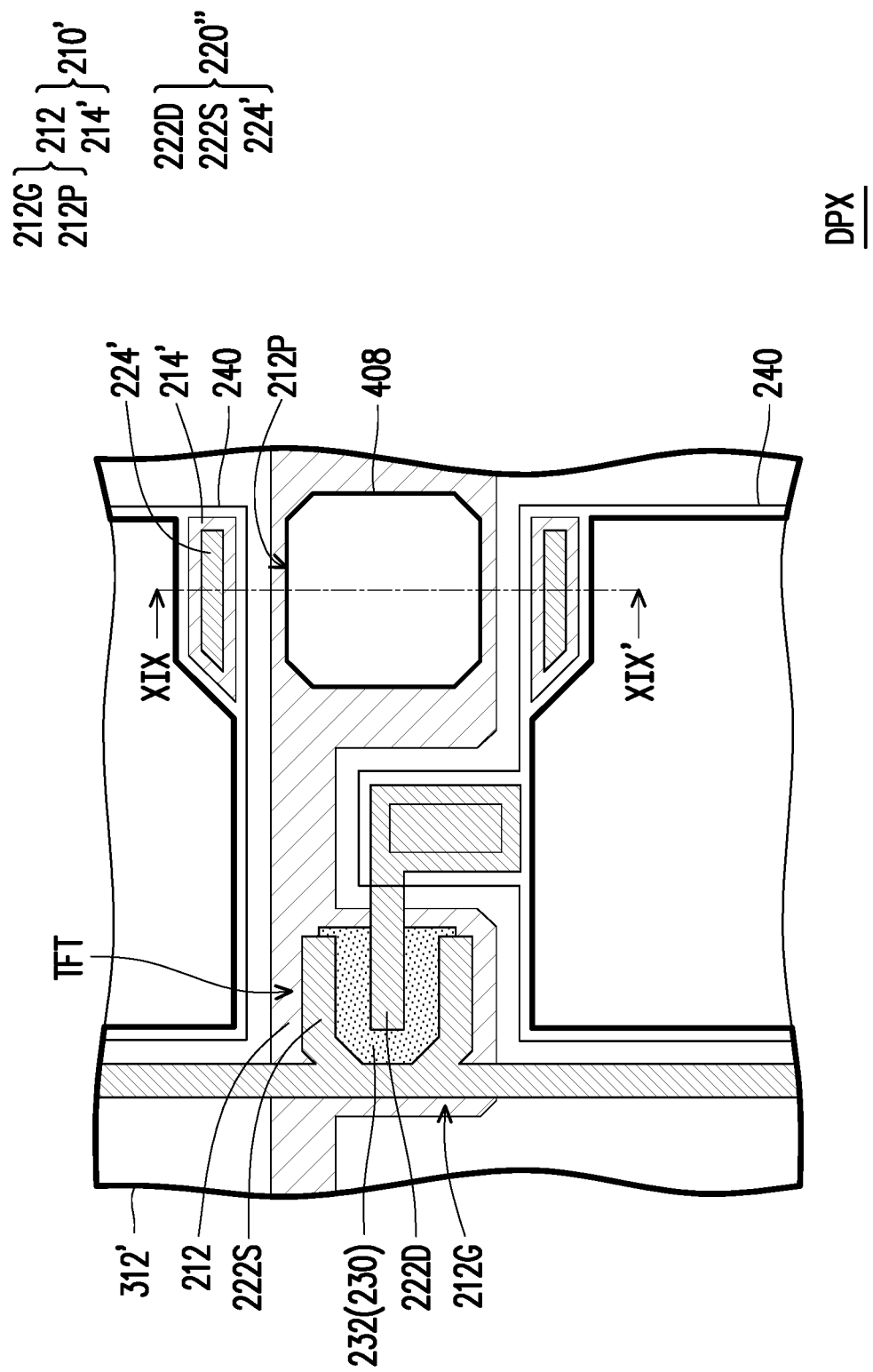
FIG. 20A is a partial top schematic view of a display panel according to an embodiment of the present invention.
Figure 20B:
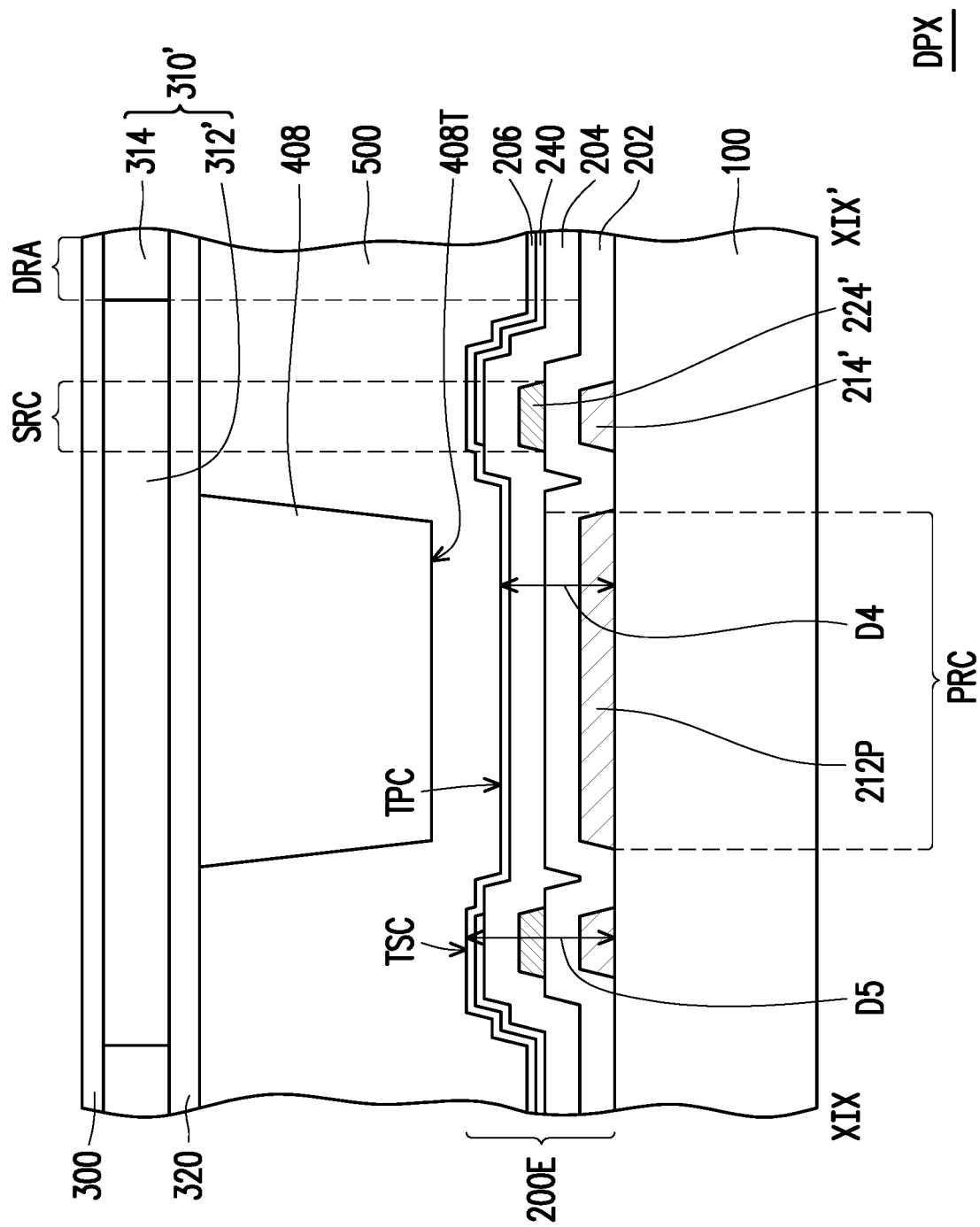
FIG. 20B is a cross-sectional schematic view taken along line XIX-XIX' of FIG. 20A.

FIG. 20A is a partial top schematic view of a display panel according to an embodiment of the present invention, and FIG. 20B is a cross-sectional schematic view taken along line XIX-XIX' of FIG. 20A. The display panel DPX of FIG. 20A and FIG. 20B includes a first substrate 100, a pixel array structure 200E, a second substrate 300, a color filter array 310' including a black matrix 312' and a color filter pattern 314, a counter electrode 320, a spacer 408 and a display medium layer 500. For the second substrate 300, the color filter array 310', the counter electrode 320 and the display medium layer 500, reference can be made to the related description of FIG. 10A and FIG. 10B, and the descriptions thereof are omitted herein. In the display panel DPX, the pixel array structure 200E has a platform region PRC, a support region SRA and a display region DRA. For the relationship of the support region SRA and the display region DRA to other components, reference can be made to the related description of FIG. 4A and FIG. 4B.

Specifically, the pixel array structure 200E includes a first insulating layer 202, a second insulating layer 204, an alignment layer 206, a first metal layer 210', a second metal layer 220", a semiconductor layer 230 and a first electrode 240. The first metal layer 210', the semiconductor layer 230, the second metal layer 220" and the first electrode 240 are sequentially stacked on the first substrate 100. The first insulating layer 202 is disposed between the first metal layer 210' and the second metal layer 220", and the second insulating layer 204 is disposed between the second metal layer 220" and the first electrode 240. The alignment layer 206 covers the first electrode 240. Although the semiconductor layer 230 is not shown in FIG. 20B, the semiconductor layer 230 may be disposed between the first insulating layer 202 and the second metal layer 220".

The first metal layer 210' includes a first signal line 212 and a first support pattern 214'. A portion of the first signal line 212 forms the gate 212G and the other portion forms the first platform pattern 212P. The second metal layer 220" includes a source 222S, a drain 222D and a second support pattern 224'. The semiconductor layer 230 includes a channel pattern 232. In the present embodiment, the gate 212G, the channel pattern 232, the source 222S and the drain 222D form an active component TFT together, and for the specific disposition manner of the active component TFT, reference can be made to the foregoing related description of FIG. 2A and FIG. 2B.

In the present embodiment, the orthographic projection area of the first platform pattern 212P of the first signal line 212 on the first substrate 100 overlaps the orthographic projection area of the spacer 408 on the first substrate 100 to define the platform region PRC. Specifically, the first platform pattern 212P may be defined as a portion of the orthographic projection area of the first signal line 212 on the first substrate 100 overlapping the orthographic projection area of the spacer 408 on the first substrate 100. The first support pattern 214' is located on the periphery of the first platform pattern 212P, and the orthographic projection area of the second support pattern 224' on the first substrate 100 overlaps the orthographic projection area of the first support pattern 214' on the first substrate 100 to define the support region SRC. The display region DRA is defined by the black matrix 312', and the support region SRC is located between the display region DRA and the platform region PRC. The second metal layer 220" may be not present in both the support region SRC and the display region DRA.

Here, the second metal layer 220" is not present in the display region DRA, and is located completely outside the platform region PRC. In other words, the orthographic projection area of the second metal layer 220" on the first substrate 100 is located completely outside the orthographic projection area of the spacer 408 on the first substrate 100. Thus, a platform top surface TPC of the pixel array structure 200E in the platform region PRC and the first substrate 100 may be spaced by a fourth distance D4, a support top surface TSC of the support region SRC of the pixel array structure 200E and the first substrate 100 are spaced by a fifth distance D5, and the fourth distance D4 is less than the fifth distance D5. Thus, even if a terminal surface 408T of the spacer 408 is at the same height as the support top surface TSC, the spacer 408 is still not in contact with the pixel array structure 200E. In some embodiments, the distance from the terminal surface 408T of the spacer 408 to the first substrate 100 is not less than the distance from the support top surface of the support region SRC of the pixel array structure 200E to the first substrate 100. In addition, when the display panel DPX is applied to the display panel DP of FIG. 1 to implement the disposition manner of the second spacer 40B, the second spacer 40B may have the same height as the first spacer 40A, which helps to simplify the manufacturing process of the display panel DP.

Figure 21A:
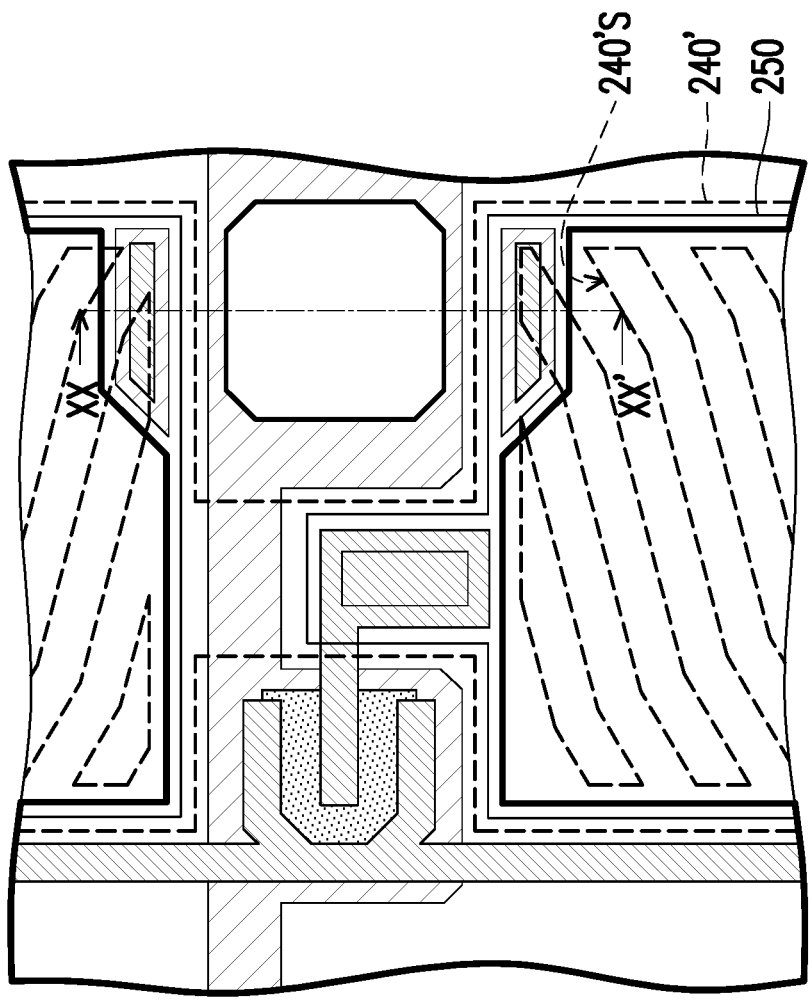
FIG. 21A is a partial top schematic view of a display panel according to an embodiment of the present invention.
Figure 21B:
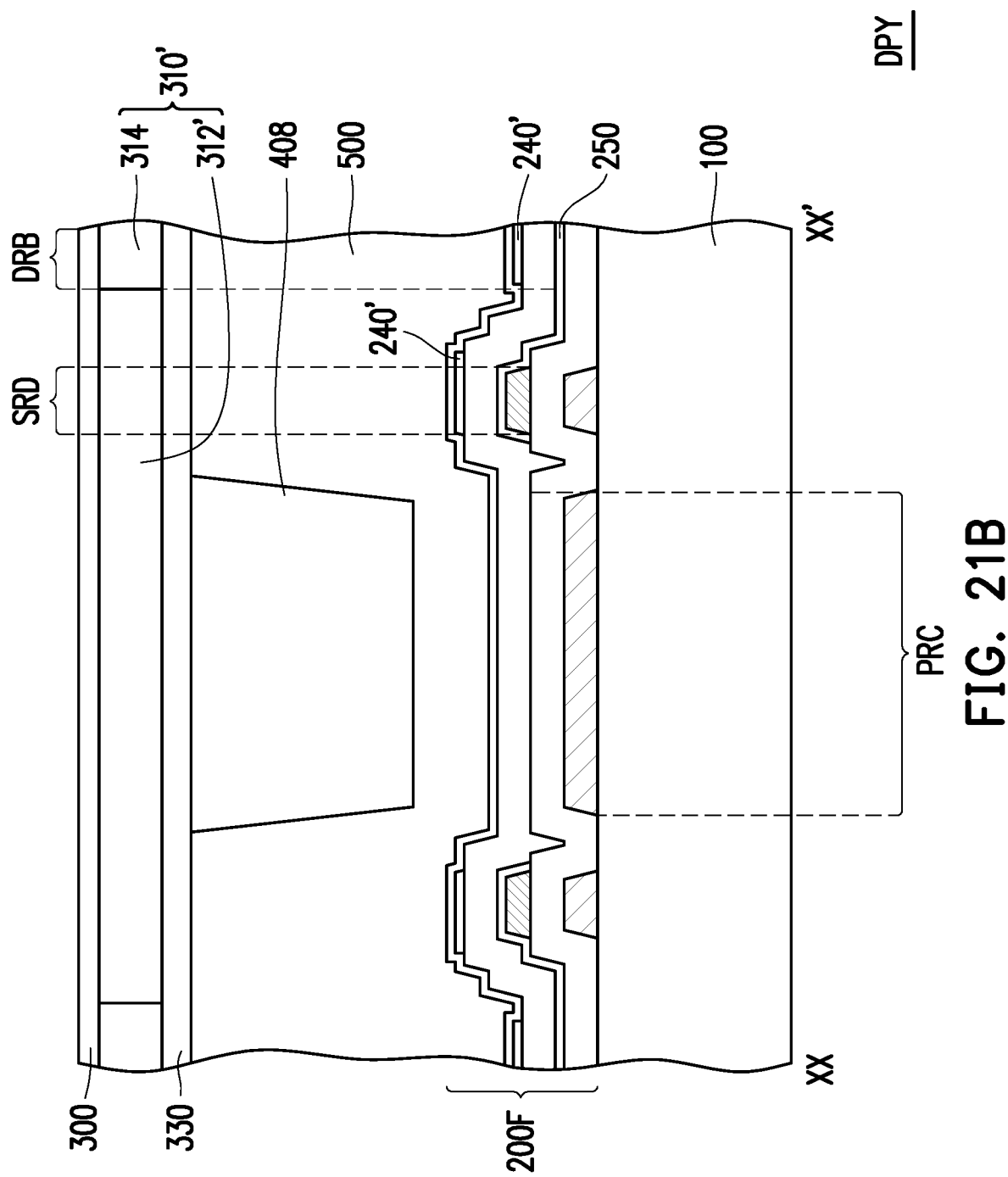
FIG. 21B is a cross-sectional schematic view taken along line XX-XX' of FIG. 21A.

FIG. 21A is a partial top schematic view of a display panel according to an embodiment of the present invention, and FIG. 21B is a cross-sectional schematic view taken along line XX-XX' of FIG. 21A. The display panel DPY of FIG. 21A and FIG. 21B is similar to the display panel DPX of FIG. 20A and FIG. 20B, and can be used as an implementation for the location of the first spacer 40B of the display panel DP of FIG. 1. Referring to FIG. 21A and FIG. 21B, the display panel DPY includes a first substrate 100, a pixel array structure 200F, a second substrate 300, a color filter array 310' including a black matrix' 312 and a color filter pattern 314, a planarization layer 330, a spacer 408 and a display medium layer 500. The spacer 408 is disposed on the planarization layer 330. For the first substrate 100, the second substrate 300, the color filter array 310', the counter electrode 320, the spacer 408 and the display medium layer 500, reference can be made to the related description of FIG. 20A and FIG. 20B, and the descriptions thereof are omitted herein. Specifically, the display panel DPY is different from the display panel DPX in that the pixel array structure 200F has a platform region PRC, a support region SRD and a display region DRB. For the relationship of the platform region PRC to other components, reference can be made to the embodiment of FIG. 20A and FIG. 20B. The support region SRD and the display region DRB are different from those in the embodiment of FIG. 20A and FIG. 20B in that the pixel array structure 200F of the display panel DPY further includes the second electrode 250 in the support region SRD and the display region DRB, and the first electrode 240' may have a plurality of slits 240'S.

According to the foregoing embodiments, any of the pixel array structures 200A, 200B, 200C and 200D can be applied to the pixel array structure 20 corresponding to the first spacer 40A in the display panel DP of FIG. 1, and any of the pixel array structures 200A, 200B, 200C, 200D, 200E and 200F can be applied to the pixel array structure 20 corresponding to the second spacer 40B in the display panel DP of FIG. 1. Specifically, the structure corresponding to the first spacer 40A in the display panel DP of FIG. 1 can be implemented by the display panel DPA, DPB, DPC, DPD, DPE, DPF, DPG, DPH or a substitute thereof, and the structure corresponding to the second spacer 40B in the display panel DP of FIG. 1 can be implemented by the display panel DPI, DPJ, DPK, DPL, DPM, DPN, DPX, DPY or a substitute thereof. When the structure corresponding to the first spacer 40A in the display panel DP of FIG. 1 can be implemented by the display panel DPA, DPC, DPE, DPG or a substitute thereof, the structure corresponding to the second spacer 40B in the display panel DP of FIG. 1 can be implemented by the display panel DPI, DPK, DPM, DPX or a substitute thereof. When the structure corresponding to the first spacer 40A in the display panel DP of FIG. 1 can be implemented by the display panel DPB, DPD, DPF, DPH or a substitute thereof, the structure corresponding to the second spacer 40B in the display panel DP of FIG. 1 can be implemented by the display panel DPJ, DPL, DPN, DPY or a substitute thereof.

Based on the above, in the display panel of the embodiments of the present invention, a plurality of film layers of the pixel array structure are stacked to form the platform region corresponding to the spacer and the support region located on the periphery the platform region, and the top surface of the pixel array structure in the display region is made lower than the top surface in the support region. Thus, when the spacer is displaced, it cannot easily contact the top surface of the pixel array structure in the display region, which helps to avoid damage to the top surface of the pixel array structure in the display region such that the display panel has ideal quality.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A display panel, comprising:
    a first substrate;
    a second substrate;
    a display medium layer, disposed between the first substrate and the second substrate;
    a pixel array structure, disposed on the first substrate, wherein the pixel array structure comprises a first metal layer and a second metal layer, the first metal layer is located between the first substrate and the second metal layer, and the first metal layer comprises a first signal line and a first support pattern laterally spaced away from the first signal line and formed of a same layer as the first signal line; and the pixel array structure comprises a first platform region, a first display region and a first support region, the first platform region is located on the first signal line, the first support region is located between the first platform region and the first display region, a first platform top surface of the first platform region of the pixel array structure and the first substrate are spaced by a first distance, a first support top surface of the first support region of the pixel array structure and the first substrate are spaced by a second distance, a display top surface of the first display region of the pixel array structure and the first substrate are spaced by a third distance, the third distance is smaller than the first distance as well as the second distance, the second distance is not greater than the first distance, and a difference between the first distance and the second distance is from 0 micron to 0.3 micron; and
    a first spacer, disposed on the second substrate and protruding toward the first substrate, wherein a terminal surface of the first spacer is in contact with the first platform top surface.

2. The display panel according to claim 1, wherein the pixel array structure further comprises a semiconductor layer, a portion of the first signal line forms a first platform pattern, the second metal layer comprises a second platform pattern and a second support pattern, the semiconductor layer comprises a semiconductor pattern located between the second platform pattern and the first signal line, an orthographic projection area of the second platform pattern on the first substrate and an orthographic projection area of the semiconductor pattern on the first substrate overlap an orthographic projection area of the first platform pattern on the first substrate to define the first platform region, and an orthographic projection area of the second support pattern on the first substrate overlaps an orthographic projection area of the first support pattern on the first substrate to define the first support region.

3. The display panel according to claim 2, wherein the first platform portion is a gate, the second platform pattern comprises a source and a drain, the source and the drain are separated from each other, and the source and the drain are in contact with the semiconductor pattern.

4. The display panel according to claim 2, wherein the first metal layer further comprises a gate connected to the first signal line, the second metal layer further comprises a source and a drain, the semiconductor layer further comprises a channel pattern, the source and the drain are separated from each other, the source and the drain are in contact with the channel pattern, the channel pattern is stacked above the gate, and the gate is different from the first platform pattern for defining the first platform region of the first signal line.

5. The display panel according to claim 2, wherein the pixel array structure further comprises a first insulating layer, a second insulating layer and an alignment layer, the first insulating layer is disposed between the first metal layer and the second metal layer, and the second insulating layer covers the second metal layer and is located between the second metal layer and the alignment layer, wherein the terminal surface of the first spacer is contact with the alignment layer located in the first platform region.

6. The display panel according to claim 5, wherein the pixel array structure further comprises a first electrode, disposed between the second insulating layer and the alignment layer, and an orthographic projection area of the first electrode on the first substrate overlaps the orthographic projection area of the first support pattern on the first substrate to define the first support region.

7. The display panel according to claim 6, wherein the pixel array structure further comprises a second electrode, disposed between the first insulating layer and the second insulating layer, an orthographic projection area of the second electrode on the first substrate overlaps the orthographic projection area of the first support pattern on the first substrate to define the first support region, and the second electrode is in contact with the second support pattern.

8. The display panel according to claim 1, wherein an orthographic projection area of a terminal surface of the first spacer on the first substrate overlaps the first support region.

9. The display panel according to claim 1, further comprising a color filter array structure, the color filter array structure being disposed on the second substrate and located between the second substrate and the display medium layer, wherein the color filter array structure comprises a black matrix and a color filter pattern located beside the black matrix, and an orthographic projection area of the black matrix on the first substrate overlaps the first platform region and the first support region.

10. The display panel according to claim 9, wherein an edge of the orthographic projection area of the black matrix on the first substrate and an edge of an orthographic projection area of the first spacer on the first substrate are spaced by 7 microns to 25 microns.

11. The display panel according to claim 1, further comprising a second spacer, the second spacer being disposed on the second substrate and protruding toward the first substrate, wherein the pixel array structure further comprises a second platform region, a second display region and a second support region, the second platform region is located on the first signal line, the second support region is located between the second platform region and the second display region, an orthographic projection area of the second spacer on the first substrate overlaps an orthographic projection area of a first platform pattern of the first signal line on the first substrate, the pixel array structure comprises a second platform top surface in the second platform region, and a terminal surface of the second spacer and the second platform top surface are spaced by a distance.

12. The display panel according to claim 11, wherein a height of the second spacer is substantially the same as a height of the first spacer, the second metal layer is located completely outside the second platform region, the second platform top surface and the first substrate are spaced by a fourth distance, a second support top surface of the second support region of the pixel array structure and the first substrate are spaced by a fifth distance, and the fourth distance is less than the fifth distance.

13. The display panel according to claim 11, wherein the second metal layer comprises a second platform pattern and a second support pattern, an orthographic projection area of the second platform pattern on the first substrate overlaps an orthographic projection area of a portion of the first signal line on the first substrate to define the second platform region, an orthographic projection area of the second support pattern on the first substrate overlaps an orthographic projection area of the first support pattern on the first substrate to define the second support region, and a height of the second spacer is less than a height of the first spacer.

14. A display panel, comprising:
a first substrate;
a second substrate;
a display medium layer, disposed between the first substrate and the second substrate;
a pixel array structure, disposed on the first substrate, and comprising a first metal layer and a second metal layer, wherein the first metal layer is located between the first substrate and the second metal layer, the first metal layer comprises a first signal line and a first support pattern laterally spaced away from the first signal line, the second metal layer comprises a second support pattern, and an orthographic projection area of the second support pattern on the first substrate overlaps a first support area of the first support pattern on the first substrate to define a first support region; and
a spacer, disposed on the second substrate and protruding toward the first substrate, wherein an orthographic projection area of the spacer on the first substrate overlaps an orthographic projection area of the first signal line on the first substrate, and the orthographic projection area of the first support pattern on the first substrate is located on a periphery of the orthographic projection area of the spacer on the first substrate.

15. The display panel according to claim 14, wherein an orthographic projection area of the second metal layer on the first substrate is located completely outside the orthographic projection area of the spacer on the first substrate.

16. The display panel according to claim 14, wherein a distance from a terminal surface of the spacer to the first substrate is not less than a distance from a support top surface of the first support region of the pixel array structure to the first substrate.

17. The display panel according to claim 14, wherein the second metal layer further comprises a second platform pattern, an orthographic projection area of the second platform pattern on the first substrate overlaps an orthographic projection area of a portion of the first signal line on the first substrate to define a first platform region, a distance between the first platform region and the first support region is less than a width of the first spacer, and the first spacer is in contact with a first platform surface of the first platform region of the pixel array structure.

18. The display panel according to claim 17, wherein the pixel array structure further comprises a first insulating layer, a second insulating layer and an alignment layer, the first insulating layer is disposed between the first metal layer and the second metal layer, the second insulating layer covers the second metal layer and is located between the second metal layer and the alignment layer, and the first spacer is contact with a portion of the alignment layer located on the first platform region.

19. The display panel according to claim 14, wherein the orthographic projection area of the first spacer on the first substrate overlaps the orthographic projection area of the first support pattern on the first substrate.

20. The display panel according to claim 14, further comprising a color filter array disposed on the second substrate, wherein the color filter array comprises a black matrix and a color filter pattern located beside the black matrix, and an orthographic projection area of the black matrix on the first substrate overlaps the first support region.

* * * * *